(12) United States Patent
Suzuki et al.

(10) Patent No.: US 7,227,908 B2
(45) Date of Patent: Jun. 5, 2007

(54) INFORMATION TRANSMISSION APPARATUS, INFORMATION TRANSMISSION METHOD, INFORMATION RECEPTION APPARATUS, AND INFORMATION RECEPTION METHOD

(75) Inventors: Mitsuhiro Suzuki, Chiba (JP); Mari Kobayashi, Kanagawa (JP)

(73) Assignee: Sony Corporation (JP)

( * ) Notice: Subject to any disclaimer, the term of this patent is extended or adjusted under 35 U.S.C. 154(b) by 744 days.

(21) Appl. No.: 10/399,757

(22) PCT Filed: Sep. 3, 2002

(86) PCT No.: PCT/JP02/08952

§ 371 (c)(1),
(2), (4) Date: Apr. 22, 2003

(87) PCT Pub. No.: WO03/021793

PCT Pub. Date: Mar. 13, 2003

(65) Prior Publication Data
US 2004/0005012 A1    Jan. 8, 2004

(30) Foreign Application Priority Data
Sep. 4, 2001    (JP) .............................. 2001-268100

(51) Int. Cl.
*H04K 1/02* (2006.01)
(52) U.S. Cl. .................................................... 375/296
(58) Field of Classification Search ........ 375/260–262, 375/295, 299, 219, 285, 296, 297; 704/200, 704/201
See application file for complete search history.

(56) References Cited

U.S. PATENT DOCUMENTS

| | | | |
|---|---|---|---|
| 5,353,373 A | * | 10/1994 | Drogo de Iacovo et al. ........................ 704/223 |
| 5,944,773 A | * | 8/1999 | Chao et al. .................. 708/499 |
| 6,636,555 B1 | * | 10/2003 | Frank et al. ................. 375/146 |
| 6,864,812 B1 | * | 3/2005 | Lutkemeyer .................. 341/50 |

FOREIGN PATENT DOCUMENTS

| | | |
|---|---|---|
| EP | 886387 A2 | 12/1998 |
| EP | 944182 A2 | 9/1999 |
| EP | 1139596 A1 | 10/2001 |
| WO | WO-9858461 A1 | 12/1998 |

OTHER PUBLICATIONS

International Search Report PCT/JP02/08952, Nov. 12, 2002.

* cited by examiner

*Primary Examiner*—Don N. Vo
(74) *Attorney, Agent, or Firm*—Lerner, David, Littenberg, Krumholz & Mentlik, LLP

(57) ABSTRACT

A transmission apparatus of a data transmission and reception system includes a number of converters, multipliers, adders and a transmission unit. The converters convert information-bit sequences $b^{(0)}$, $b^{(1)}$ and $b^{(2)}$, respectively, into encoded $x^{(0)}$, $x^{(1)}$ and $x^{(2)}$, respectively. The multipliers multiply respectively the encoded sequences $x^{(0)}$, $x^{(1)}$ and $x^{(2)}$ by constants $a^{(0)}$, $a^{(1)}$ and $a^{(2)}$. The adder adds a constant-times encoded sequence $a^{(0)}x^{(0)}$ produced by a first multiplier as a result of multiplication to a constant-times encoded sequence $a^{(1)}x^{(1)}$ produced by a second multiplier. A second adder adds an additive encoded sequence $a^{(0)}x^{(0)}+a^{(1)}x^{(1)}$ produced by a first adder to a constant-times encoded sequence $a^{(2)}x^{(2)}$ produced by a third multiplier. The transmission unit transmits an additive encoded sequence $g(=a^{(0)}x^{(0)}+a^{(1)}x^{(1)}+a^{(2)}x^{(2)}$, produced by the second adder to an external apparatus as a transmitted signal g'.

66 Claims, 16 Drawing Sheets

| $Eb/(n_0+2\nu)$ REQUIRED AT EACH STAGE | CONSTANT AT EACH STAGE (CODE AMPLITUDE AT EACH STAGE) | TRANSMISSION RATE WHEN USED UP TO THE STAGE | AVERAGE REQUIRED $Eb/no$ EXPECTED WHEN USED UP TO THE STAGE |
|---|---|---|---|
| $\xi^{(0)}=0.8$ [dB] | $a^{(0)}=0.775$ | C=1/2 | $\xi_{ave'}=0.800$ [dB] |
| $\xi^{(1)}=0.7$ [dB] | $a^{(1)}=1.137$ | C=2/2 | $\xi_{ave'}=2.773$ [dB] |
| $\xi^{(2)}=0.6$ [dB] | $a^{(2)}=1.658$ | C=3/2 | $\xi_{ave'}=4.908$ [dB] |
| $\xi^{(3)}=0.6$ [dB] | $a^{(3)}=2.430$ | C=4/2 | $\xi_{ave'}=7.221$ [dB] |

| $E_b/(n_0+2\nu)$ REQUIRED AT EACH STAGE | CONSTANT AT EACH STAGE (CODE AMPLITUDE AT EACH STAGE) | TRANSMISSION RATE WHEN USED UP TO THE STAGE | AVERAGE REQUIRED $E_b/n_0$ EXPECTED WHEN USED UP TO THE STAGE |
|---|---|---|---|
| $\xi^{(0)}=2.7$ [dB] | $a^{(0)}=0.965$ | C=1/2 | $\xi_{ave'}=2.700$ [dB] |
| $\xi^{(1)}=1.9$ [dB] | $a^{(1)}=1.489$ | C=2/2 | $\xi_{ave'}=4.979$ [dB] |
| $\xi^{(2)}=1.1$ [dB] | $a^{(2)}=2.167$ | C=3/2 | $\xi_{ave'}=7.185$ [dB] |
| $\xi^{(3)}=1.0$ [dB] | $a^{(3)}=3.242$ | C=4/2 | $\xi_{ave'}=9.626$ [dB] |

FIG. 25

| TRANSMISSION RATE WHEN USED UP TO THE STAGE | AVERAGE REQUIRED $E_b/n_0$ EXPECTED WHEN USED UP TO THE STAGE IN RAYLEIGH CHANNEL | MINIMUM AVERAGE REQUIRED $E_b/n_0$ EXPECTED IN STATIC CHANNEL WITH PARAMETERS FOR RAYLEIGH CHANNEL USED AS THEY ARE | AVERAGE REQUIRED $E_b/n_0$ EXPECTED WHEN OPTIMIZED TO STATIC CHANNEL |
|---|---|---|---|
| C=1/2 | $\xi_{ave'}=2.700 [dB]$ | $\xi_{ave'}=0.800 [dB]$ | $\xi_{ave'}=0.800 [dB]$ |
| C=2/2 | $\xi_{ave'}=4.979 [dB]$ | $\xi_{ave'}=3.079 [dB]$ | $\xi_{ave'}=2.773 [dB]$ |
| C=3/2 | $\xi_{ave'}=7.185 [dB]$ | $\xi_{ave'}=5.285 [dB]$ | $\xi_{ave'}=4.908 [dB]$ |
| C=4/2 | $\xi_{ave'}=9.626 [dB]$ | $\xi_{ave'}=7.726 [dB]$ | $\xi_{ave'}=7.221 [dB]$ |

FIG. 26

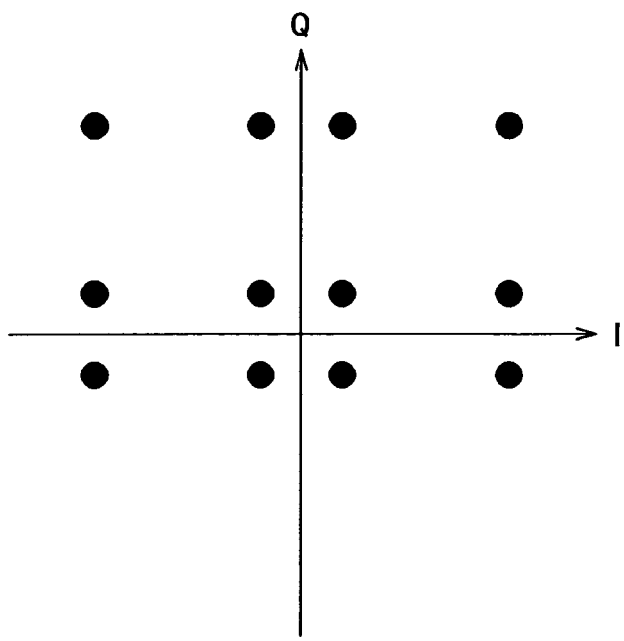

INFORMATION TRANSMISSION APPARATUS, INFORMATION TRANSMISSION METHOD, INFORMATION RECEPTION APPARATUS, AND INFORMATION RECEPTION METHOD

TECHNICAL FIELD

The present invention relates to an information transmission apparatus and an information transmission method, which are used for converting the format of information into a predetermined format and for transmitting the information with the predetermined format, as well as relates to an information reception apparatus and an information reception method, which are used for receiving a signal comprising a sequence of codes and a predetermined noise added to the sequence of codes, from the information transmission apparatus.

BACKGROUND ART

In recent years, research is conducted extensively and intensively in communication fields such as mobile communications and deep space communications as well as broadcasting fields such as ground-wave broadcasting and satellite digital broadcasting. Along with such research, there is also performed other research in a coding theory for the purpose of increasing the efficiencies of error-correction encoding and decoding processes.

As a theoretical limit of a communication-line encoding performance, there is known C. E. Shannon's limit given by so-called Shannon's communication line coding theorem.

The research in the coding theory is carried out for the purpose of developing a code exhibiting performance close to Shannon's limit. In recent years, as codes produced by encoding methods to exhibit performance close to Shannon's limit, for example, there have been developed the so-called Parallel Concatenated Convolutional Codes and the so-called Serial Concatenated Convolutional Codes, which are referred to hereafter simply as the PCCC and the SCCC respectively.

In recent years, on the other hand, there is also conducted research in methods of decoding these codes. To put it concretely, there is conducted research to decrease a symbol error rate by carrying out a soft-output operation on a decoded output of an internal code in concatenated codes and an output of each repetitive decoding operation adopting a repetitive decoding method. In addition, there is also extensively conducted research on decoding methods suitable for such codes. As a method to minimize a symbol error rate in a process to decode a predetermined code such as convolutional codes, for example, there are known a technique based on a BCJR algorithm and a technique based on a max-log-MAP algorithm and a log-MAP algorithm, which are each an improved BCR algorithm. The BCR algorithm is described by Bahl, Cocke, Jelinek and Raviv in a reference with a title of "Optimal decoding of Linear Codes for Minimizing Symbol Error Rate," IEEE Trans. Inf. Theory, vol. IT-20, pp. 284–287, March 1974. On the other hand, the max-log-MAP algorithm and the log-MAP algorithm are described by Robertson, Villebrun and Hoeher in a reference with a title of "A Comparison of Optimal and Sub-Optimal MAP Decoding Algorithms Operating in the Domain," IEEE Int. Conf. on Communications, pp. 1009–1013, June 1995. The max-log-MAP algorithm and the log-MAP algorithm are referred to hereafter as a max-log-BCJR algorithm and a log-BCJR algorithm respectively. The PCCC and the SCCC described above are decoded by carrying out the so-called repetitive decoding operation among a plurality of decoders, which carry out a MAP (Maximum A Posteriori) probability decoding process based on the BCR algorithm, the max-log-BCJR algorithm and the log-BCJR algorithm.

By the way, an encoding process is followed by signal-point mapping for bit data obtained as a result of the encoding process. The signal-point mapping is based on a multi-value modulation technique determined in advance. Examples of the multi-value modulation technique are an 8-PSK (Phase Shift Keying) modulation technique, a 16-QAM (Quadrature Amplitude Modulation) technique and a 64-QAM (Quadrature Amplitude Modulation) technique.

If an encoding process is followed by signal-point mapping based on the multi-value modulation technique determined in advance, however, it is impossible to make a margin for a noise of the encoded data completely match a margin for a noise found by the mapping. As a result, the transmission characteristics including a bit error rate deteriorate.

It is thus an object of the present invention addressing the problem described above to provide an information transmission apparatus and an information transmission method that are capable of implementing a high-performance encoding process with ease as a result of newly developing an encoding technique considered to be theoretically optimum for an encoding process adopting typically the multi-value modulation technique.

In addition, it is another object of the present invention to provide an information reception apparatus and an information reception method that are capable of easily decoding data obtained as a result produced by the information transmission apparatus and the information transmission method with a high degree of precision.

DISCLOSURE OF INVENTION

In order to achieve the objects described above, in accordance with an aspect of the present invention, there is provided an information transmission apparatus, which is used for converting the format of input information into a predetermined format prior to transmission of the information, characterized in that the information transmission apparatus includes: a first conversion means for converting a first information-bit sequence comprising a predetermined number of bits into a first encoded sequence comprising M numbers; a first multiplication means for multiplying the first encoded sequence produced by the first conversion means as a result of a conversion process by a first constant; at least a second conversion means for converting a second information-bit sequence comprising a predetermined number of bits into a second encoded sequence comprising M numbers; at least a second multiplication means for multiplying the second encoded sequence produced by the second conversion means as a result of a conversion process by a second constant; an addition means for adding the constituent of a first constant-times encoded sequence produced by the first multiplication means as a result of a multiplication process to the constituent of a second constant-times encoded sequence produced by the second multiplication means as a result of a multiplication process to produce an additive encoded sequence; and a transmission means for transmitting the additive encoded sequence as a transmitted signal.

As described above, in the information transmission apparatus provided by the present invention, the addition means adds a first constant-times encoded sequence produced by the first multiplication means as a product of a first encoded sequence and a first constant to a second constant-times encoded sequence produced by the second multiplication means as a product of a second encoded sequence and a second constant to produce an additive encoded sequence, and the transmission means transmits the additive encoded sequence.

In addition, in accordance with the present invention which achieves above-described object, there is provided an information transmission method, which is used for converting the format of input information into a predetermined format prior to transmission of the information, including: a first conversion process of converting a first information-bit sequence comprising a predetermined number of bits into a first encoded sequence comprising M numbers; a first multiplication process of multiplying the first encoded sequence produced by the first conversion process as a result of conversion by a first constant; at least a second conversion process of converting a second information-bit sequence comprising a predetermined number of bits into a second encoded sequence comprising M numbers; at least a second multiplication process of multiplying the second encoded sequence produced by the second conversion process as a result of conversion by a second constant; an addition process of adding the constituent of a first constant-times encoded sequence produced by the first multiplication process as a result of multiplication to the constituent of a second constant-times encoded sequence produced by the second multiplication process as a result of multiplication to produce an additive encoded sequence; and a transmission process of transmitting the additive encoded sequence as a transmitted signal.

As described above, in the addition process of the information transmission method provided by the present invention, a first constant-times encoded sequence produced by the first multiplication process as a product of a first encoded sequence and a first constant is added to a second constant-times encoded sequence produced by the second multiplication process as a product of a second encoded sequence and a second constant to produce an additive encoded sequence, and in the transmission process of the information transmission method, the additive encoded sequence is transmitted.

In addition, in accordance with the present invention that achieves above-described object, there is provided an information reception apparatus for receiving a reception signal comprising an additive encoded sequence and a predetermined noise added to the additive encoded sequence transmitted by an information transmission apparatus including: a first conversion means for converting a first information-bit sequence comprising a predetermined number of bits into a first encoded sequence comprising M numbers; a first multiplication means for multiplying the first encoded sequence produced by the first conversion means as a result of conversion by a first constant; at least a second conversion means for converting a second information-bit sequence comprising a predetermined number of bits into a second encoded sequence comprising M numbers; at least a second multiplication means for multiplying the second encoded sequence produced by the second conversion means as a result of conversion by a second constant; an addition means for adding the constituent of a first constant-times encoded sequence produced by the first multiplication means as a result of multiplication to the constituent of a second constant-times encoded sequence produced by the second multiplication means as a result of multiplication to produce the additive encoded sequence; and a transmission means for transmitting the additive encoded sequence as the transmitted signal, wherein the information reception apparatus is characterized in that the information reception apparatus includes: a reception means for receiving the reception signal; and a decoding means for carrying out a decoding process to produce at least one of the first information-bit sequence and the second information-bit sequence on the basis of a received value received from the reception means.

As described above, the decoding means employed in the information reception apparatus provided by the present invention carries out a decoding process to produce at least one of the first information-bit sequence and the second information-bit sequence on the basis of a received value comprising an additive encoded sequence and a predetermined noise added to the additive encoded sequence produced by the addition means, which adds a first constant-times encoded sequence produced by the first multiplication means as a result of a multiplication process to a second constant-times encoded sequence produced by the second multiplication means as a result of a multiplication process.

In addition, in accordance with the present invention, which achieves above-described object, there is provided an information transmission method, which is used for receiving a reception signal comprising an additive encoded sequence and a predetermined noise added to the additive encoded sequence transmitted in accordance with an information transmission method including: a first conversion process of converting a first information-bit sequence comprising a predetermined number of bits into a first encoded sequence comprising M numbers; a first multiplication process of multiplying the first encoded sequence produced by the first conversion process as a result of conversion by a first constant; at least a second conversion process of converting a second information-bit sequence comprising a predetermined number of bits into a second encoded sequence comprising M numbers; at least a second multiplication process of multiplying the second encoded sequence produced by the second conversion process as a result of conversion by a second constant; an addition process of adding the constituent of a first constant-times encoded sequence produced by the first multiplication process as a result of multiplication to the constituent of a second constant-times encoded sequence produced by the second multiplication process as a result of multiplication to produce an additive encoded sequence; and a transmission process of transmitting the additive encoded sequence as the transmitted signal, wherein the information reception method is characterized in that the information reception method includes: a reception process of inputting the reception signal; and a decoding process of carrying out a decoding process to produce at least one of the first information-bit sequence and the second information-bit sequence on the basis of a received value received from the reception process.

As described above, in the information reception method provided by the present invention carries out the decoding process to produce at least one of the first information-bit sequence and the second information-bit sequence on the basis of a received value comprising an additive encoded sequence and a predetermined noise added to the additive encoded sequence, in the addition process carried out to add a first constant-times encoded sequence produced in the first multiplication process to a second constant-times encoded sequence produced in the second multiplication process.

BRIEF DESCRIPTION OF DRAWINGS

FIG. 25 is an explanatory diagram showing the configuration of code obtained as a result of estimating a characteristic in a static channel by using an encoding parameter for a Rayleigh channel; and FIG. 26 is an explanatory diagram showing locations of signal points in an additive encoded sequence obtained by application of a QPSK modulation technique as an encoding process carried out by a converter employed in the same transmission apparatus.

BEST MODE FOR CARRYING OUT THE INVENTION

Figure 1:
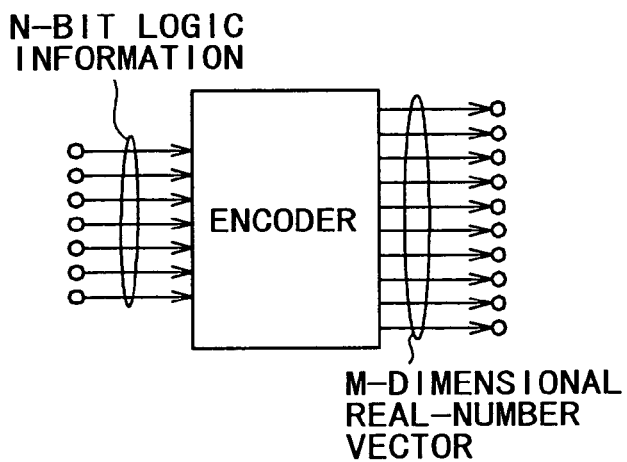
FIG. 1 is an explanatory diagram showing a definition of an encoding process in the present invention.

A concrete embodiment of the present invention is described in detail by referring to diagrams as follows.

This embodiment implements a data transmission and reception system applied to a channel model in which digital information is encoded by a transmission apparatus shown in none of the figures and, then, the output of the transmission apparatus is transmitted to a reception apparatus also shown in none of the figures by way of a noisy transmission line. In this data transmission and reception system, the transmission apparatus is capable of forming a code having a large transmission rate by using a code having a small transmission rate to be described later. The transmission apparatus carries out an encoding process, which changes the concept of the existing signal-point mapping method. On the other hand, the reception apparatus of the data transmission and reception system decodes codes, which have been encoded by the transmission apparatus, with ease and a high degree of precision.

First of all, before the data transmission and reception system is explained, an encoding process of the present invention is defined as follows.

The encoding process to be described below means the so-called communication-line encoding process which can be interpreted in accordance with a broad definition as a process to convert a signal of existing information for a given communication line. A most important communication line is a communication line represented by Euclid's space to which a white Gaussian noise is added. In the field of data transmission, problems such as a transmission speed [bits/s] and an occupation band are normally raised. According to the sampling theorem, however, since a signal in 1 [s]×1 [Hz] can be described by using 2 real numbers or 1 complex number, it is not necessary to consider the concept of time or the concept of a frequency in the encoding process to be described below. Instead, the concept can be replaced by the number of dimensions in a vector space in a simple manner. That is to say, the encoding process to be described below can be defined as a process to convert logic information consisting of N bits into an encoded sequence of M numbers used as $2^N$ code words.

A parameter called a transmission rate C can be defined in terms of N and M as shown in Eq. (1) given below where symbol N is the number of bits composing the logic information to be converted and symbol M is the number of dimensions of a conversion-result vector space.

$$C = N/M \tag{1}$$

That is to say, the transmission rate C is the number of bits transmitted per real-number dimension. In the encoding theory, an encoding rate R is defined by Eq. (2) given below where symbols k and n denote the number of information bits and a code length respectively. For a case where 1 code bit is mapped onto 1 real number as is the case with a BPSK (Binary Phase Shift Keying) modulation technique, the transmission rate C is equal to a coding rate R.

$$R = k/n \tag{2}$$

When considering a general encoding process including the so-called coded modulation, the transmission rate C can be said to be a parameter more meaningful than the encoding rate R in many cases when compared with the encoding rate R. As a parameter having a dimension equivalent to the transmission rate C, there is a transmission speed U per frequency cycle [bits/Hz]. In accordance with the sampling theorem, since 2 real numbers per Hz are transmitted in each unit time, the transmission rate C and the transmission speed U satisfy a relation expressed by Eq. (3) given below. Since neither the time concept nor the frequency concept is required in the encoding process as described above, even in comparison with the transmission speed U, the transmission rate C can be said to be a parameter more meaningful than the transmission speed U.

$$C = U/2 \tag{3}$$

In this case, a maximum communication-line capacity $C_{max}$ [bits] in C. E. Shannon's communication-line encoding theorem is expressed by Eq. (4) as follows:

$$C_{max} = \frac{1}{2}\log_2\left(1 + \frac{S}{N}\right) \tag{4}$$

Eq. (4) given above means that, in a communication line to which an Additive White Gaussian Noise is added to result in an a signal-to-noise ratio S/N, information of $C_{max}$ bits can be transmitted per real number without introducing errors. In addition, energy of inform per bit is normally expressed by $E_b$ [J]. That is to say, in a transmission of information of $C_{max}$ bits per real number, the energy per real number is expressed by $C_{max} \cdot E_b$ [J]. The additive white Gaussian noise is referred to hereafter as an AWGN. In an AWGN channel of a noise power density $n_o$ [j], the energy of an added noise per real number is $n_o/2$ [J]. Thus, as a limit of a communication line capacity, the maximum communication-line capacity $C_{max}$ is expressed by Eq. (5) as follows:

$$C_{max} = \frac{1}{2}\log_2\left(1 + 2C_{max}\frac{E_b}{n_0}\right) \tag{5}$$

On the other hand, let symbol $\xi_{min}$ denote the minimum value of a signal-to-noise power ratio $E_b/n_o$ per bit, which is a minimum power ratio required for transmitting information of C bits per real number. In this case, a communication rate C [bits] is expressed by Eq. (6) given below. From this equation, it is possible to derive Eq. (7) expressing the minimum value of a signal-to-noise power ratio $E_b/n_o$ per bit $\xi_{min}$.

$$C = \frac{1}{2}\log_2(1 + 2C\xi_{min}) \tag{6}$$

$$\xi_{min} = \frac{1}{2C}[2^{2C} - 1] \tag{7}$$

The following description explains a data transmission and reception system including a transmission apparatus for carrying out the encoding process defined as described above and a reception apparatus for decoding codes obtained as a result of the encoding process carried out by the transmission apparatus.

First of all, the transmission apparatus included in the data transmission and reception system is described. By using a code with a small transmission rate described above, the transmission apparatus creates a code with a large sequential transmission rate. Here, in the first place, before an actual and concrete configuration of the transmission apparatus is explained, the basic principle of the encoding process carried out by the transmission apparatus is described.

There are L information-bit sequences $\{b^{(0)}, b^{(1)}, \ldots, b^{(L-1)}\}$. As indicated by Eq. (8) given below, the first information-bit sequence $b^{(1)}$ comprises N information bits $b_n^{(1)}$ where $n = 0, 1, \ldots$ and $N-1$.

$$b_n^{(l)} = \{b_0^{(l)}, b_2^{(l)} \ldots, b_{N-1}^{(l)}\}^T \tag{8}$$

Consider a real-number-value sequence $x^{(1)}$ shown in Eq. (9) below. The real-number-value sequence $x^{(1)}$ is obtained as a result of an encoding process to map the information bits $b_n^{(1)}$ expressed by Eq. (8) given above for each information-bit sequence. It should be noted that the real-number-value sequence $x^{(1)}$ is referred to hereafter as an encoded sequence $x^{(1)}$.

$$x^{(1)} = x^{(1)}(b^{(1)}) \tag{9}$$

The encoded sequence $x^{(1)}$ is an M-dimensional real-number vector consisting of M real numbers without regard to the sequence as indicated by Eq. (10) given below.

$$x^{(l)} = \{x_0^{(l)}, x_1^{(l)} \ldots, x_{N-1}^{(l)}\}^T \quad (10)$$

In this case, a transmission rate $C^{(1)}$ is expressed by Eq. (11) as follows:

$$C^{(1)} = N^{(1)}/M \quad (11)$$

Let symbol $\xi^{(1)}$ denote a minimum value of a signal-to-noise power ratio $E_b/n_o$ per bit, which is a minimum value required for setting a transmission-error rate at 0 or a value close to 0 in the encoding process. In addition, in order to make the following explanation easy to describe, assume that a code x forms an M-dimensional Gaussian distribution as expressed by Eq. (12) given below.

$$p(x^{(l)}) = \frac{1}{(2\pi C^{(l)} E_b)^{\frac{M}{2}}} \exp\left[-\frac{1}{2C^{(l)} E_b}|x^{(l)}|^2\right] \quad (12)$$

An encoded sequence $x^{(0)}$ is obtained as a result of an encoding process carried out on an information-bit sequence $b^{(0)}$ as expressed by the following equation: $x^{(0)} = x^{(0)}(b^{(0)})$. Energy per bit $E_b^{(0)}$ [J] required for accurately transmitting the encoded sequence $x^{(0)}$ through an AWGN channel having a noise power density no [J] is $2\xi$ times the variance $n_o/2$ of a noise per real number as shown in Eq. (13) given below.

$$E_b^{(0)} = 2\xi^{(0)} n_0/2 = \xi^{(0)} n_0 \quad (13)$$

In this case a signal variance $v^{(0)}$ per real number is found by using Eq. (14) as follows.

$$v^{(0)} = C^{(0)} \xi^{(0)} n_0 \quad (14)$$

Consider a case in which an encoded sequence $x^{(1)}$ is added to the transmission system and transmitted with a high degree of accuracy. In this case, the encoded sequence $x^{(1)}$ is obtained as a result of an encoding process carried out on an information-bit sequence $b^{(1)}$ as expressed by the following equation: $x^{(1)} = x^{(1)}(b^{(1)})$. The encoded sequence $x^{(0)}$ has nothing to do with the encoded sequence $x^{(1)}$. That is to say, the encoded sequence $x^{(0)}$ merely appears as a noise to the encoded sequence $x^{(1)}$. Thus, as shown in Eq. (15) given below, energy per bit $E_b^{(1)}$ [J] required for accurately transmitting the encoded sequence $x^{(1)}$ is set at a value $\xi^{(1)}$ times the sum of energies of an original noise and the code $x^{(1)}$.

$$E_b^{(1)} = 2\xi^{(1)}(n_0/2 + C^{(0)}\xi^{(0)}n_0) = n_0\xi^{(1)}(1 + 2C^{(0)}\xi^{(0)}) \quad (15)$$

In this case, a signal variance $v^{(1)}$ per real number is found by using Eq. (16) as follows.

$$v^{(1)} = C^{(1)}\xi^{(1)} n_0(1 + 2C^{(0)}\xi^{(0)}) \quad (16)$$

In addition, by the same token, consider a case in which an encoded sequence $x^{(2)}$ is added to the transmission system and transmitted with a high degree of accuracy. In this case, the encoded sequence $x^{(2)}$ is obtained as a result of an encoding process carried out on an information-bit sequence $b^{(2)}$ as expressed by the following equation: $x^{(2)} = x^{(2)}(b^{(2)})$. The encoded sequences $x^{(0)}$ and $x^{(1)}$ have nothing to do with the encoded sequence $x^{(2)}$. That is to say, the encoded sequences $x^{(0)}$ and $x^{(1)}$ merely appear as noises to the encoded sequence $x^{(2)}$. Thus, as shown in Eq. (17) given below, energy per bit $E_b^{(2)}$ [J] required for accurately transmitting the encoded sequence $x^{(2)}$ is set at a value $\xi^{(2)}$ times the sum of energies of an original noise and the codes $x^{(0)}$ and $x^{(1)}$. In this case a signal variance $v^{(2)}$ per real number is found by using Eq. (18) as follows.

$$E_b^{(2)} = 2\xi^{(2)}\{n_0/2 + C^{(0)}\xi^{(0)}n_0 + C^{(1)}\xi^{(1)}n_0(1 + 2C^{(0)}\xi^{(0)})\} \quad (17)$$

$$= \xi^{(2)} n_0 (1 + 2C^{(0)}\xi^{(0)})(1 + 2C^{(1)}\xi^{(1)})$$

$$v^{(2)} = C^{(2)}\xi^{(2)} n_0 (1 + 2C^{(0)}\xi^{(0)})(1 + 2C^{(1)}\xi^{(1)}) \quad (18)$$

Thereafter, the same operation is carried out repeatedly on the subsequent information-bit sequences ending with the information-bit sequence $b^{(L-1)}$. As a result, energy per bit $E^{b(L-1)}$ [J] required for accurately transmitting the encoded sequence $x^{(L-1)}$ is expressed by Eq. (19) given below. In this case a signal variance $v^{(L-1)}$ per real number is found by using Eq. (20) as follows.

$$E_b^{(L-1)} = \xi^{(L-1)} n_0 \prod_{l=0}^{L-2} (1 + 2C^{(l)}\xi^{(l)}) \quad (19)$$

$$v^{(L-1)} = C^{(L-1)}\xi^{(L-1)} n_0 \prod_{l=0}^{L-2} (1 + 2C^{(l)}\xi^{(l)}) \quad (20)$$

The above operations are carried out on one transmission system to give an average amplitude $a^{(i)}$ for the information-bit sequences. In this case, encoded sequences for the information-bit sequences $\{b^{(0)}, b^{(1)}, \ldots, b^{(L-1)}\}$ are expressed by Eqs. (21) and (22) as follows:

$$g(b^{(0)}, b^{(1)}, \ldots, b^{(L-1)}) = \quad (21)$$

$$\sum_{i=0}^{L-1} a^{(i)} x^{(i)} = a^{(0)} x^{(0)} + a^{(1)} x^{(1)} + \ldots + a^{(L-1)} x^{(L-1)}$$

$$a^{(i)} = \sqrt{\frac{v^{(i)}}{n_0/2}} = \sqrt{2C^{(L-1)}\xi^{(L-1)} \prod_{l=0}^{L-2}(1 + 2C^{(l)}\xi^{(l)})} \quad (22)$$

It should be noted that, in the following description, a sequence obtained as a result of multiplying each constituent of the encoded sequence by a constant $a^{(i)}$ is referred to as a constant-times encoded sequence, and encoded sequences g ($b^{(0)}, b^{(1)}, \ldots, b^{(L-1)}$) are each referred to as an additive encoded sequence. It is also worth noting that the additive encoded sequences g($b^{(0)}, b^{(1)}, \ldots, b^{(L-1)}$) can also each be a complex-number-value sequence obtained by combining every two constituents of a numerical-value sequence.

On the basis of such a principle, the transmission apparatus carries out conversion processing including an encoding process and/or a modulation process on the input information-bit sequences $\{b^{(0)}, b^{(1)}, \ldots, b^{(L-1)}\}$ to generate the additive encoded sequences g($b^{(0)}, b^{(1)}, \ldots, b^{(L-1)}$), and transmits the additive encoded sequences g($b^{(0)}, b^{(1)}, \ldots, b^{(L-1)}$) to a communication line. To put it in detail, the transmission apparatus carries out a predetermined conversion process on each of the input information-bit sequences $\{b^{(0)}, b^{(1)}, \ldots, b^{(L-1)}\}$ to generate encoded sequences $\{x^{(0)}, x^{(1)}, \ldots, x^{(L-1)}\}$, and multiplies the encoded sequences $\{x^{(0)}, x^{(1)}, \ldots, x^{(L-1)}\}$ by constants $\{a^{(0)}, a^{(1)}, \ldots, a^{(L-1)}\}$ respectively. Then, constant-times encoded sequences obtained as a result of the multiplication are summed up to produce the additive encoded sequences g($b^{(0)}, b^{(1)}, \ldots, b^{(L-1)}$).

In this case, as shown in Eq. (22) given above, the transmission apparatus sets the constants $a^{(0)}, a^{(1)}, \ldots, a^{(L-1)}$ at such values that the encoded sequence $x^{(1)}$ is transmitted through the communication line described below with a high degree of accuracy, that is, at a sufficiently reduced bit error rate for the information-bit sequence $b^{(1)}$. Along the communication line, a sum of noises and a specific sequence is added. The specific sequence has the same statistical properties as the constant-times encoded sequences $a^{(0)} x^{(0)}$, $a^{(1)} x^{(1)}$, ..., $a^{(L-1)} x^{(L-1)}$ summed up previously. The constant-times encoded sequences $a^{(0)} x^{(0)}$, $a^{(1)} x^{(1)}$, ..., $a^{(L-1)} x^{(L-1)}$ are obtained as a product of multiplying the encoded sequences $x^{(1)}$ by the constants $a^{(1)}$. It should be noted that the statistical properties of the constant-times encoded sequence $a^{(1)} x^{(1)}$ include a variance, a probability density function and a power spectrum.

To put it concretely, on the assumption that the encoded sequence $x^{(0)}$ is transmitted through a communication line adding a noise, the constant $a^{(0)}$ is set at such a value that the bit error rate for the information-bit sequence $b^{(0)}$ is reduced sufficiently. In addition, on the assumption that the encoded sequence $x^{(1)}$ is transmitted through the communication line, along which a sum of a noise and a specific sequence is added, the constant $a^{(1)}$ is set at such a value that the bit error rate for the information-bit sequence $b^{(1)}$ is reduced sufficiently. The specific sequence has the same statistical properties as the constant-times encoded sequence $a^{(0)} x^{(0)}$. Furthermore, on the assumption that the encoded sequence $x^{(2)}$ is transmitted through the communication line, along which a sum of a noise and another specific sequence is added, the constant $a^{(2)}$ is set at such a value that the bit error rate for the information-bit sequence $b^{(2)}$ is reduced sufficiently. The other specific sequence has the same statistical properties as the constant-times encoded sequences $a^{(0)} x^{(0)}$ and $a^{(1)} x^{(1)}$.

In this case, it is possible to find a criterion for determining whether or not the bit error rate for the information-bit sequence $b^{(1)}$ is reduced sufficiently by logical consideration or simulation. It is to be noted that, as a sufficiently small bit error rate, a value smaller than a bit error rate required eventually in the system is appropriate. A typical sufficiently small bit error rate of about $10^{-5}$ is desirable.

As described above, while providing equal weights to the information-bit sequences $b^{(1)}$, the transmission apparatus is capable of setting the constants $a^{(1)}$.

In addition, the transmission apparatus may set the constants $a^{(1)}$ by changing margins for noises for each code.

That is to say, the transmission apparatus sets a constant $a^{(1)}$ to be used as a multiplicand for any encoded sequence $x^{(1)}$ at such a value that the encoded sequence $x^{(1)}$ is transmitted through the communication line described below with a high degree of accuracy, that is, at a sufficiently reduced bit error rate for the information-bit sequence $b^{(1)}$. Along the communication line, a sum of a noise and a specific sequence is added. The noise is greater than an assumed noise by $G^{(1)}$ [dB]. The specific sequence has the same statistical properties as the constant-times encoded sequences $a^{(0)} x^{(0)}$, $a^{(1)} x^{(1)}$, ..., $a^{(1-1)} x^{(1-1)}$ summed up previously.

To put it concretely, on the assumption that the encoded sequence $x^{(0)}$ is transmitted through a communication line adding a noise, the constant $a^{(0)}$ is set at such a value that the bit error rate for the information-bit sequence $b^{(0)}$ is reduced sufficiently. In addition, on the assumption that the encoded sequence $x^{(1)}$ is transmitted through the communication line, along which a sum of a noise and a specific sequence is added, the constant $a^{(1)}$ is set at such a value that the bit error rate for the information-bit sequence $b^{(1)}$ is reduced sufficiently. The noise is greater than an assumed noise by $G^{(1)}$ [dB]. The specific sequence has the same statistical properties as the constant-times encoded sequence $a^{(0)} x^{(0)}$. Furthermore, on the assumption that the encoded sequence $x^{(2)}$ is transmitted through the communication line, along which a sum of a noise and another specific sequence is added, the constant $a^{(2)}$ is set at such a value that the bit error rate for the information-bit sequence $b^{(2)}$ is reduced sufficiently. The noise is greater than an assumed noise by $G^{(1)}$ [dB]. The other specific sequence has the same statistical properties as the constant-times encoded sequences $a^{(0)} x^{(0)}$ and $a^{(1)} x^{(1)}$.

As described above, the transmission apparatus is capable of setting the constants $a^{(1)}$ with ease while changing a weight for each information-bit sequence $b^{(1)}$. As will be described later, this method of setting the constants $a^{(1)}$ is effective for a case in which the importance of each information-bit sequence $b^{(1)}$ varies. The more important the information-bit sequence $b^{(1)}$, the larger the value at which the constant $a^{(1)}$ is set.

It should be noted that, even if the transmission apparatus transmits the encoded sequence $x^{(1)}$ through different communication lines as is the case with a Rayleigh fading channel, the constants $a^{(1)}$ can be set by carrying out the same operations as the method described above. A criterion as to whether or not a bit error rate for the information-bit sequence $b^{(1)}$ is reduced sufficiently can be based on a result of a study or a simulation using an assumed channel model. This is because energy $E_b$ [J] required for implementing a desired bit error rate varies in accordance with the state of the communication line. In addition, as will be described later, it is possible to set the constant $a^{(1)}$ adaptive to a change in communication-line state.

Anyway, in order to transmit an information-bit sequence $b^{(1)}$ by expending energy $E_b$ [J] required for implementing a desired bit error rate, the transmission apparatus multiplies an encoded sequence $x^{(1)}$ by a constant $a^{(1)}$.

Consider a signal-point location of an additive encoded sequence g obtained as a result of an encoding process carried out by the transmission apparatus. It should be noted that, in order to make the following explanation easy to describe, in an operation to generate an encoded sequence $x^{(1)}$, a signal-point mapping process based on the BPSK modulation technique is carried out.

Figure 2:
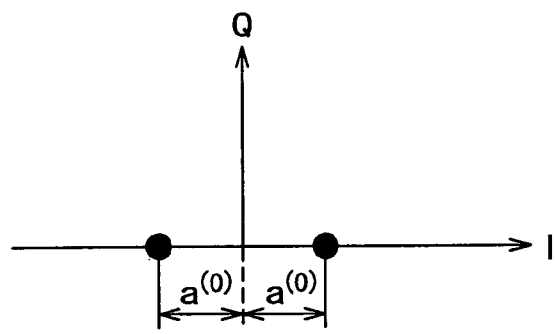
FIG. 2 is an explanatory diagram showing locations of signal points in a constant-times encoded sequence produced in the encoding process carried out by a transmission apparatus of a data transmission and reception system implemented by an embodiment of the present invention.

Since the encoded sequence $x^{(0)}$ has been subjected to the BPSK modulation technique, the signal points are located at coordinates "1" and "−1" on the I axis of the so-called IQ plane. Thus, for the constant-times encoded sequence $a^{(0)} x^{(0)}$, the signal points are located at coordinates "$a^{(0)}$" and "$-a^{(0)}$" on the I axis as shown by black circles in FIG. 2. It is needless to say that the absolute value of the coordinate "$a^{(0)}$" varies in dependence on the sequence.

Figure 3:
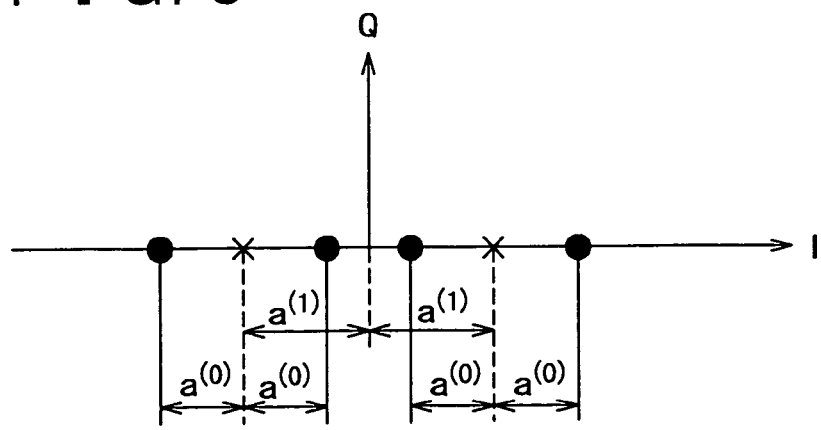
FIG. 3 is an explanatory diagram showing locations of signal points in an additive encoded sequence produced as a result of summing up 2 constant-times encoded sequences in the encoding process carried out by the transmission apparatus of the same data transmission and reception system.

Thus, there are 4(=$2^2$) signal-point locations of the additive encoded sequence $a^{(0)} x^{(0)} + a^{(1)} x^{(1)}$ obtained as a sum of the constant-times encoded sequence $a^{(0)} x^{(0)}$ and the constant-times encoded sequence $a^{(1)} x^{(1)}$ which are obtained by adoption of the BPSK modulation technique, as shown by black circles on the I axis in FIG. 3 similarly to those of an Amplitude Shift Keying modulation technique. The Amplitude Shift Keying modulation technique is referred to hereafter as the ASK modulation technique. By the same token, there are 8(=$2^3$) signal-point locations of the additive encoded sequence $a^{(0)} x^{(0)} + a^{(1)} x^{(1)} + a^{(2)} x^{(2)}$ obtained as a sum of the constant-times encoded sequence $a^{(0)} x^{(0)}$, the constant-times encoded sequence $a^{(1)} x^{(1)}$ and the constant-times encoded sequence $a^{(2)} x^{(2)}$ as shown by black circles on the I axis in FIG. 4 similarly to those of the ASK modulation technique. Finally, there are $2^L$ signal-point locations of the additive encoded sequence g(=$a^{(0)} x^{(0)} + a^{(1)}$ $x^{(1)}+a^{(2)} x^{(2)}+\ldots+a^{(L-1)} x^{(L-1)}$) obtained as a sum of the constant-times encoded sequence $a^{(0)} x^{(0)}$, the constant-times encoded sequence $a^{(1)} x^{(1)}$ the constant-times encoded sequence $a^{(2)} x^{(2)}$, ... and the constant-times encoded sequence $a^{(L-1)} x^{(L-1)}$ as shown by black circles on the I axis in FIG. 4 similarly to those of the ASK modulation technique.

Figure 4:
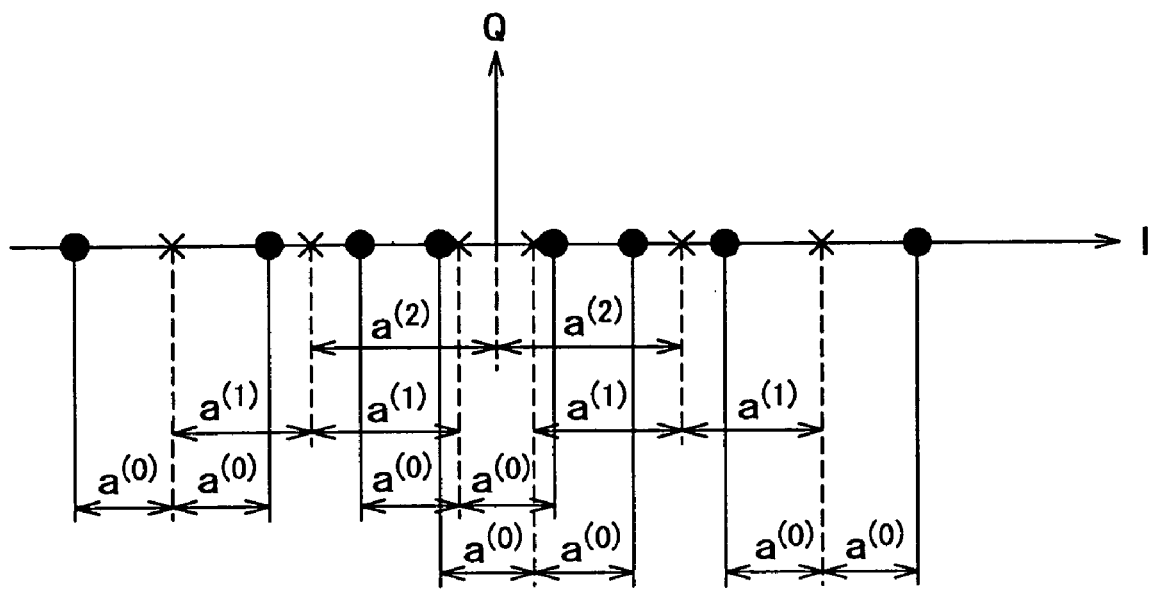
FIG. 4 is an explanatory diagram showing locations of signal points in an additive encoded sequence produced as a result of summing up 3 constant-times encoded sequences in the encoding process carried out by the transmission apparatus of the same data transmission and reception system.
Figure 5:
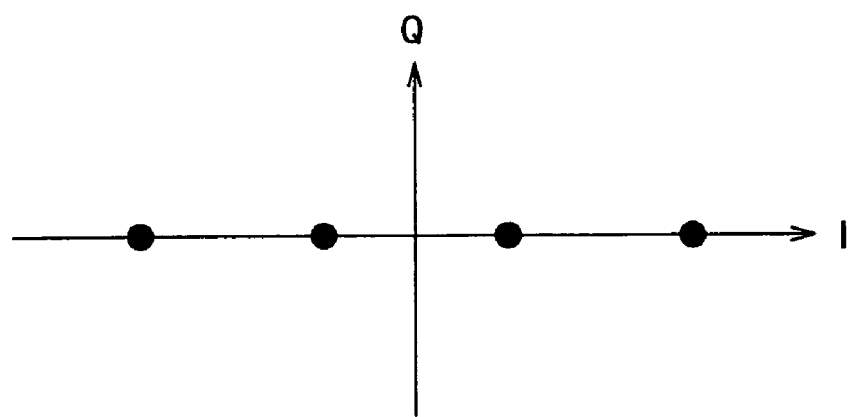
FIG. 5 is an explanatory diagram showing locations of signal points produced by adoption of an ordinary 4ASK modulation technique.

In the ordinary ASK modulation technique, there are signal points located at equal intervals as is the case with a 4ASK modulation technique shown in FIG. 5. In the proposed encoding process, however, the constant $a^{(1)}$ is set at such a value that the information-bit sequence $b^{(1)}$ is transmitted by expending energy $E_b$ [J] for implementing a desired bit error rate as described above, and signal points are located on the basis of the constant $a^{(1)}$. In this case, the signal points of the additive encoded sequence g are not necessarily located at equal intervals. Rather, the signal points are located at unequal intervals as shown in FIGS. 3 and 4. The validity of this statement is explained by using the 4ASK modulation technique as an example.

In order to feel for the inevitability of signal points' being located at unequal intervals, the signal points in the 4ASK modulation technique are given as shown in Eq. (23) given below. Then, x is changed to find the amount of information. In this case, the variation becomes equal to 1.

$$\{x_0,x_1,x_2,x_3\}=\{\sqrt{2-x^2},x,-x,-\sqrt{2-x^2}\} \quad (23)$$

For x!=1, the information amount H [bits] of a transmitted signal is 2 bits as expressed by Eq. (24) given below without the need to change x.

$$H = -\sum_{i=0}^{3} P(x_i)\log(P(x_i)) - \sum_{i=0}^{3} \frac{1}{4}\log\left(\frac{1}{4}\right) = 2 \quad (24)$$

If the communication line is an AWGN channel having a noise power density $n_o$, on the other hand, the amount of information received by the reception apparatus is expressed by Eq. (25) given below where symbol y denotes a reception value. It should be noted that expression "p (y|$x_i$)" used in Eq. (25) is represented by Eq. (26) given below.

$$I(x, y) = H(y) - H(y|x) = H(y) - H(n)$$
$$= -\int_{-\infty}^{\infty} p(y)\log_2(p(y))dy - \frac{1}{2}\log_2(\pi e n_0)$$
$$= -\int_{-\infty}^{\infty} \sum_{i=0}^{3} p(y|x_i)p(x_i)\log_2(\sum_{i=0}^{3} p(y|x_i)p(x_i))dy - \frac{1}{2}\log_2(\pi e n_0) \quad (25)$$

$$p(y|x_i) = \frac{1}{\sqrt{\pi n_0}}\exp\left[-\frac{1}{n_0}|y - x_i|^2\right] \quad (26)$$

Figure 6:
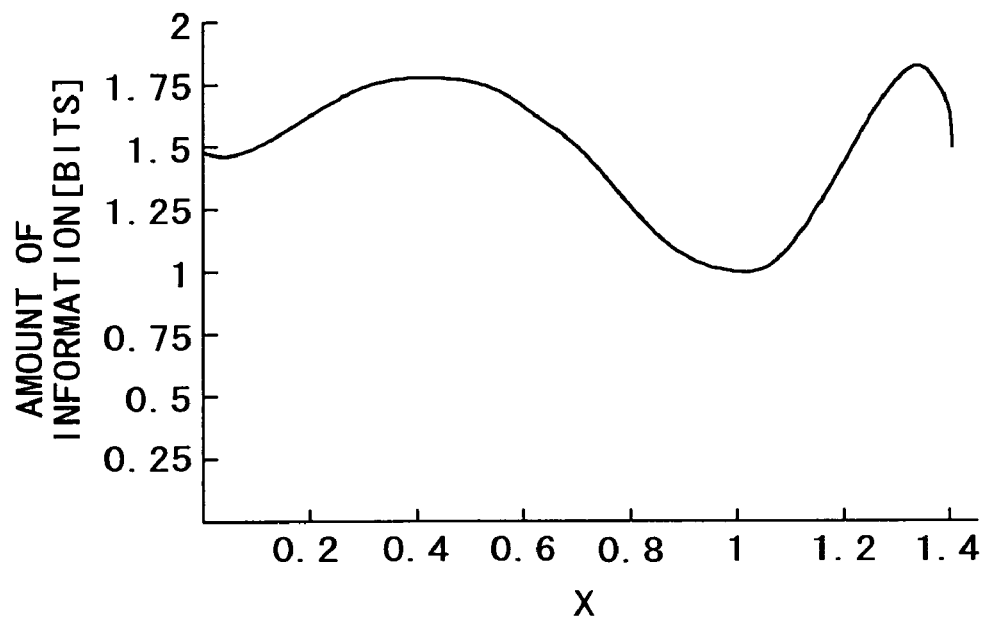
FIG. 6 is an explanatory diagram showing locations of signal points obtained for a signal-to-noise ratio of 12 dB.
Figure 7:
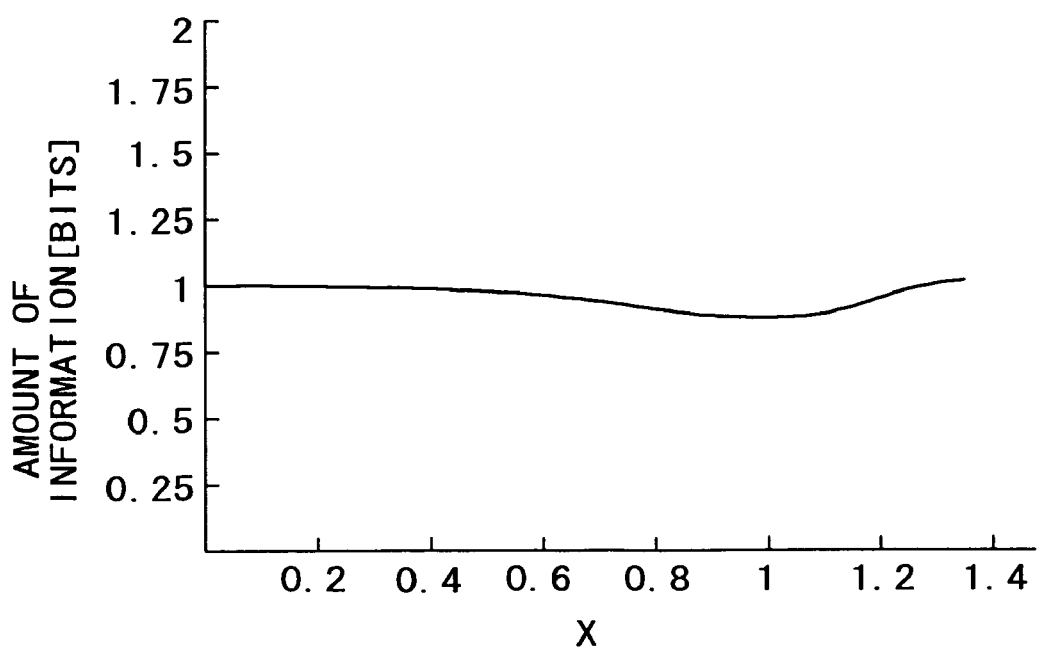
FIG. 7 is an explanatory diagram showing locations of signal points obtained for a signal-to-noise ratio of 1.96 dB.

The amounts of information for location of x with the signal-to-noise ratio S/N set at 12 dB are calculated to give a curve having maximum values at 2 points as shown in FIG. 6. As is obvious from the figure, the amount of information is equal to a maximum value of close to 2 bits for x=1.34 and x=0.45. This state corresponds to the ordinary 4ASK modulation technique for which signal points indicated by Eq. (27) given below are located at equal intervals as shown in FIG. 7. Thus, the validity that the signal points are located at equal intervals is proven. It should be noted that, as is also obvious from the figure, for x=1.0, the amount of information is equal to that of the BPSK modulation technique, indicating that transmission of more than 1 bit is impossible.

$$\{x_0,x_1,x_2,x_3\}=\{3/\sqrt{5},1/\sqrt{5},-1/\sqrt{5},-3/\sqrt{5}\}=\{1.34,0.45,-0.45,-1.34\} \quad (27)$$

Figure 8:
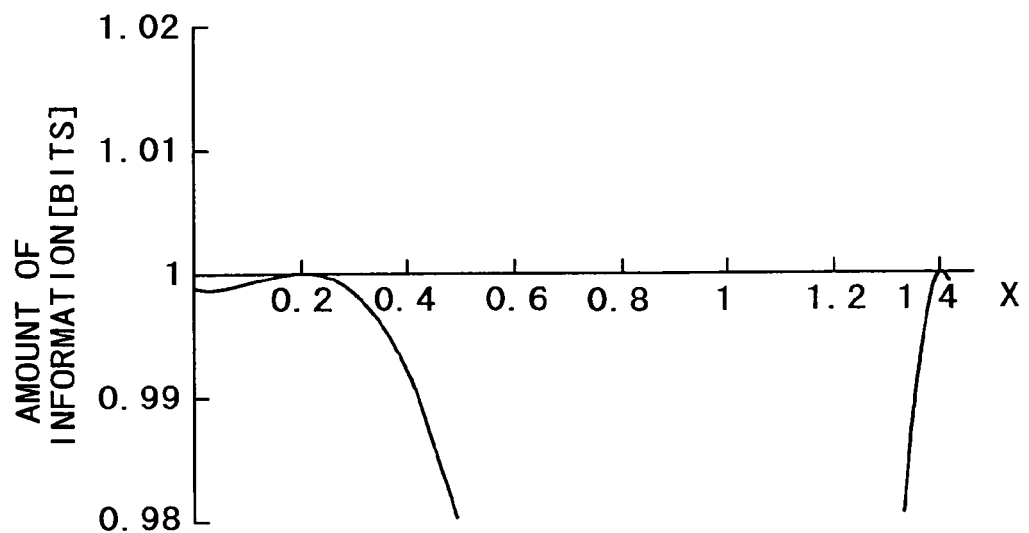
FIG. 8 is an explanatory diagram showing an enlarged portion of signal-point locations shown in FIG. 7, which is a portion in close proximity to an area for an information amount of 1 bit.

Then, from this state, the signal-to-noise ratio S/N is reduced to find a signal-to-noise ratio S/N for which a maximum amount of information is 1 bit. That is to say, a state in which the transmission rate C described earlier is 1.0. The amounts of information for location of x with the signal-to-noise ratio S/N set at 1.96 dB are represented by a curve shown in FIG. 7. As shown in the figure, the amount of information changes leniently in the range of values close to 1 bit with variations in x. If a portion of the curve shown in the figure in an area around an information amount of 1 bit is enlarged, a curve having a maximum value at 2 points as shown in FIG. 8 is obtained. As is obvious from the figure, the amount of information becomes equal to a maximum value for x=1.4 and x=0.2. It is also clear that signal points maximizing the amount of information are located at equal intervals as indicated by Eq. (28) given below:

$$\{x_0,x_1,x_2,x_3\}=\{1.4,0.2,-0.2,-1.4\} \quad (28)$$

These facts indicate that optimum signal-point locations are determined in dependence on the signal-to-noise ratio S/N. That is to say, in this proposed encoding process, in processing to set a constant $a^{(1)}$ at such a value that an information-bit sequence $b^{(1)}$ is transmitted by expending energy $E_b$ [J] for implementing a desired bit error rate, a mapping process with signal points located at unequal intervals results in improved characteristics more than the already existing mapping process with signal points located at equal intervals does, making it unnecessary to adhere to the existing mapping process. It should be noted that, if the signal-to-noise ratio S/N is extremely lowered, the signal-point locations have been verified to be in a state, which can be said to be the so-called 3ASK modulation technique as shown by Eq. (29) as follows.

$$\{x_0,x_1,x_2,x_3\}=\{1.414,0.0,-0.0,-1.414\} \quad (29)$$

In order to transmit an information-bit sequence $b^{(1)}$ by expending energy $E_b$ [J] for implementing a desired bit error rate, the transmission apparatus multiplies an encoded sequence $x^{(1)}$ by the constant $a^{(1)}$ and sums up constant-times encoded sequences $a^{(1)} x^{(1)}$ each obtained as a result of the multiplication. In this way, an additive encoded sequence g for which signal points are located at unequal intervals is generated. It is needless to say that, in some cases, the transmission apparatus generates an additive encoded sequence g for which signal points are located at equal intervals. This indicates that optimum signal-point locations are determined in dependence on the signal-to-noise ratio S/N as described above.

Let symbol C' denote a total transmission rate for a transmission of L information-bit sequences $\{b^{(0)}, b^{(1)}, \ldots, b^{(L-1)}\}$. In this case, the total transmission rate C' is expressed by Eq. (30) as follows:

$$C' = \sum_{i=0}^{L-1} C^{(i)} \quad (30)$$

Let symbol $E_{b.ave}$ [J] denote average energy per bit required by the information-bit sequences $\{b^{(0)}, b^{(1)}, \ldots, b^{(L-1)}\}$ In this case, the average energy per bit $E_{b.ave}$ [J] is expressed by Eq. (31) as follows:

$$E_{b\text{-}ave} = \frac{\sum_{i=0}^{L-1} N^{(l)} E_b^{(l)}}{\sum_{i=0}^{L-1} N^{(l)}} = \frac{\sum_{i=0}^{L-1} MC^{(l)} E_b^{(l)}}{\sum_{i=0}^{L-1} MC^{(l)}} = \frac{\sum_{i=0}^{L-1} C^{(l)} E_b^{(l)}}{\sum_{i=0}^{L-1} C^{(l)}} \quad (31)$$

$$= \frac{n_0}{C'} \sum_{i=0}^{L-1} C^{(l)} \xi^{(l)} \prod_{i=0}^{L-1} (1 + 2C^{(i)} \xi^{(l)})$$

Let symbol $\xi_{ave'}$ denote a minimum signal-to-noise power ratio $E_{b.ave}/n_o$ per bit required to make an error rate equal to 0. In this case, this $\xi_{ave'}$ is expressed by Eq. (32) as follows:

$$\xi'_{ave} = \frac{1}{C'} \sum_{i=0}^{L-1} C^{(l)} \xi^{(l)} \prod_{i=0}^{l-1} (1 + 2C^{(i)} \xi^{(i)}) \quad (32)$$

In this case, the L encoded sequences $\{x^{(0)}, x^{(1)}, \ldots, x^{(L-1)}\}$ satisfy Shanon's limit equation, which is expressed by Eq. (33) as follows:

$$\xi^{(i)} = \frac{1}{2C^{(i)}} [2^{2C^{(i)}} - 1] \quad (33)$$

By substituting Eq. (33) into Eq. (32), Eq. (34) given below is obtained:

$$\xi'_{ave} = \frac{1}{2C'} \sum_{i=0}^{L-1} (2^{2C^{(i)}} - 1) \prod_{i=0}^{L-1} (2^{2C^{(i)}})$$

$$= \frac{1}{2C'} \sum_{i=0}^{L-1} (2^{2C^{(i)}} - 1) 2^{2\sum_{i=0}^{L-1} C^{(i)}} = \frac{1}{2C'} \sum_{i=0}^{L-1} \left(2^{2\sum_{i=0}^{L} C^{(i)}} - 2^{2\sum_{i=0}^{L-1} C^{(i)}}\right)$$

$$= \frac{1}{2C'} \left(2^{2\sum_{i=0}^{L-2} C^{(i)}} - 2^{2\sum_{i=0}^{L-2} C^{(i)}} + 2^{2\sum_{i=0}^{L-2} C^{(i)}} - 2^{2\sum_{i=0}^{L-2} C^{(i)}} + \ldots + 2^{2C^{(i)}} - 1\right)$$

$$= \frac{1}{2C'} (2^{2C'} - 1)$$

(34)

The above indicates that, if the L encoded sequences $\{x^{(0)}, x^{(1)}, \ldots, x^{(L-1)}\}$ satisfy Shanon's limit equation, code generated eventually by the transmission apparatus also satisfies Shanon's limit equation as well.

As described above, the transmission apparatus is capable of generating code that satisfies Shanon's limit equation.

Now, the following description explains details of an actual concrete configuration of the transmission apparatus for carrying out the encoding process described above. It should be noted that, in order to make the following explanation easy to describe, the transmission apparatus inputs 3 information-bit sequences $\{b^{(0)}, b^{(1)}, b^{(2)}\}$.

Figure 9:
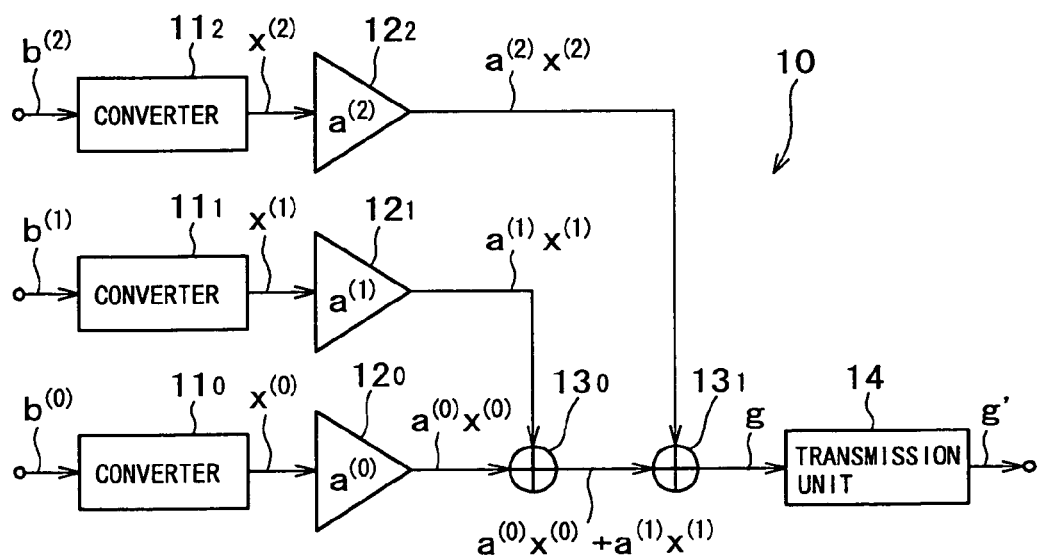
FIG. 9 is a block diagram showing an actual and concrete configuration of the transmission apparatus of the same data transmission and reception system.

As shown in FIG. 9, for example, the transmission apparatus 10 comprises 3 converters $11_0$, $11_1$ and $11_2$, 3 multipliers $12_0$, $12_1$ and $12_2$, 2 adders $13_0$ and $13_1$ and a transmission unit 14. The converters $11_0$, $11_1$ and $11_2$ convert the information-bit sequences $b^{(i)}$ into encoded sequences $x^{(i)}$. The multipliers $12_0$, $12_1$ and $12_2$ multiply their respective encoded sequences $x^{(i)}$ output by the converters $11_0$, $11_1$ and $11_2$ as results of the conversion processes by constants $a^{(i)}$. The adder $13_0$ adds a constant-times encoded sequence $a^{(0)}x^{(0)}$ produced by the multiplier $12_0$ as a result of multiplication to a constant-times encoded sequence $a^{(1)}x^{(1)}$ produced by the multiplier $12_1$ as a result of multiplication. The adder $13_1$ adds an additive encoded sequence $a^{(0)}x^{(0)}+a^{(1)}x^{(1)}$ produced by the adder $13_0$ as a result of addition to a constant-times encoded sequence $a^{(2)}x^{(2)}$ produced by the multiplier $12_2$ as a result of multiplication. The transmission unit 14 transmits an additive encoded sequence $g(=a^{(0)}x^{(0)}+a^{(1)}x^{(1)}+a^{(2)}x^{(2)})$ produced by the adder $13_1$ as a result of addition to an external apparatus.

It should be noted that the input information-bit sequences $\{b^{(0)}, b^{(1)}, b^{(2)}\}$ can be information transmitted through 3 channels independent of each other, or results of splitting an information-bit sequence into 3 sequences. In addition, the input information-bit sequences $\{b^{(0)}, b^{(1)}, b^{(2)}\}$ can have an equal bit count or bit counts different from each other, that is, $N_0$, $N_1$ and $N_2$.

The converters $11_0$, $11_1$ and $11_2$ each have an encoder and a modulator, which are not shown in the figure. The converter $11_0$ converts the input information-bit sequences $b^{(0)}$ having the bit count $N_0$ into a signal consisting of "1" and "−1" in Euclid's space. By the same token, the converter $11_1$ converts the input information-bit sequences $b^{(1)}$ having the bit count $N_1$ into such a signal. In the same way, the converter $11_2$ converts the input information-bit sequences $b^{(2)}$ having the bit count $N_2$ into such a signal. The converters $11_0$, $11_1$ and $11_2$ may each carry out any encoding and modulation processes as the conversion processing. It is even possible to go so far as to say that the input information-bit sequences $b^{(0)}$, $b^{(1)}$, $b^{(2)}$ can be merely modulated without carrying out an encoding process. At any rate, the converters $11_0$, $11_1$ and $11_2$ convert respectively the input information-bit sequences $b^{(0)}$, $b^{(1)}$, $b^{(2)}$ having bit counts $N_0$, $N_1$ and $N_2$ respectively each into an encoded sequence consisting of M numbers.

Figure 10:
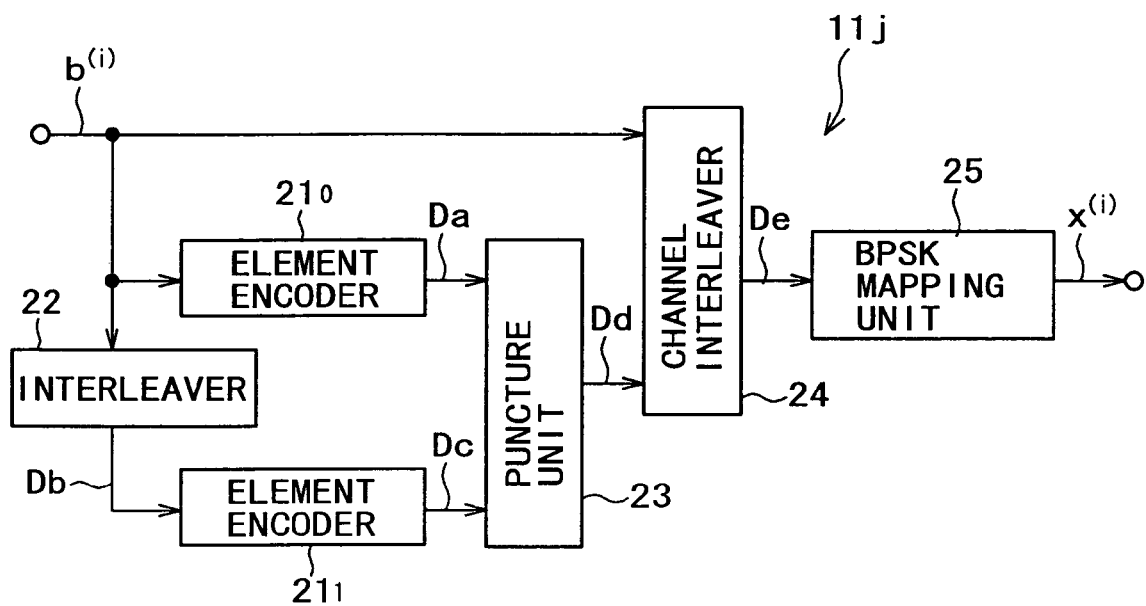
FIG. 10 is a block diagram showing an a concrete configuration of a converter employed in the transmission apparatus.

As shown in FIG. 10, typically, the converters $11_0$, $11_1$ and $11_2$ each comprise components for conceivably implementing a PCCC (Parallel Concatenated Convolutional Codes) encoding technique and a BPSK (Binary Phase Shift Keying) modulation technique. The PCCC encoding technique is adopted to produce the so-called turbo codes.

As shown in the same figure, the converter $11_j$ comprises 2 element encoders $21_0$ and $21_1$, an interleaver 22, a puncture unit 23, a channel interleaver 24 and a BPSK mapper 25. The element encoders $21_0$ and $21_1$ each carry out a convolution process. The interleaver 22 rearranges the order of pieces of input data. The puncture unit 23 carries out a proper discrete reduction process on input data. The channel interleaver 24 used for a channel rearranges the order of pieces of input data. The mapper 25 carries out a mapping process on signal points by adoption of the BPSK modulation technique.

Figure 11:
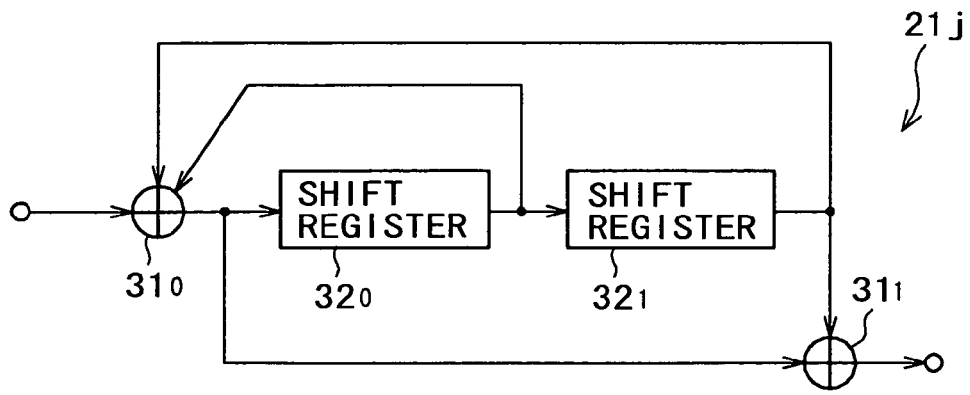
FIG. 11 is a block diagram showing an a concrete configuration of an element encoder employed in the transmission apparatus.

The element encoders $21_0$ and $21_1$ are each designed to carry out typically a recursive convolution process. The element encoders $21_0$ and $21_1$ can be identical with each other or different from each other. The element encoders $21_0$ and $21_1$ can each be an element encoder $21_j$ like one shown in FIG. 11. As shown in the figure, the element encoder $21_j$ conceivably comprises 2 exclusive-or circuits $31_0$ and $31_1$ and 2 shift registers $32_0$ and $32_1$.

The exclusive-or circuit $31_0$ carries out an exclusive-or process on data input to the element encoder $21_j$, and pieces of data received from the shift registers $32_0$ and $32_1$. The data input to the element encoder $21_j$ is information bits $b_n^{(i)}$ composing the information-bit sequence $b^{(i)}$ delayed by a time equal in length to a processing time of the interleaver 22. As an alternative, the input to the element encoder $21_j$ is interleaved data received from the interleaver 22. A result of the exclusive-or process is supplied to the exclusive-or circuit $31_1$ and the shift register $32_0$.

The exclusive-or circuit $31_1$ carries out an exclusive-or process on the data received from the exclusive-or circuit $31_0$ and data received from the shift register $32_1$, producing a result as output data to the external component.

The shift register $32_0$ supplies 1-bit data held therein to the exclusive-or circuit $31_0$ and the shift register $32_1$. The shift register $32_0$ then holds new 1-bit data, which is received from the exclusive-or circuit $31_0$, synchronously with a clock signal. Then, the shift register $32_0$ newly supplies the new 1-bit data held therein to the exclusive-or circuit $31_0$ and the shift register $32_1$.

Subsequently, the shift register $32_1$ again supplies 1-bit data held therein to the exclusive-or circuit $31_0$ and the shift register $31_1$. The shift register $32_0$ then holds new 1-bit data, which is received from the exclusive-or circuit $31_0$, synchronously with a clock signal. Then, the shift register $32_0$ newly supplies the new 1-bit data held therein to the exclusive-or circuit $31_0$ and the shift register $31_1$.

When the element encoder $21_0$, which is the element encoder $21_j$ described above, receives the information-bit sequence $b_n^{(i)}$ the element encoder $21_0$ carries out a convolution process on the information bits $b_n^{(i)}$. A result of the convolution process is supplied to the puncture unit 23 at the next stage as 1-bit output data Da. Much like the element encoder $21_0$, when the element encoder $21_1$ receives interleaved data Db from the interleaver 22, the element encoder $21_1$ carries out a convolution process on each bit of the interleaved data Db. A result of the convolution process is supplied to the puncture unit 23 at the next stage as 1-bit output data Dc.

The interleaver 22 receives the information-bit sequence $b^{(i)}$ and rearranges the order of the information bits $b_n^{(i)}$ composing the information-bit sequence $b^{(i)}$ on the basis of information on permutation locations, which is stored in a memory in advance, to generate the interleaved data Db. The interleaver 22 then supplies the interleaved data Db to the element encoder $21_1$.

The puncture unit 23 carries out a discrete reduction process by alternatively selecting the 2 sequences of output data Da and Dc, which are received from the element encoders $21_0$ and $21_1$ respectively, on the basis of a predetermined rule. A result of the discrete reduction process is supplied to the channel interleaver 24 as puncture data Dd with some bits thereof deleted.

The channel interleaver 24 receives the information-bit sequence $b^{(i)}$ and the puncture data Dd generated by the puncture unit 23. The information-bit sequence $b^{(i)}$ received by the channel interleaver 24 has been delayed by a time equal in length to the sum of processing times required by the element encoder $21_1$, the interleaver 22 and the puncture unit 23. The channel interleaver 24 changes the orders of the information bits $b_n^{(i)}$ composing the information-bit sequence $b^{(i)}$ and the bits composing the puncture data Dd on the basis of information on permutation locations, which is stored in a memory in advance, to generate interleaved data De consisting of M bits. The channel interleaver 24 then supplies the interleaved data De to the BPSK mapping unit 25. It should be noted that the channel interleaver 24 is not absolutely required. Typically, the channel interleaver 24 is provided for the main purpose of improving a characteristic by dispersion of a burst error.

The BPSK mapping unit 25 synchronizes the interleaved data De received from the channel interleaver 24 to the clock signal, mapping the synchronized interleaved data De onto transmission symbols of the BPSK modulation technique. The BPSK mapping unit 25 outputs the generated transmission symbols to the external component as an encoded sequence $x^{(i)}$.

When the converter $11_j$ described above receives an information-bit sequence $b^{(i)}$, the information-bit sequence $b^{(i)}$ is supplied to the channel interleaver 24 as organization constituent data. In addition, the output data Da obtained as a result of the convolution process carried out by the element encoder $21_0$ on the information-bit sequence $b^{(i)}$ and the output data Dc obtained as a result of the convolution process carried out by the element encoder $21_1$ on the interleaved data Db are supplied to the channel interleaver 24. Then, the converter $11_j$ maps the interleaved data De onto transmission symbols of the BPSK modulation technique and outputs the generated transmission symbols to the external component as an encoded sequence $x^{(i)}$.

Hereafter, in order to make the following explanation easy to describe, the converters $11_0$, $11_1$ and $11_2$ are assumed to each have the same configuration as the converter $11_j$ shown in the figure.

The converter $11_0$ having a configuration identical with the converter $11_j$ described above converts an information-bit sequence $b^{(0)}$ consisting of $N_0$ input bits into M numerical values located in an M-dimensional real-number vector space, and supplies an encoded sequence $x^{(0)}$ composed of the M numerical values to the multiplier $12_0$. By the same token, the converter $11_1$ also having a configuration identical with the converter $11_j$ described above converts an information-bit sequence $b^{(1)}$ consisting of $N_1$ input bits into M numerical values located in the M-dimensional real-number vector space, and supplies an encoded sequence $x^{(1)}$ composed of the M numerical values to the multiplier $12_1$. In the same way, the converter $11_2$ also having a configuration identical with the converter $11_j$ described above converts the information-bit sequence $b^{(2)}$ consisting of $N_2$ input bits into M numerical values located in the M-dimensional real-number vector space, and supplies an encoded sequence $x^{(2)}$ composed of the M numerical values to the multiplier $12_2$.

The multiplier $12_0$ multiplies the encoded sequence $x^{(0)}$ received from the converter $11_0$ by constants $a^{(0)}$ set by adoption of the method described above, and supplies a constant-times encoded sequence $a^{(0)} x^{(0)}$ obtained as a result of the multiplication to the adder $13_0$.

In the same way as the multipliers $12_0$, the multiplier $12_1$ multiplies the encoded sequence $x^{(1)}$ received from the converter $11_1$ by constants $a^{(1)}$ set by adoption of the method described above, and supplies a constant-times encoded sequence $a^{(1)} x^{(1)}$ obtained as a result of the multiplication also to the adder $13_0$.

In the same way as the multipliers $12_0$ and $12_1$, the multiplier $12_2$ multiplies the encoded sequence $x^{(2)}$ received from the converter $11_2$ by constants $a^{(2)}$ set by adoption of the method described above, and supplies a constant-times encoded sequence $a^{(2)} x^{(2)}$ obtained as a result of the multiplication to the adder $13_1$.

The adder $13_0$ adds the constant-times encoded sequence $a^{(0)} x^{(0)}$ received from the multiplier $12_0$ to the constant-times encoded sequence $a^{(1)} x^{(1)}$ received from the multiplier $12_1$ in an Euclid way for each constituent, and supplies an additive encoded sequence $a^{(0)} x^{(0)} + a^{(1)} x^{(1)}$ obtained as a result of the addition to the adder $13_1$.

The adder $13_1$ adds the additive encoded sequence $a^{(0)} x^{(0)} + a^{(1)} x^{(1)}$ received from the adder $13_0$ to the constant-times encoded sequence $a^{(2)} x^{(2)}$ received from the multiplier $12_2$ in an Euclid way for each constituent, and supplies a final additive encoded sequence $g(=a^{(0)} x^{(0)} + a^{(1)} x^{(1)} + a^{(2)} x^{(2)})$ obtained as a result of the addition to the transmission unit 14.

The transmission unit 14 is an interface for transmitting data to the external component. To put it concretely, the transmission unit 14 transmits the additive encoded sequence g received from the adder 131 to the external component as a transmission signal g'.

When the transmission apparatus 10 described above receives 3 information-bit sequences $\{b^{(0)}, b^{(1)}, b^{(2)}\}$, the transmission apparatus 10 carries out a predetermined encoding process on the information-bit sequences $\{b^{(0)}, b^{(1)}, b^{(2)}\}$ and, in order to transmit each of the information-bit sequences $\{b^{(0)}, b^{(1)}, b^{(2)}\}$ by expending energy $E_b$ [J] for achieving a desired bit error rate, the transmission apparatus 10 multiplies encoded sequences $\{x^{(0)}, x^{(1)}, x^{(2)}\}$, which have been obtained as a result of the encoding process, by constants $\{a^{(0)}, a^{(1)}, a^{(2)}\}$ to result in constant-times encoded sequences $\{a^{(0)} x^{(0)}, a^{(1)} x^{(1)}, a^{(2)} x^{(2)}\}$. Then, the transmission apparatus 10 sums up the constant-times encoded sequences $\{a^{(0)} x^{(0)}, a^{(1)} x^{(1)}, a^{(2)} x^{(2)}\}$ to yield an additive encoded sequence g. The additive encoded sequence g generated by the transmission apparatus 10 is transmitted as a transmission signal to the reception apparatus through a communication line, along which a noise n is added to the signal before the signal arrives at a reception apparatus to be described later.

The following description explains a reception apparatus employed in the data transmission and reception system. The reception apparatus receives a reception signal $y^{(L)}$, which is a sum of the transmission signal transmitted by the transmission apparatus as a transmission signal and the noise n as shown in Eq. (35) given below. The reception apparatus is capable of carrying out a decoding process to generate at least one of the information-bit sequences $b^{(1)}$. To be more specific, when the reception apparatus receives the reception signal $y^{(L)}$, the reception apparatus is capable of carrying out a decoding process to generate at least the information-bit sequence $b^{(L-1)}$ having the highest order among the information-bit sequences $b^{(l)}$ encoded by the transmission apparatus. The information-bit sequence $b^{(L-1)}$ is an information-bit sequence last added and transmitted by expending the greatest information-bit energy $E_b$.

$$y^{(L)} = g(b^{(0)}, b^{(1)}, \ldots, b^{(L-1)}) + n \qquad (35)$$

$$= \sum_{l=0}^{L-1} a^{(l)} x^{(l)} (b^{(l)}) + n$$

Figure 12:
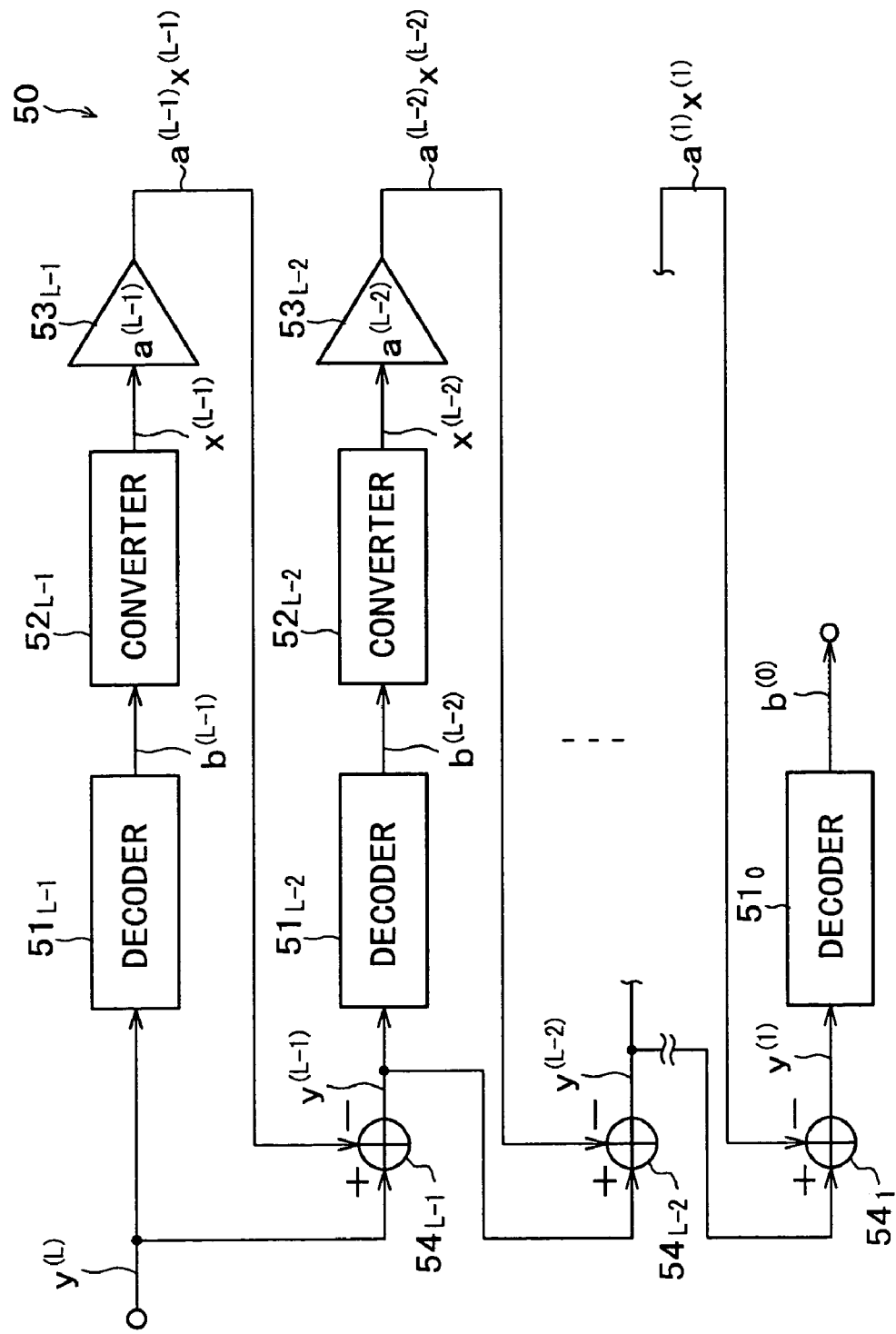
FIG. 12 is a block diagram showing the configuration of an ordinary reception apparatus for carrying out a decoding process according to the present invention.

In general, the reception apparatus has a typical configuration shown in FIG. 12. As shown in the figure, the reception apparatus 50 has L decoders $51_{L-1}, 51_{L-2}, \ldots$ and $51_0$, (L-1) converters $52_{L-1}, 52_{L-2}, \ldots$ and $52_1$, (L-1) multipliers $53_{L-2}, 53_{L-2}, \ldots$ and $53_1$ and (L-1) subtractors $54_{L-1}, 54_{L-2}, \ldots$ and $54_1$. The decoders $51_{L-1}, 5_{L-2}, \ldots$ and $51_0$ serve as counterparts of the corresponding encoders employed in the transmission apparatus. The converters $52_{L-1}, 52_{L-2}, \ldots$ and $52_1$ are identical with the converters employed in the transmission apparatus. The multipliers $53_{L-1}, 53_{L-2}, \ldots$ and $53_1$ are identical with the multipliers employed in the transmission apparatus.

First of all, the reception apparatus 50 carries out a decoding process to produce the information-bit sequence $b^{(L-1)}$. As described earlier, the information-bit energy $E^{b(L-1)}$ is set at a value $\xi$ times the sum of the power density of the noise n and the power densities of the code $x^{(0)}$ to the code $x^{(L-2)}$. Thus, the reception apparatus 50 is capable of carrying out a decoding process to produce data with an error rate of 0 or an error rate having a value close to 0. Assume that the reception apparatus 50 is capable of accurately decoding a received value $y^{(L)}$ input by a reception unit, which is not shown in the figure, by using the decoder $51_{L-1}$ to produce the information-bit sequence $b^{(L-1)}$. In this case, the information-bit sequence $b^{(L-1)}$ obtained as a result of the decoding process is re-encoded by the converter $52_{L-1}$ to generate the encoded sequence $x^{(L-1)}$. The multiplier $53_{L-1}$ then multiplies the encoded sequence $x^{(L-1)}$ by a constant $a_{(L-1)}$ to produce the constant-times encoded sequence $a^{(L-1)} x^{(L-1)}$. Then, the subtractor $54_{L-1}$ subtracts the constant-times encoded sequence $a^{(L-1)} x^{(L-1)}$ from the received value $y^{(L)}$ for each constituent. In this way, as shown in Eq. (36) given below, the reception apparatus 50 is capable of obtaining information $y^{(L-1)}$ equivalent to a value, which is received when a code obtained as a result of an encoding process carried out by the transmission apparatus on information-bit sequences up to the information-bit sequence $b^{(L-2)}$ is received.

$$y^{(L-1)} = y^{(L)} - a^{(L-1)} x(b^{(L-1)}) \qquad (36)$$

$$= \sum_{l=0}^{L-2} a^{(l)} x^{(l)} (b^{(l)}) + n$$

By the same token, assume that the reception apparatus 50 is capable of accurately decoding a received value $y^{(L-1)}$ input by the reception unit by using the decoder $51_{L-2}$ to produce the information-bit sequence $b^{(L-2)}$. In this case, the information-bit sequence $b^{(L-2)}$ obtained as a result of the decoding process is re-encoded by the converter $52_{L-2}$ to generate the encoded sequence $x^{(L-2)}$. The multiplier $53_{L-2}$ then multiplies the encoded sequence $x^{(L-2)}$ by a constant $a^{(L-2)}$ to produce the constant-times encoded sequence $a^{(L-2)} x^{(L-2)}$. Then, the subtractor $54_{L-2}$ subtracts the constant-times encoded sequence $a^{(L-2)} x^{(L-2)}$ from the received value $y^{(L-1)}$ for each constituent. In this way, as shown in Eq. (37) given below, the reception apparatus 50 is capable of obtaining information $y^{(L-2)}$ equivalent to a value, which is received when a code obtained as a result of an encoding process carried out by the transmission apparatus on information-bit sequences up to the information-bit sequence $b^{(L-3)}$ is received.

$$y^{(L-2)} = y^{(L-1)} - a^{(L-2)} x(b^{(L-2)}) \quad (37)$$
$$= \sum_{i=0}^{L-3} a^{(l)} x^{(l)}(b^{(l)}) + n$$

By carrying out the same operations repeatedly, the reception apparatus 50 is capable of sequentially performing the decoding process to generate the information-bit sequences $b^{(1)}$. For the last information-bit sequence $b^{(0)}$, as shown in Eq. (38) given below, the reception apparatus 50 is capable of obtaining information $y^{(1)}$ equivalent to a value, which is received when a code obtained as a result of an encoding process carried out by the transmission apparatus on information-bit sequences up to the information-bit sequence $b^{(0)}$ is received. That is to say, the reception apparatus 50 is capable of carrying out a decoding process to generate the information-bit sequence $b^{(0)}$.

$$y^{(1)} = x^{(0)}(b^{(0)}) + n \quad (38)$$

As described above, when a received value $y^{(L)}$ is input, the received value $y^{(L)}$ is decoded to produce the highest-order information-bit sequence $b^{(L-1)}$. Then, the information-bit sequence $b^{(L-1)}$ obtained as a result of the decoding process is re-encoded to generate the encoded sequence $x^{(L-1)}$. The encoded sequence $x^{(L-1)}$ is then multiplied by a constant $a^{(L-1)}$ to produce the constant-times encoded sequence $a^{(L-1)} x^{(L-1)}$. Then, the constant-times encoded sequence $a^{(L-1)} x^{(L-1)}$ is subtracted from the received value $y^{(L)}$. In this way, it is thus possible to carry out a decoding process to produce the next-order information-bit sequence $b^{(L-2)}$. By carrying out the same operations repeatedly for the information-bit sequences up to the last information-bit sequence $b^{(0)}$ as described above, the reception apparatus 50 is capable of performing decoding processes to generate all the information-bit sequences $\{b^{(0)}, b^{(1)}, \ldots b^{(L-1)})\}$.

In addition, the reception apparatus 50 does not have to carry out all the decoding processes to generate all the information-bit sequences $\{b^{(0)}, b^{(1)}, \ldots, b^{(L-1)}\}$. Instead, the reception apparatus 50 may carry out a decoding process to produce only the highest-order information-bit sequence $b^{(L-1)}$. As an alternative, the reception apparatus 50 may also carry out some of decoding processes to produce only information-bit sequences $b^{(1)}$ ranging from the highest order to a predetermined order.

The data transmission and reception system described above is effective for, among others, the case of an assumed application in which a transmission apparatus encodes picture data having a variety of resolutions and transmits the encoded picture data to a reception apparatus 50 whereas the reception apparatus 50 decodes the encoded picture data and displays the picture data. That is to say, the transmission apparatus prepares the resolutions for picture data having the same contents. The transmission apparatus then encodes a plurality of pieces of such picture data as the same plurality of information-bit sequences $b^{(1)}$. The transmission apparatus starts the encoding process with an operation to encode the picture data having the highest resolution as an information-bit sequence of the lowest order, that is, the information-bit sequence $b^{(0)}$. Then, the transmission apparatus continues the encoding process with operations to encode the pieces of picture data with lower resolutions in an order of decreasing resolutions as information-bit sequences with sequentially increasing orders. That is to say, the lower the resolution of picture data, the more the importance attached by the transmission apparatus to the data and the larger the amplitude at which the data is transmitted.

On the other hand, when the reception apparatus 50 inputs received values $y^{(L)}$, the reception apparatus 50 decodes the received values $y^{(L)}$ sequentially to generate the information-bit sequences $b^{(1)}$. As the decoding process to generate information-bit sequences $b^{(1)}$ representing pieces of picture data, which correspond to the resolution of a display unit employed in the reception apparatus 50, is completed, the decoding process is ended without decoding received values $y^{(L)}$ to generate information-bit sequences of orders lower than the order corresponding to the resolution of the display unit. In this way, the reception apparatus 50 is capable of selectively carrying out decoding processes to generate only picture data that can be displayed on its own display unit and displaying the picture data on the display unit.

As described above, the reception apparatus 50 does not carry out decoding processes to generate all the information-bit sequences $\{b^{(0)}, b^{(1)}, \ldots, b^{(L-1)}\}$, but carries out only a decoding process to generate the high-order information-bit sequence $b^{(L-1)}$ of much importance.

By the way, in the case of code satisfying Shannon's limit, errors are eliminated completely within a border defined by a certain signal-to-noise power ratio $E_b/n_o$. That is to say, it is known that, at signal-to-noise power ratios lower than this signal-to-noise power ratio $E_b/n_o$, errors are generated abruptly. In the case of a transmission through a communication line causing a signal-to-noise power ratio lower even slightly than the signal-to-noise power ratio $E_b/n_o$ required for entire code, the reception apparatus generates a detrimental error in a first decoding process to produce the highest-order information-bit sequence $b^{(L-1)}$, making it completely impossible to carry out subsequent decoding processes to generate information-bit sequences $b^{(L-2)}, \ldots,$ and $b^{(0)}$ each having an order lower than the order of the highest-order information-bit sequence $b^{(L-1)}$. In the case of a transmission through a communication line causing a signal-to-noise power ratio higher even slightly than the signal-to-noise power ratio $E_b/n_o$ required for entire code, on the other hand, the reception apparatus is capable of carrying out decoding processes to generate all the information-bit sequences $b^{(1)}$ at an error rate of 0.

In the present state of the contemporary actual code, however, it is impossible to obtain such an abrupt characteristic. Even in such a case, nevertheless, if the original code is code for which the so-called MAP (Maximum A Posteriori) probability decoding process or a decoding process conforming to the MAP decoding process can be carried out, a decoding process can be performed to generate actual code with many or few errors left.

Thus, in the data transmission and reception system, there has been proposed a reception apparatus capable of carrying out the MAP decoding process as an actual reception apparatus.

In the MAP decoding process, posteriori probability information estimated from a received value for a candidate of a transmitted signal is found with the likelihood of the received value used as an input. A transmission system of the data transmission and reception system is expressed by Eq. (39) given below. When a decoding operation is carried out in the MAP decoding process to generate the information-bit sequence $b^{(i)}$, the likelihood of the information-bit sequence $b^{(i)}$ is expressed by a conditional probability $P(y^{(L)}|b^{(i)})$ shown in Eq. (40) given below.

$$y^{(L)} = g(b^{(0)}, b^{(1)}, \ldots, b^{(L-1)}) + n = x + n \quad (39)$$

$$Likelihood^{(i)} = p(y^{(L)} | b^{(i)}) \quad (40)$$

$$\propto \sum_{\substack{b^{(i)} \\ l=i}} P(b^{(0)})P(b^{(1)}) \ldots P(b^{(L-1)}) \exp\left[-\frac{1}{n_0}\left|y^{(L)} - g(b^{(0)}, b^{(1)}, \ldots, b^{(L-1)})\right|^2\right]$$

Symbol $\Sigma$ in Eq. (40) is an operator for finding a sum for candidates of all information-bit sequences $b^{(1)}$ with respect to all values of l except i. Symbol $P(b^{(j)})$ in Eq. (40) denotes a probability at which the information-bit sequence $b^{(j)}$ is generated. It should be noted that, at the stage of starting the decoding process, it is impossible to identify which code is received. Thus, the initial value of the probability $P(b^{(j)})$ is expressed by Eq. (41) as follows:

$$P(b^{(1)}) = 1/2^N \quad (41)$$

The reception apparatus carries out decoding processes, starting with a decoding process to generate a high-order information-bit sequence. Thus, posteriori probability information obtained as a result of a MAP decoding process can be used in finding a next decoding likelihood value. For this reason, even if many or few uncertain errors are left in a result of a decoding process, it is possible to carry out a decoding process adding the errors in the decoding process at the next stage. In this case, in the reception apparatus, a bad effect of the decoding process carried out at the preceding stage is inherited by the decoding process at the next stage. Since the deterioration of the characteristic is not that bad, however, there is no detrimental effect.

By decomposing all the sequences' likelihood expressed by Eq. (40) given before into pieces of likelihood for M dimensional elements, the likelihood can be expressed by Eq. (42) as follows.

$$Likelihood^{(i)} = \quad (42)$$

$$p(y^{(L)}|b^{(i)}) = p(y^{(L)}|x(b^{(i)})) = \prod_{k=0}^{M-1} p(y_k^{(L)}|x_k^{(i)}) \propto \prod_{k=0}^{M-1} \sum_{\substack{x_l^{(1)} \\ l=i}} P(x_k^{(0)}) \ldots P(x_k^{(L-1)}) \exp\left[-\frac{1}{n_0}\left|y_k^{(L)} - \sum_{j=0}^{L-1} a^{(j)} x_k^{(j)}\right|^2\right]$$

Symbol $P(x_k^{(1)})$ in Eq. (42) is a probability at which the kth component of an M-dimensional vector of a code word for the information-bit sequence $b^{(j)}$ is $x_k^{(1)}$. Symbol $\Sigma$ in Eq. (42) is an operator for finding a sum for all possible components $x_k^{(1)}$ with respect to all values of l except i. It should be noted that, if a decoding process can be carried out at the preceding stage without leaving ambiguity at all, the probability $P(x_k^{(j)})$ for a specific component $x_k^{(j)}$ is equal to 1. Thus, this processing is equal to cancellation by carrying out a re-encoding process.

As described above, if the MAP decoding process is applicable to the original signal, the reception apparatus is capable of carrying out a decoding process to produce all the information-bit sequences $\{b^{(0)}, b^{(1)}, \ldots, b^{(L-1)}\}$ by reflecting a result of a MAP decoding process carried out to generate an information-bit sequence $b^{(1)}$ in processing to find a likelihood value for another information-bit sequence.

It should be noted that, in the case of a transmission through a dynamic communication line called a Rayleigh fading channel, the signal-to-noise power ratio $E_b/n_o$ required by the original signal deteriorates slightly in comparison with the AWGN channel. In this case, the transmission apparatus needs to construct code by assuming a required signal-to-noise power ratio of $E_b/(n_o+2v)$, which is found for a communication line to be used for the transmission. Since the noise source for high-order code is a source generating a thermal noise, which is a kind of low-order code, as described above, however, the level of low-order code varies along with the high-order code. For this reason, the deviation of variations in high-order code becomes smaller, setting the required signal-to-noise power ratio $E_b/(n_o+2v)$ in a decreasing trend as well. As a result, the required signal-to-noise power ratio $E_b/(n_o+2v)$ for all codes is expected to decrease less than a deterioration of the signal-to-noise power ratio $E_b/(n_o+2v)$ for a single code. Here, let the amplitude f on the dynamic communication line be expressed by Eq. (43) given below. In this case, the received value y is expressed by Eq. (44) given below. Accordingly, the likelihood is expressed by Eq. (45) as follows.

$$f = \{f_0, f_1, \ldots, f_{N-1}\}^T \quad (43)$$

$$y = f^T \cdot g + n \quad (44)$$

$$Likelihood^{(i)} = p(y^{(L)}|b^{(i)}) \quad (45)$$

$$= p(y^{(L)}|x(b^{(i)}))$$

$$= \prod_{k=0}^{M-1} p(y_k^{(L)}|x_k^{(i)}) \propto \prod_{k=0}^{M-1} \sum_{\substack{x_l^{(1)} \\ l=i}} P(x_k^{(0)}) P(x_k^{(1)}) \ldots$$

$$P(x_k^{(L-1)}) \exp\left[-\frac{1}{n_0}\left|y_k^{(L)} - f_k \cdot \sum_{j=0}^{L-1} a^{(j)} x_k^{(j)}\right|^2\right]$$

Now, the following description explains a concrete configuration of the reception apparatus, which is used for carrying out such a decoding process, in detail. It should be noted that, in order to make the following explanation easy to describe, the reception apparatus is an apparatus for receiving a reception signal y' comprising the received value y, which is the sum of a noise n and a transmission signal g' encoded and transmitted by the transmission apparatus 10 described above. That is to say, the reception apparatus is an apparatus for carrying out decoding processes to obtain soft-decision values of the information-bit sequences $\{b^{(0)}, b^{(1)}, b^{(2)}\}$.

Figure 13:
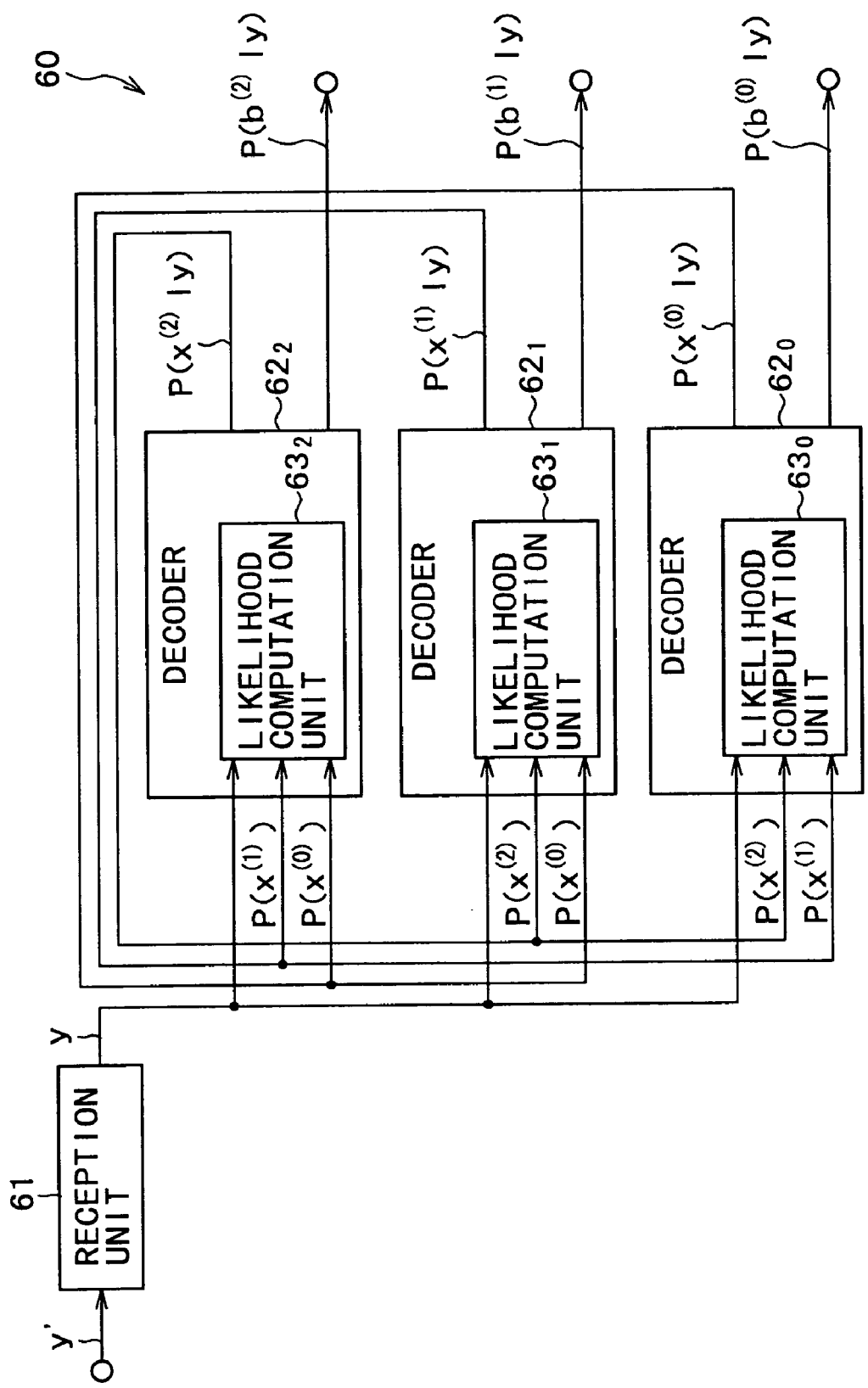
FIG. 13 is a block diagram showing an actual and concrete configuration of the reception apparatus of the same data transmission and reception system.

As shown in FIG. 13, the reception apparatus 60 typically comprises a reception unit 61 for receiving a reception signal y' transmitted by an external apparatus and 3 decoders $62_0$, $62_1$ and $62_2$ each used for carrying out a turbo decoding process corresponding to the PCCC-encoding process performed by the converters $11_0$, $11_1$ and $11_2$ employed in the transmission apparatus 10 described above.

The reception unit 61 is an interface for receiving data from an external apparatus. When the reception unit 61 receives a reception signal y', the reception unit 61 supplies the reception signal y' to decoders $62_0$, $62_1$ and $62_2$ as a received value y.

The decoders $62_0$, $62_1$ and $62_2$ are provided as counterparts of respectively the converters $11_0$, $11_1$ and $11_2$ employed in the transmission apparatus 10. The decoders $62_0$, $62_1$ and $62_2$ include respectively likelihood computation units $63_0$, $63_1$ and $63_2$ for finding a likelihood value of a reception symbol from the received value y. The decoders $62_0$, $62_1$ and $62_2$ each find posteriori probability information for an information bit by carrying out a turbo decoding process corresponding to the PCCC-encoding process performed by the converters $11_0$, $11_1$ and $11_2$ employed in the transmission apparatus 10. The decoders $62_0$, $62_1$ and $62_2$ will be described in detail later.

The reception apparatus 60 described above is characterized in that the decoders $62_0$, $62_1$ and $62_2$ output pieces of posteriori probability information $P(x^{(0)}|y)$, $P(x^{(1)}|y)$ and $P(x^{(2)}|y)$ for encoded sequences $\{x^{(0)}, x^{(1)}, x^{(2)}\}$ generated by the decoders $62_0$, $62_1$ and $62_2$ respectively. To put it in detail, the reception apparatus 60 described above is characterized in that the decoder $62_0$ outputs the posteriori probability information $P(x^{(0)}|y)$ as priori probability information $P(x^{(0)})$ for the encoded sequence $x^{(0)}$ to the other decoders $62_1$ and $62_2$. In addition, the reception apparatus 60 described above is also characterized in that the decoder $62_1$ outputs the posteriori probability information $P(x^{(1)}|y)$ as priori probability information $P(x^{(1)})$ for the encoded sequence $x^{(1)}$ to the other decoders $62_0$ and $62_2$. Furthermore, the reception apparatus 60 described above is further characterized in that the decoder $62_2$ outputs the posteriori probability information $P(x^{(2)}|y)$ as priori probability information $P(x^{(2)})$ for the encoded sequence $x^{(2)}$ to the other decoders $62_0$ and $62_1$. In an initial state, an initial value of the priori probability information $P(x^{(1)})$ and an initial value of the priori probability information $P(x^{(2)})$ are supplied to the decoder $62_0$. In addition, an initial value of the priori probability information $P(x^{(0)})$ and an initial value of the priori probability information $P(x^{(2)})$ are supplied to the decoder $62_1$. Furthermore, an initial value of the priori probability information $P(x^{(0)})$ and an initial value of the priori probability information $P(x^{(1)})$ are supplied to the decoder $62_2$. The initial values each represent an unknown probability. In this case, since each constituent of the encoded sequences $\{x^{(0)}, x^{(1)}, x^{(2)}\}$ has been subjected to a signal-point mapping process based on the BPSK modulation method in the transmission apparatus 10, $P(x^{(1)}=1|y)=P(x^{(1)}=1)=0.5$ and $P(x^{(1)}=-1|y)=P(x^{(1)}=-1)=0.5$.

When the reception apparatus 60 receives a received value y, first of all, the reception apparatus 60 supplies the received value y to the decoder $62_2$. In addition, the decoder $62_2$ employed in the reception apparatus 60 also receives the priori probability information $P(x^{(0)})$ for the encoded sequence $x^{(0)}$ and the priori probability information $P(x^{(1)})$ for the encoded sequence $x^{(1)}$ The decoder $62_2$ employed in the reception apparatus 60 carries out a turbo decoding process on the received value y, the priori probability information $P(x^{(0)})$ and the priori probability information $P(x^{(1)})$ to generate the posteriori probability information $P(x^{(2)}|y)$ for the encoded sequence $x^{(2)}$ and the posteriori probability information $P(b^{(2)}|y)$ for the information-bit sequence $b^{(2)}$. Then, the decoder $62_2$ employed in the reception apparatus 60 supplies the posteriori probability information $P(x^{(2)}|y)$ to the decoders $62_0$ and $62_1$ as the priori probability information $P(x^{(2)})$ for the encoded sequence $x^{(2)}$, and supplies the posteriori probability information $P(b^{(2)}|y)$ to an external component as a soft-output.

Subsequently, the reception unit employed in the reception apparatus 60 supplies the received value y to the decoder $62_1$ after delaying the received value y by a delay time equal in length to the processing time of the decoder $62_2$. In addition, the decoder $62_1$ employed in the reception apparatus 60 also receives the priori probability information $P(x^{(0)})$ for the encoded sequence $x^{(0)}$ and the priori probability information $P(x^{(2)})$ for the encoded sequence $x^{(2)}$. The decoder $62_1$ employed in the reception apparatus 60 carries out a turbo decoding process on the received value y, the priori probability information $P(x^{(0)})$ and the priori probability information $P(x^{(2)})$ to generate the posteriori probability information $P(x^{(1)}|y)$ for the encoded sequence $x^{(1)}$ and the posteriori probability information $P(b^{(1)}|y)$ for the information-bit sequence $b^{(1)}$. Then, the decoder $62_1$ employed in the reception apparatus 60 supplies the posteriori probability information $P(x^{(1)}|y)$ to the decoder $62_0$ and, if necessary, the decoder $62_2$ as the priori probability information $P(x^{(1)})$ for the encoded sequence $x^{(1)}$, and supplies the posteriori probability information $P(b^{(1)}|y)$ to the external component as a soft-output.

Subsequently, the reception unit employed in the reception apparatus 60 supplies the received value y to the decoder $62_0$ after delaying the received value y by a delay time equal in length to the sum of the processing time of the decoder $62_1$ and the processing time of the decoder $62_2$. In addition, the decoder $62_0$ employed in the reception apparatus 60 also receives the priori probability information $P(x^{(1)})$ for the encoded sequence $x^{(1)}$ and the priori probability information $P(x^{(2)})$ for the encoded sequence $x^{(2)}$. The decoder $62_0$ employed in the reception apparatus 60 carries out a turbo decoding process on the received value y, the priori probability information $P(x^{(1)})$ and the priori probability information $P(x^{(2)})$ to generate the posteriori probability information $P(x^{(0)}|y)$ for the encoded sequence $x^{(0)}$ and the posteriori probability information $P(b^{(0)}|y)$ for the information-bit sequence $b^{(0)}$. Then, the decoder $62_0$ employed in the reception apparatus 60 supplies the posteriori probability information $P(x^{(0)}|y)$ to the decoders $62_1$ and $62_2$ if necessary as the priori probability information $P(x^{(0)})$ for the encoded sequence $x^{(0)}$, and supplies the posteriori probability information $P(b^{(0)}|y)$ to the external component as a soft-output.

By carrying out the operations described above, the reception apparatus 60 is capable of carrying out decoding processes to generate the pieces of posteriori probability information $P(b^{(2)}|y)$, $P(b^{(1)}|y)$ and $P(b^{(0)}|y)$ in an enumeration order of $P(b^{(2)}|y)$, $P(b^{(1)}|y)$ and $P(b^{(0)}|y)$. In the reception apparatus 60, a hard-decision unit not shown in the figure converts the pieces of posteriori probability information $P(b^{(2)}|y)$, $P(b^{(1)}|y)$ and $P(b^{(0)}|y)$ into binary values to obtain the information-bit sequences $b^{(2)}$, $b^{(1)}$ and $b^{(0)}$. It should be noted that, while the reception apparatus 60 carries out a decoding process only once sequentially to generate information-bit sequences starting with the information-bit sequence $b^{(2)}$, the reception apparatus 60 is also capable of performing the so-called zigzag decoding process or the so-called repetitive decoding process as will be described later.

The following description explains the decoders $62_0$, $62_1$ and $62_2$ for carrying out the turbo decoding process. First of all, an ordinary turbo decoder for carrying out a turbo decoding process of one encoded sequence is explained to clarify the characteristic of the decoders $62_0$, $62_1$ and $62_2$ applied to the reception apparatus 60. It should be noted that, in this case, in order to make the following explanation easy to describe, a turbo decoder serving as the counterpart of the converter $11_j$ shown in FIG. 10 is explained first.

Figure 14:
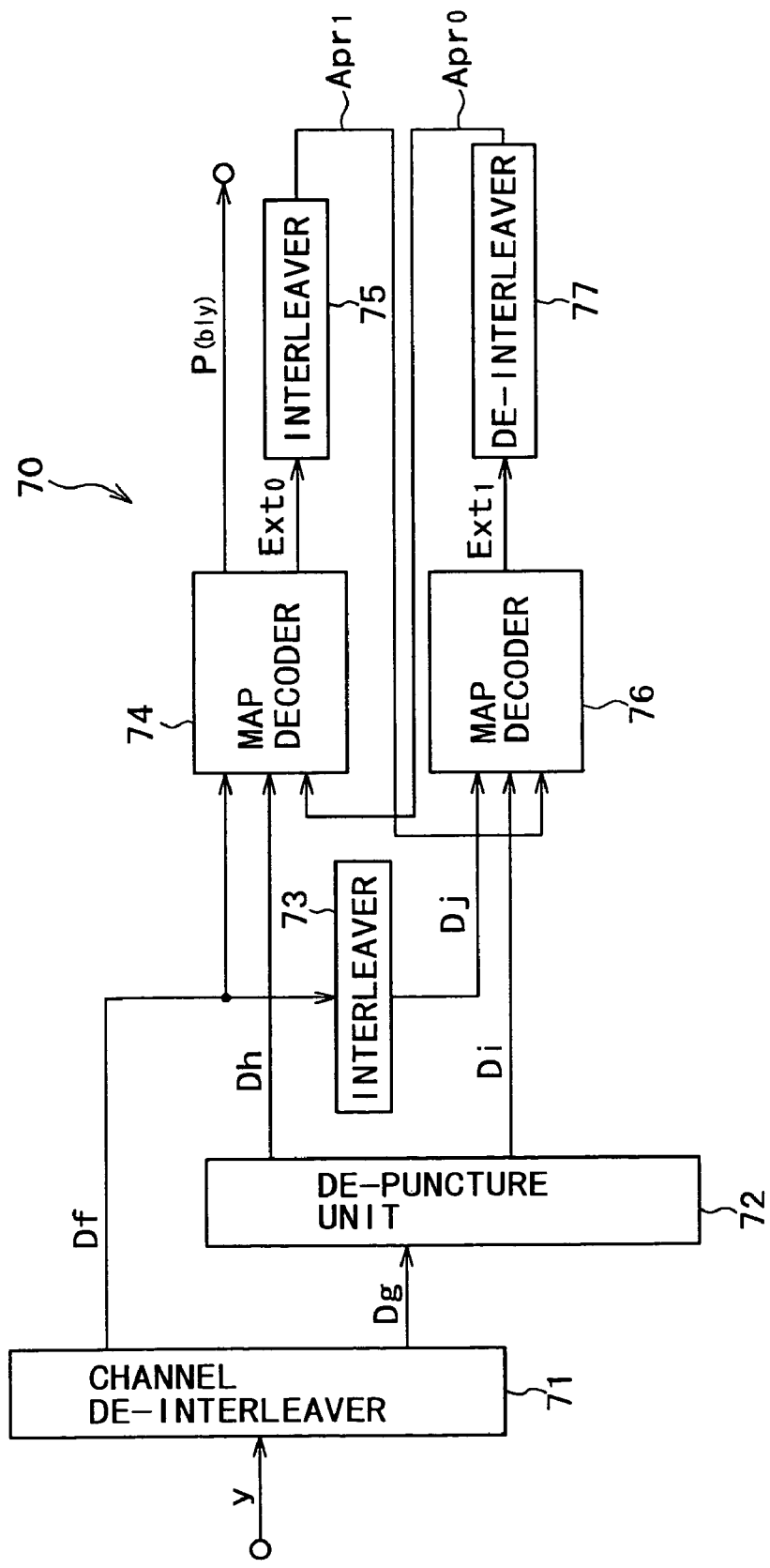
FIG. 14 is an explanatory block diagram showing the configuration of an ordinary turbo decoder.

As shown in FIG. 14, an ordinary turbo decoder 70 comprises a channel de-interleaver 71, a de-puncture unit 72, 2 interleavers 73 and 75, 2 MAP decoders 74 and 76 and a de-interleaver 77. The channel de-interleaver 71 used for a channel restores pieces of input data to an original order. The de-puncture unit 72 restores discretely reduced data to the original data. The interleavers 73 and 75 each rearrange the order of pieces of input data. The MAP decoders 74 and 76 each carry out a MAP decoding process. The de-interleaver 77 restores pieces of input data to the original order.

The channel de-interleaver 71 is provided if the converter $11_j$ described earlier includes the channel interleaver 24. The channel de-interleaver 71 inputs the received value y and de-interleaves the received value y to restore the bit array of the interleaved data De to the bit array of the original information-bit sequence $b^{(i)}$ and the bit array of the original puncture data Dd. The interleaved data De has been interleaved by the channel interleaver 24 employed in the converter $11_j$. A sequence Df is the de-interleaving process' result corresponding to the information-bit sequence $b^{(i)}$. On the other hand, a sequence Dg is the de-interleaving process' result corresponding to the puncture data Dd. The channel de-interleaver 71 supplies the sequence Df to the interleaver 73 and the MAP decoder 74 but supplies the sequence Dg to the de-puncture unit 72.

The de-puncture unit 72 restores the sequence Dg received from the channel de-interleaver 71 by inserting data such as 0.0 into positions of bits discretely reduced by the puncture unit 23 employed in the converter $11_j$ to generate 2 sequences Dh and Di corresponding to respectively the 2 sequences Da and Dc output by the element encoders $21_0$ and $21_1$ respectively. The de-puncture unit 72 supplies the sequence Dh to the MAP decoder 74 and the sequence Di to the MAP decoder 76.

The interleaver 73 inputs the sequence Df supplied by the channel de-interleaver 71, and interleaves the sequence Df on the basis of the same information on permutation locations as the interleaver 22 employed in the converter $11_j$. The interleaver 73 then supplies a sequence Dj obtained as a result of the interleaving process to the MAP decoder 76.

The MAP decoder 74 is provided as a counterpart of the element encoder $21_0$ employed in the converter $11_j$. The MAP decoder 74 receives the soft-input sequence Df corresponding to the information-bit sequence $b^{(i)}$ from the channel de-interleaver 71, the soft-input sequence Dh from the de-puncture unit 72 and priori probability information $Apr_0$ for a soft-input information bit from the de-interleaver 77. The MAP decoder 74 then carries out a MAP decoding process on the sequence Df, the sequence Dh and the priori probability information $Apr_0$. Then, the MAP decoder 74 generates the so-called extrinsic information $Ext_0$ for an information-bit sequence to be found by using a code constraint condition and supplies this extrinsic information $Ext_0$ to the interleaver 75 as a soft-output. It should be noted that the extrinsic information $Ext_0$ represents an increase in likelihood.

The interleaver 75 interleaves the extrinsic information $Ext_0$ received from the MAP decoder 74 as a soft input corresponding to an information-bit sequence on the basis of the same information on permutation locations as the interleaver 22 employed in the converter $11_j$. The interleaver 75 then supplies priori probability information $Apr_1$ for an information bit in the MAP decoder 76 as a result of the interleaving process to the MAP decoder 76.

The MAP decoder 76 is provided as a counterpart of the element encoder $21_1$ employed in the converter $11_j$. The MAP decoder 76 receives the soft-input sequence Dj corresponding to the information-bit sequence $b^{(i)}$ from the channel interleaver 73, the soft-input sequence Di from the de-puncture unit 72 and the priori probability information $Apr_1$ for soft-input information bits from the interleaver 75. The MAP decoder 76 then carries out a MAP decoding process on the sequence Dj, the sequence Di and the priori probability information $Apr_1$. Then, the MAP decoder 76 generates the so-called extrinsic information Ext1 for an information-bit sequence to be found by using a code constraint condition and supplies this extrinsic information $Ext_1$ to the de-interleaver 77 as a soft-output. It should be noted that, much like the extrinsic information $Ext_0$, the extrinsic information $Ext_1$ represents an increase in likelihood. In addition, the MAP decoder 76 generates posteriori probability information P(b|y) for an information bit on the basis of soft-output external information obtained as a result of a repetitive decoding process carried out repeatedly a predetermined plurality of times, and outputs the posteriori probability information P(b|y) as decoded data.

The de-interleaver 77 de-interleaves the extrinsic information $Ext_1$ received from the MAP decoder 76 as a soft input so as to restore the bit array of the data Db interleaved by the interleaver 22 employed in the converter $11_j$ to the bit array of the original information-bit sequence $b^{(i)}$. The de-interleaver 77 then supplies the priori probability information $Apr_0$ for an information bit in the MAP decoder 74 as a result of the interleaving process to the MAP decoder 74.

In the turbo decoder 70 described above, the MAP decoders 74 and 76 find posteriori probability information $Apo(b_j)$ by using the soft-input sequences corresponding to the information-bit sequence $b^{(i)}$ and the puncture data Dd and by using the pieces of priori probability information $Apr_0$ and $Apr_1$. The posteriori probability information $Apo(b_j)$ is a probability at which an information bit at a time j is $b_j$. To be more specific, the MAP decoders 74 and 76 find the posteriori probability information $Apo(b_j)$ in accordance with Eq. (46) as follows:

$$Apo(b_j) = P(b_j|y) \qquad (46)$$

$$= \sum_{o \in C} P(b_i, b \mid y) = \sum_{o \in C} \frac{p(y \mid b_j, b) P(b_j, b)}{p(y)}$$

$$\propto \sum_{o \in C} p(y \mid b_j, b) P(b_j, b) = \sum_{o \in C\beta_i} p(y \mid b) P(b)$$

$$= \sum_{o \in CP_j} p(y \mid x) P(b) = \sum_{o \in CP_j} \prod_{k=0}^{N-1} p(y_k \mid x_k) P(b_k)$$

$$= \sum_{o \in CP_j} \prod_{k=0}^{N-1} p(y_k \mid x_k) Apr(b_k)$$

It should be noted that priori probability information $Apr(b_k)$ in Eq. (46) given above is defined by Eq. (47) as follows.

$$Apr(b_k) = P(b_k) \qquad (47)$$

Since a code x is generated univocally by an encoding process represented by an equation x=x(b) if an information bit b is determined, Eq. (46) given above is transformed as shown by the second and third lines. Symbol Σ in Eq. (46) denotes summation taken with respect to all sequences for which c={$c_0, c_1, \ldots, C_{N-1}$} is a code word and an information bit at a time j is $b_j$.

Since the fifth line of Eq. (46) is merely proportional to the posteriori probability information Apo($b_j$) as shown in Eq. (48) given below, it is necessary to eventually normalize the posteriori probability information Apo($b_j$) as shown in Eq. (49) as follows.

$$Apo(b_j) \propto \sum_{o \in CP_j} \prod_{k=0}^{N-1} p(y_k | x_k) Apr(b_k) \quad (48)$$

$$\sum_{b_i} Apo(b_j) = 1 \quad (49)$$

As described above, the MAP decoders 74 and 76 are capable of finding the posteriori probability information Apo($b_j$) by using the priori probability information Apr($b_k$) (=P($b_k$)) and the likelihood L(=p($y_k|x_k$)) of a reception symbol for a candidate for a transmission symbol. It should be noted that, if the communication line is an AWGN channel, for example, the likelihood L can be found by using Eq. (51) given below provided that the probability density function of the noise can be expressed by Eq. (50) as follows.

$$p_n(n) = \frac{1}{\sqrt{2\pi}\,\sigma_n} \exp\left[\frac{1}{2\sigma_n^2}|n|^2\right] \quad (50)$$

$$L = p(y_k | x_k) \propto \frac{1}{\sqrt{2\pi}\,\sigma_n} \exp\left[\frac{1}{2\sigma_n^2}|y_k - x_k|^2\right] \quad (51)$$

In the turbo decoder 70, the MAP decoder 74 outputs the difference between the posteriori probability information Apo($b_j$) and the priori probability information $Apr_0$ as the external information $Ext_0$ while the MAP decoder 76 outputs the difference between the posteriori probability information Apo($b_j$) and the priori probability information $Apr_1$ as the external information $Ext_1$.

When receiving the received value y, the turbo decoder 70 comprising the MAP decoders 74 and 76 described above carries out a repetitive decoding process repeatedly a predetermined plurality of times. The MAP decoder 76 then generates posteriori probability information P(b|y) for an information bit on the basis of the soft-output external information obtained as a result of this repetitive decoding process, and outputs the posteriori probability information P(b|y) as decoded data.

By the way, as described earlier, the reception apparatus 60 is provided with the decoders 62$_0$, 62$_1$ and 62$_2$ each serving as an improvement of the turbo decoder 70 described above. It should be noted that, in this case, in order to make the following explanation easy to describe, the decoder 62$_0$ for carrying out a turbo decoding process in its capacity as a counterpart of the converter 11$_j$ shown in FIG. 10 is explained first.

Figure 15:
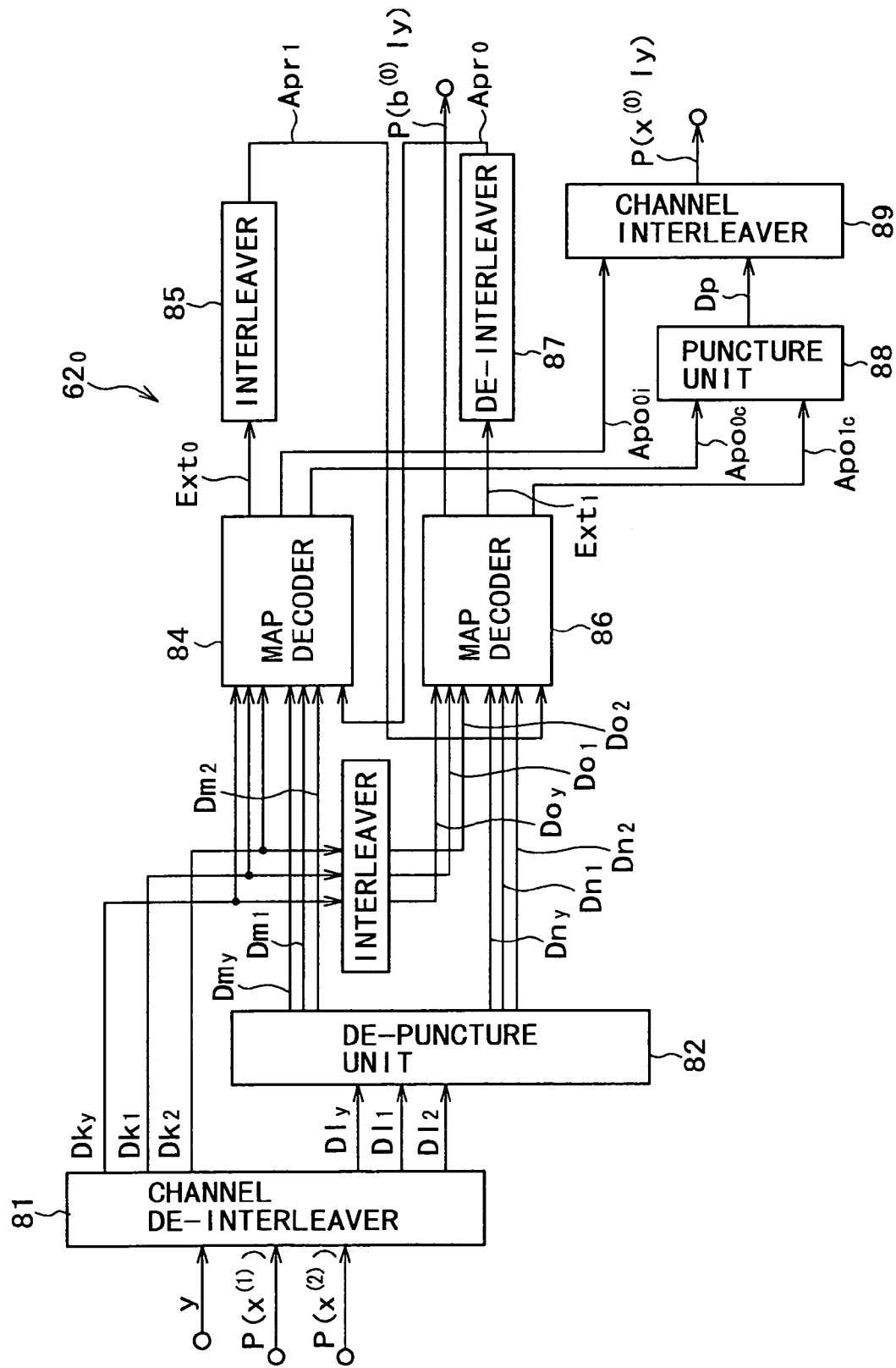
FIG. 15 is an explanatory block diagram showing a concrete configuration of a decoder employed in the same reception apparatus.

As shown in FIG. 15, the decoder 62$_0$ comprises a channel de-interleaver 81, a de-puncture unit 82, 2 interleavers 83 and 85, 2 MAP decoders 84 and 86, a de-interleaver 87, a puncture unit 88 and a channel interleaver 88. The channel de-interleaver 81 used for a channel restores pieces of input data to an original order. The de-puncture unit 82 restores discretely reduced data to the original data. The interleavers 83 and 85 each rearrange the order of pieces of input data. The MAP decoders 84 and 86 each carry out a MAP decoding process. The de-interleaver 87 restores pieces of input data to the original order. The puncture unit 88 carries out a proper discrete reduction process on input data. The channel interleaver 89 used for a channel rearranges the order of pieces of input data.

Much like the channel de-interleaver 71 employed in the turbo decoder 70 described above, the channel de-interleaver 81 is provided when the converter 11$_j$ described earlier includes the channel interleaver 24. The channel de-interleaver 81 inputs the received value y, priori probability information P($x^{(1)}$) for an encoded sequence $x^{(1)}$ and priori probability information P($x^{(2)}$) for an encoded sequence $x^{(2)}$. The channel de-interleaver 81 then de-interleaves the received value y, the priori probability information P($x^{(1)}$) and the priori probability information P($x^{(2)}$) to restore the bit array of the interleaved data De to the bit array of the original information-bit sequence $b^{(i)}$ and the bit array of the original puncture data Dd. The interleaved data De has been interleaved by the channel interleaver 24 employed in the converter 11$_j$. Sequences $Dk_y$, $Dk_1$ and $Dk_2$ are the de-interleaving process' results for respectively the information-bit sequence $b^{(i)}$, the priori probability information P($x^{(1)}$) and the priori probability information P($x^{(2)}$), which correspond to the information-bit sequence $b^{(1)}$. On the other hand, sequences $Dl_y$, $Dl_1$ and $Dl_2$ are the de-interleaving process' results for respectively the information-bit sequence $b^{(i)}$, the priori probability information P($x^{(1)}$) and the priori probability information P($x^{(2)}$), which correspond to the puncture data Dd. The channel de-interleaver 81 supplies the sequences $Dk_y$, $Dk_1$ and $Dk_2$ to the interleaver 83 and the MAP decoder 84, but supplies the sequences $Dl_y$, $Dl_1$ and $Dl_2$ to the de-puncture unit 82.

Much like the de-puncture unit 72 employed in the turbo decoder 70 described above, the de-puncture unit 82 restores the sequence $Dl_y$ received from the channel de-interleaver 81 by inserting data such as 0.0 into positions of bits discretely reduced by the puncture unit 23 employed in the converter 11$_j$ to generate a sequence $Dm_y$ for the received value y corresponding to the output data Da output by the element encoder 21$_0$ and generate a sequence $Dn_y$ for the received value y corresponding to the output data Dc output by the element encoder 21$_1$. In addition, the de-puncture unit 82 restores the sequences $Dl_1$ and $Dl_2$ received from the channel de-interleaver 81 by inserting data P($x^{(1)}$=1)=0.5 and P($x^{(1)}$=−1)=0.5 into positions of bits discretely reduced by the puncture unit 23 employed in the converter 11$_j$ to generate sequences $Dm_1$, $Dm_2$, $Dn_1$ and $Dn_2$. The 2 sequences $Dm_1$ and $Dm_2$ generated for the priori probability information P($x^{(1)}$) and the priori probability information P($x^{(2)}$) respectively correspond to the output data Da output by the element encoder 21$_0$. On the other hand, the 2 sequences $Dm_1$ and $Dm_2$ generated for the priori probability information P($x^{(1)}$) and the priori probability information P($x^{(2)}$) respectively correspond to the output data Dc output by the element encoder 21$_1$. The de-puncture unit 82 then outputs the sequences $Dm_y$, $Dm_1$ and $Dm_2$ generated thereby to the MAP decoder 84 but outputs the sequences $Dn_y$, $Dn_1$ and $Dn_2$ generated thereby to the MAP decoder 86.

Much like the interleaver 73 employed in the turbo decoder 70 described above, the interleaver 83 inputs the sequences $Dk_y$, $Dk_1$ and $Dk_2$ supplied by the channel de-interleaver 81, and interleaves the sequences $Dk_y$, $Dk_1$ and Dk$_2$ on the basis of the same information on permutation locations as the interleaver 22 employed in the converter 11$_j$. The interleaver 83 then supplies sequences Do$_y$, Do$_1$ and Do$_2$ obtained as a result of the interleaving process to the MAP decoder 86.

Much like the MAP decoder 74 employed in the turbo decoder 70 described above, the MAP decoder 84 is provided as a counterpart of the element encoder 21$_0$ employed in the converter 11$_j$. The MAP decoder 84 receives the soft-input sequences Dk$_y$, Dk$_1$ and Dk$_2$ corresponding to the information-bit sequence b$^{(i)}$ from the channel de-interleaver 81, the soft-input sequences Dm$_y$, Dm$_1$ and Dm$_2$ from the de-puncture unit 82 and priori probability information Apr$_0$ for a soft-input information bit from the de-interleaver 87. The MAP decoder 84 then carries out a MAP decoding process on the sequences Dk$_y$, Dk$_1$, Dk$_2$, Dm$_y$, Dm$_1$ and Dm$_2$ as well as the priori probability information Apr$_0$. Then, the MAP decoder 84 generates extrinsic information Ext$_0$ for an information-bit sequence to be found by using a code constraint condition and supplies this extrinsic information Ext$_0$ to the interleaver 85 as a soft-output. In addition, on the basis of soft-output external information generated as a result of a repetitive decoding process carried out a predetermined plurality of times, the MAP decoder 84 also generates posteriori probability information Apo$_{0i}$ for a soft-input information bit and posteriori probability information Apo$_{0c}$ for an encoded bit corresponding to the output data Da output by the element encoder 21$_0$ employed in the converter 11$_j$. The MAP decoder 84 then outputs the posteriori probability information Apo$_{0i}$ and the posteriori probability information Apo$_{0c}$ to the channel interleaver 89 and the puncture unit 88 respectively. It should be noted that, much like the MAP decoder 74 employed in the turbo decoder 70 described above, the MAP decoder 84 also finds a likelihood L except that the MAP decoder 84 finds a likelihood L by carrying out a process different from the MAP decoder 74. More information on this will be described later.

Much like the interleaver 75 employed in the turbo decoder 70 described above, the interleaver 85 interleaves the extrinsic information Ext$_0$ received from the MAP decoder 84 as a soft input corresponding to an information-bit sequence on the basis of the same information on permutation locations as the interleaver 22 employed in the converter 11$_j$. The interleaver 85 then supplies priori probability information Apr$_1$ for an information bit in the MAP decoder 86 as a result of the interleaving process to the MAP decoder 86.

Much like the MAP decoder 76 employed in the turbo decoder 70 described above, the MAP decoder 86 is provided as a counterpart of the element encoder 21$_1$ employed in the converter 11$_j$. The MAP decoder 86 receives the soft-input sequences Do$_y$, Do$_1$ and Do$_2$ corresponding to the information-bit sequence b$^{(i)}$ from the channel the inverter 83, the soft-input sequences Dn$_y$, Dn$_1$ and Dn$_2$ from the de-puncture unit 82 and the priori probability information Apr$_1$ for a soft-input information bit from the interleaver 85. The MAP decoder 84 then carries out a MAP decoding process on the sequences Do$_y$, Do$_1$, Do$_2$, Dn$_y$, Dn$_1$ and Dn$_2$ as well as the priori probability information Apr$_1$. Then, the MAP decoder 84 generates extrinsic information Ext$_1$ for an information bit to be found by using a code constraint condition and supplies this extrinsic information Ext$_1$ to the de-interleaver 87 as a soft-output. Furthermore, the MAP decoder 86 generates posteriori probability information P(b$^{(0)}$|y) for an information bit sequence b$^{(0)}$ on the basis of soft-output external information obtained as a result of a repetitive decoding process carried out repeatedly a predetermined plurality of times, and outputs the posteriori probability information P(b$^{(0)}$|y) to an external component as decoded data. In addition, on the basis of soft-output external information generated as a result of a repetitive decoding process carried out a predetermined plurality of times, the MAP decoder 86 also generates posteriori probability information Apo$_{1c}$ for an encoded bit corresponding to the data Dc output by the element encoder 21$_1$ employed in the converter 11$_j$. The MAP decoder 86 then outputs the posteriori probability information Apo$_{1c}$ to the puncture unit 88. It should be noted that, much like the MAP decoder 76 employed in the turbo decoder 70 described above, the MAP decoder 86 also finds a likelihood L except that the MAP decoder 86 finds a likelihood L by carrying out a process different from the MAP decoder 76. More information on this will be described later.

Much like the interleaver 77 employed in the turbo decoder 70 described above, the de-interleaver 87 de-interleaves the extrinsic information Ext$_1$ received from the MAP decoder 86 as a soft input so as to restore the bit array of the interleaved data Db interleaved by the interleaver 22 employed in the converter 11$_j$ to the bit array of the original information-bit sequence b$^{(i)}$. The de-interleaver 87 then supplies the priori probability information Apr$_0$ for an information bit in the MAP decoder 84 as a result of the interleaving process to the MAP decoder 84.

The puncture unit 88 receives the posteriori probability information Apo$_{0c}$ for an encoded bit from the MAP decoder 84 and the posteriori probability information Apo$_{1c}$ for an encoded bit from the MAP decoder 86, carrying out a discrete reduction process on the posteriori probability information Apo$_{0c}$ and the posteriori probability information Apo$_{1c}$ on the basis of the same rule as the puncture unit 23 employed in the converter 11$_j$. As a result of the discrete reduction process, the puncture unit 88 then outputs puncture data Dp with some bits thereof eliminated to the channel interleaver 89.

The channel interleaver 89 receives the puncture data Dp from the puncture unit 88 and the posteriori probability information Apo$_{0i}$ from the MAP decoder 84 with a timing delayed by a delay time equal in length to the processing time of the puncture unit 88, rearranging the order of bits composing the puncture data Dp and the posteriori probability information Apo$_{0i}$ on the basis of the same information on permutation locations as the channel interleaver 24 employed in the converter 11$_j$ to generate priori probability information P(x$^{(0)}$|y) for the encoded sequence x$^{(0)}$. The channel interleaver 89 finally outputs the priori probability information P(x$^{(0)}$|y) to an external component.

By the way, since the encoding process carried out by the transmission apparatus 10 outputs a sum of a plurality of encoded sequences, the decoder 62$_0$ described above is not capable of finding a likelihood value in a simple manner as indicated by Eq. (51) given before. In order to solve this problem, the MAP decoders 84 and 86 employed in the decoder 62$_0$ find a likelihood value as follows.

Let symbol L$_k^{(0)}$(+1) denotes the likelihood that the time-axis kth constituent of a received sequence for an encoded sequence x$^{(0)}$ is "1" and symbol L$_k^{(0)}$(−1) denotes the likelihood that the time-axis kth constituent of a received sequence for an encoded sequence x$^{(0)}$ is "−1". Also assume that probabilities for other encoded sequences x$^{(1)}$ and x$^{(2)}$ have been obtained. In this case, the likelihood L$_k^{(0)}$(+1) and the likelihood L$_k^{(0)}$(−1) are expressed by Eqs. (52) and (53) given below. It should be noted that the likelihood L$_k^{(0)}$(+1)

and the likelihood $L_k^{(0)}(-1)$ are each normalized so that, eventually, their sum becomes equal to 1.

$$L_k^{(0)}(+1) = p(y_k \mid x_k^{(0)} = +1) \propto P(x_k^{(1)} = +1)P(x_k^{(2)} = +1) \quad (52)$$
$$\frac{1}{\sqrt{2\pi}\,\sigma_n} \exp\left[\frac{-1}{2\sigma_n^2}|y_k - (a^{(0)}(+1) + a^{(1)}(+1) + a^{(2)}(+1))|^2\right] +$$
$$P(x_k^{(1)} = -1)P(x_k^{(2)} = +1)\frac{1}{\sqrt{2\pi}\,\sigma_n}$$
$$\exp\left[\frac{-1}{2\sigma_n^2}|y_k - (a^{(0)}(+1) + a^{(1)}(-1) + a^{(2)}(+1))|^2\right] +$$
$$P(x_k^{(1)} = +1)P(x_k^{(2)} = -1)\frac{1}{\sqrt{2\pi}\,\sigma_n}$$
$$\exp\left[\frac{-1}{2\sigma_n^2}|y_k - (a^{(0)}(+1) + a^{(1)}(+1) + a^{(2)}(-1))|^2\right] +$$
$$P(x_k^{(1)} = -1)P(x_k^{(2)} = -1)\frac{1}{\sqrt{2\pi}\,\sigma_n}$$
$$\exp\left[\frac{-1}{2\sigma_n^2}|y_k - (a^{(0)}(+1) + a^{(1)}(-1) + a^{(2)}(-1))|^2\right]$$

$$L_k^{(0)}(-1) = p(y_k \mid x_k^{(0)} = -1) \propto P(x_k^{(1)} = +1)P(x_k^{(2)} = +1) \quad (53)$$
$$\frac{1}{\sqrt{2\pi}\,\sigma_n} \exp\left[\frac{-1}{2\sigma_n^2}|y_k - (a^{(0)}(-1) + a^{(1)}(+1) + a^{(2)}(+1))|^2\right] +$$
$$P(x_k^{(1)} = -1)P(x_k^{(2)} = +1)\frac{1}{\sqrt{2\pi}\,\sigma_n}$$
$$\exp\left[\frac{-1}{2\sigma_n^2}|y_k - (a^{(0)}(-1) + a^{(1)}(-1) + a^{(2)}(+1))|^2\right] +$$
$$P(x_k^{(1)} = +1)P(x_k^{(2)} = -1)\frac{1}{\sqrt{2\pi}\,\sigma_n}$$
$$\exp\left[\frac{-1}{2\sigma_n^2}|y_k - (a^{(0)}(-1) + a^{(1)}(+1) + a^{(2)}(-1))|^2\right] +$$
$$P(x_k^{(1)} = -1)P(x_k^{(2)} = -1)\frac{1}{\sqrt{2\pi}\,\sigma_n}$$
$$\exp\left[\frac{-1}{2\sigma_n^2}|y_k - (a^{(0)}(-1) + a^{(1)}(-1) + a^{(2)}(-1))|^2\right]$$

That is to say, the likelihood $L_k^{(0)}(+1)$ and the likelihood $L_k^{(0)}(-1)$ are each found by first finding a degree of likelihood with receive symbols compared for each of all possible candidates for transmit symbols and then adding the degrees of likelihood, which are each weighted by a probability of the transmit symbol's being transmitted. In this case, the probability of a transmit symbol's being transmitted can be found by multiplying probabilities, which are each a probability that a constituent of the encoded sequence $x^{(0)}$ is transmitted. In the case of a code decoded before, its probability is used. In the case of a code not decoded before, on the other hand, a value representing an unknown probability is reflected.

It should be noted that, in the case of a transmission through a communication line with variations in amplitude existing, the likelihood $L_k^{(0)}(+1)$ and the likelihood $L_k^{(0)}(-1)$ can be found by using by Eqs. (54) and (55) given below. It is worth noting that symbol $f_k$ used in Eqs. (54) and (55) denotes the amplitude of a kth constituent on the communication line.

$$L_k^{(0)}(+1) = p(y_k \mid x_k^{(0)} = +1) \propto P(x_k^{(1)} = +1)P(x_k^{(2)} = +1)\frac{1}{\sqrt{2\pi}\,\sigma_n} \quad (54)$$
$$\exp\left[\frac{-1}{2\sigma_n^2}|y_k - f_k \cdot (a^{(0)}(+1) + a^{(1)}(+1) + a^{(2)}(+1))|^2\right] +$$
$$P(x_k^{(1)} = -1)P(x_k^{(2)} = +1)\frac{1}{\sqrt{2\pi}\,\sigma_n}$$
$$\exp\left[\frac{-1}{2\sigma_n^2}|y_k - f_k \cdot (a^{(0)}(+1) + a^{(1)}(-1) + a^{(2)}(+1))|^2\right] +$$
$$P(x_k^{(1)} = +1)P(x_k^{(2)} = -1)\frac{1}{\sqrt{2\pi}\,\sigma_n}$$
$$\exp\left[\frac{-1}{2\sigma_n^2}|y_k - f_k \cdot (a^{(0)}(+1) + a^{(1)}(+1) + a^{(2)}(-1))|^2\right] +$$
$$P(x_k^{(1)} = -1)P(x_k^{(2)} = -1)\frac{1}{\sqrt{2\pi}\,\sigma_n}\exp\left[\frac{-1}{2\sigma_n^2}\right.$$
$$\left.|y_k - f_k \cdot (a^{(0)}(+1) + a^{(1)}(-1) + a^{(2)}(-1))|^2\right]$$

$$L_k^{(0)}(-1) = p(y_k \mid x_k^{(0)} = -1) \propto P(x_k^{(1)} = +1)P(x_k^{(2)} = +1)\frac{1}{\sqrt{2\pi}\,\sigma_n} \quad (55)$$
$$\exp\left[\frac{-1}{2\sigma_n^2}|y_k - f_k \cdot (a^{(0)}(-1) + a^{(1)}(+1) + a^{(2)}(+1))|^2\right] +$$
$$P(x_k^{(1)} = -1)P(x_k^{(2)} = +1)\frac{1}{\sqrt{2\pi}\,\sigma_n}$$
$$\exp\left[\frac{-1}{2\sigma_n^2}|y_k - f_k \cdot (a^{(0)}(-1) + a^{(1)}(-1) + a^{(2)}(+1))|^2\right] +$$
$$P(x_k^{(1)} = +1)P(x_k^{(2)} = -1)\frac{1}{\sqrt{2\pi}\,\sigma_n}$$
$$\exp\left[\frac{-1}{2\sigma_n^2}|y_k - f_k \cdot (a^{(0)}(-1) + a^{(1)}(+1) + a^{(2)}(-1))|^2\right] +$$
$$P(x_k^{(1)} = -1)P(x_k^{(2)} = -1)\frac{1}{\sqrt{2\pi}\,\sigma_n}\exp\left[\frac{-1}{2\sigma_n^2}\right.$$
$$\left.|y_k - f_k \cdot (a^{(0)}(-1) + a^{(1)}(-1) + a^{(2)}(-1))|^2\right]$$

The MAP decoders 84 and 86 employed in the decoder 62$_0$ find posteriori probability information by using the likelihood $L_k^{(0)}(+1)$ and the likelihood $L_k^{(0)}(-1)$ computed in the way described above.

By providing the decoder 62$_0$ with the MAP decoders 84 and 86 serving as counterparts of respectively the element encoders 21$_0$ and 21$_1$ employed in the converter 11$_j$, the decoder 62$_0$ including the MAP decoders 84 and 86 is capable of improving characteristics from time to time due to interactions between the MAP decoders 84 and 86 by decomposition of code with a high degree of decoding complexity into elements each having a low degree of complexity. When the decoder 62$_0$ receives the received value y, the decoder 62$_0$ carries out a repetitive decoding process repeatedly a predetermined plurality of times and, on the basis of external information of a soft-output obtained as a result of this decoding process, the decoder 62$_0$ generates the posteriori probability information $P(b^{(0)}|y)$ for the information-bit sequence $b^{(0)}$ from the MAP decoder 86 as decoded data and, if necessary, outputs the posteriori probability information $P(x^{(0)}|y)$ for the encoded sequence $x^{(0)}$ to the other decoders 62$_1$ and 62$_2$.

In the reception apparatus 60, the decoders 62$_1$ and 62$_2$ each have the same configuration as the decoder 62$_0$. That is to say, by using the likelihood $L_k^{(1)}(+1)$ and the likelihood $L_k^{(1)}(-1)$, which are found in accordance with Eqs. (52), (53), (54) and (55), the decoder $62_1$ generates the posteriori probability information $P(b^{(1)}|y)$ for the information-bit sequence $b^{(1)}$ and the posteriori probability information $P(x^{(1)}|y)$ for the encoded sequence $x^{(1)}$. The decoder $62_1$ then outputs the posteriori probability information $P(b^{(1)}|y)$ as decoded data and, if necessary, supplies the posteriori probability information $P(x^{(1)}|y)$ to the decoders $62_0$ and $62_2$. By the same token, by using the likelihood $L_k^{(2)}(+1)$ and the likelihood $L_k^{(2)}(-1)$, which are found in accordance with Eqs. (52), (53), (54) and (55), the decoder $62_2$ generates the posteriori probability information $P(b^{(2)}|y)$ for the information-bit sequence $b^{(2)}$ and the posteriori probability information $P(x^{(2)}|y)$ for the encoded sequence $x^{(2)}$. The decoder $62_2$ then outputs the posteriori probability information $P(b^{(2)}|y)$ as decoded data and, if necessary, supplies the posteriori probability information $P(x^{(2)}|y)$ to the decoders $62_0$ and $62_1$.

As described above, by sequentially finding the pieces of posteriori probability information $P(b^{(2)}|y)$, posteriori probability information $P(b^{(1)}|y)$ and posteriori probability information $P(b^{(0)}|y)$ for the information-bit sequences $b^{(2)}$, $b^{(1)}$ and $b^{(0)}$ respectively, the reception apparatus 60 employing the decoders $62_0$, $62_1$ and $62_2$ is capable of carrying out decoding processes to generate the information-bit sequences $b^{(2)}$, $b^{(1)}$ and $b^{(0)}$ in an order the information-bit sequences $b^{(2)}$, $b^{(1)}$ and $b^{(0)}$ are enumerated here.

In addition, the reception apparatus 60 does not carry out a decoding process only once sequentially to generate information-bit sequences starting with the information-bit sequence $b^{(2)}$. Instead, the reception apparatus 60 is capable of performing the zigzag decoding process or the repetitive decoding process as described above.

To put it concretely, as described above, the reception apparatus 60 basically carries out A, B and C in an order A, B and C are enumerated, where A, B and C denote the decoding processes carried out by the decoders $62_0$, $62_1$ and $62_2$ respectively. Upon completion of A and B, A can also be carried out again by supplying the posteriori probability information $P(x^{(1)}|y)$ obtained for the encoded sequence $x^{(1)}$ to the decoder $62_2$ as priori probability information $P(x^{(1)})$ for the encoded sequence $x^{(1)}$. In this way, the reception apparatus 60 is capable of improving the reliability of the decoding process of the encoded sequence $x^{(2)}$. Thus, the reception apparatus 60 is also capable of improving the reliabilities of the decoding processes of the lower-order encoded sequences $x^{(1)}$ and $x^{(0)}$. By the same token, upon completion of A, B and C, B can also be carried out again by supplying the posteriori probability information $P(x^{(0)}|y)$ obtained for the encoded sequence $x^{(0)}$ to the decoder $62_1$ as priori probability information $P(x^{(0)})$ for the encoded sequence $x^{(0)}$. In this way, the reception apparatus 60 is capable of improving the reliability of the decoding process of the encoded sequence $x^{(1)}$ That is to say, the reception apparatus 60 is capable of carrying out the decoding processes in the following order: A, B, A, B, C, B and C.

As an alternative, upon completion of decoding processes A, B and C, the reception apparatus 60 may carry out these decoding processes repeatedly a plurality of times in the following order: A, B, C, A, B, C and so on. As another alternative, upon completion of decoding processes A, B, A, B, C, B and C, the reception apparatus 60 may carry out these decoding processes repeatedly a plurality of times in the following order: A, B, A, B, C, B, C, A, B, A, B, C, B, C and so on.

As described above, the reception apparatus 60 does not carry out a decoding process only once sequentially to generate information-bit sequences starting with the information-bit sequence $b^{(2)}$. Instead, the reception apparatus 60 is capable of performing the zigzag decoding process or the repetitive decoding process on the basis of a predetermined rule.

By adopting methods described below in the process carried out by the reception apparatus 60 to find a likelihood value, the process can be made simple.

In the first place, in accordance with a first method, if an encoded sequence for which the decoding process has been completed exists, a constituent $x_k^{(1)}$ maximizing the posteriori probability information $P(x_k^{(1)})$ for the kth constituent is selected as the best candidate as shown in Eq. (56) given below. Then, the best candidate is used as priori probability information $X_{k.best}^{(1)}$ in finding a likelihood value for another encoded sequence. That is to say, in accordance with the first method, for an encoded sequence for which the decoding process has been completed, a hard decision is made.

$$x_{k.best}^{(l)} = \max_{x_k^{(l)}} [P(x_k^{(l)})] \qquad (56)$$

For example, when A and C of decoding processes A, B and C carried out by the aforementioned decoders $62_0$, $62_1$ and $62_2$ respectively are completed, the decoder $62_1$ finds the likelihood of the constituent $x_k^{(1)}$ in accordance with Eq. (57) given below. If the decoder $62_1$ regards the priori probability information for the best candidate in the encoded sequences $x^{(0)}$ and $x^{(2)}$, for which the decoding processes have been completed, as information having a value of 1 and the priori probability information for other constituents as information having a value of 0, Eqs. (52) and (53) given before can be simplified.

$$p(y_k | x_k^{(l)}) \propto \frac{1}{\sqrt{2\pi}\,\sigma_n} \exp\left[\frac{-1}{2\sigma_n^2} |y_k - (a^{(0)} x_{k.best}^{(0)} + a^{(1)} x_k^{(1)} + a^{(2)} x_{k.best}^{(2)})|^2\right] \qquad (57)$$

In the second place, in accordance with a second method, if an encoded sequence for which the decoding process has been completed exists, an expected value for a kth constituent, for which a hard decision has been made, is found as posteriori probability information as shown in Eq. (57) given below. Then, the posteriori probability information is used as priori probability information $x_{k.exp}^{(1)}$ in finding a likelihood value for another encoded sequence.

$$x_{k.exp}^{(l)} = \sum_{x_k^{(l)}} P(x_k^{(l)}) x_k^{(l)} \qquad (58)$$

For example, when A and C of decoding processes A, B and C carried out by the aforementioned decoders $62_0$, $62_1$ and $62_2$ respectively are completed, the decoder $62_1$ finds the likelihood of the constituent $x_k^{(1)}$ in accordance with Eq. (59) given below. In this way, Eqs. (52) and (53) given before can be simplified.

$$p(y_k \mid x_k^{(1)}) \propto \qquad (59)$$

$$\frac{1}{\sqrt{2\pi}\sigma_n} \exp\left[\frac{-1}{2\sigma_n^2} |y_k - (a^{(0)} x_{k-exp}^{(0)} + a^{(1)} x_k^{(1)} + a^{(2)} x_{k-exp}^{(2)})|^2\right]$$

In the third place, in accordance with a third method, if an attempt is made to decode an encoded sequence and other encoded sequences have not been encoded, the other encoded sequences are regarded as Gaussian noises having equal electric power.

For example, if the decoder $62_2$ computes the likelihood of the constituent $x_k^{(2)}$ in accordance with Eq. (60) given below in decoding process C of the decoder $62_2$, Eqs. (52) and (53) given earlier can be simplified. It should be noted that, in this case, if encoded sequences for which the decoding process has been completed exist, the first or second methods can be applied to these encoded sequences.

$$p(y_k \mid x_k^{(2)}) \propto \qquad (60)$$

$$\frac{1}{\sqrt{2\pi(\sigma_n^2 + a^{(1)2} + a^{(0)2})}} \exp\left[\frac{-1}{2(\sigma_n^2 + a^{(1)2} + a^{(0)2})} |y_k - a^{(2)} x_k^{(2)}|^2\right]$$

By the way, if a gain or a loss exists on the communication line involved in a decoding process, the reception apparatus 60 needs to grasp the value of the gain or the loss. A method of estimating a gain or a loss on a communication line is explained as follows.

Normally, a gain or a loss of a communication line is estimated by using a pilot signal provided separately from encoded sequences. With this method, however, the use of numerous pilot signals entails undesirable consumption of large energy for transmitting the signals.

Figure 16:
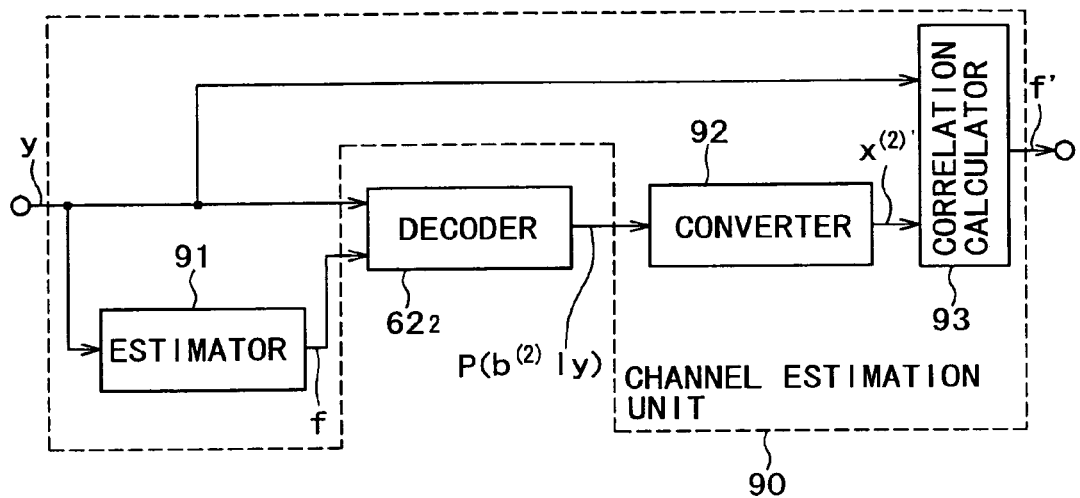
FIG. 16 is an explanatory block diagram showing a configuration of a channel estimation unit employed in the same reception apparatus or, to put it in detail, an explanatory block diagram showing the configuration of a channel estimation unit for finding a hard-decision-value sequence through the use of posteriori probability information for an information-bit sequence.

In order to solve this problem, a channel estimation unit 90 is provided for at least the decoder $62_2$ as shown in FIG. 16 for making the reception apparatus 60 capable of estimating a gain or a loss of the communication line.

The decoder $62_2$ employed in the reception apparatus 60 decodes the encoded sequence $x^{(2)}$ having a largest amplitude after an estimation process of an amplitude f sufficiently accurate for the decoding process of the encoded sequence $x^{(2)}$ The estimation process is carried out by an estimator 91 by adoption of a method such as a technique of using a pilot signal or a technique of determining the magnitude of the received value y. Then, upon completion of the decoding process of the encoded sequence $x^{(2)}$, the reception apparatus 60 finds a hard-decision-value sequence $x^{(2)}$, which is an estimated value of the encoded sequence $x^{(2)}$, through execution of a re-encoding process g in a converter 92 by using posteriori probability information $p(b^{(2)}|y)$ for an information-bit sequence $b^{(2)}$ obtained as a result of the decoding process as shown by Eqs. (61) and (62) as follows:

$$b^{(2)'} = \max_b [p(b^{(2)}|y)] \qquad (61)$$

$$x^{(2)'} = g(b^{(2)'}) \qquad (62)$$

Then, a correlation calculator 93 employed in the reception apparatus 60 finds a correlation between the hard-decision-value $x^{(2)'}$ and the received value y. The received value y is expressed by Eq. (63) given below where symbol f denotes the amplitude of the communication line. If the hard-decision-value $x^{(2)'}$ does not include an error, a correlation f' can be found in accordance with Eq. (64) given below. It is to be noted that symbol "." used in Eq. (64) denotes an operation to produce an inner product. A denominator in Eq. (64) is used for normalizing the magnitude. In addition, since the encoded sequence $x^{(2)}$ is an M-dimensional vector, $|x^{(2)}|^2$ can be replaced by M.

$$y = f(a^{(0)} x^{(0)} + a^{(1)} x^{(1)} + a^{(2)} x^{(2)}) + n \qquad (63)$$

$$\begin{aligned} f' &= \frac{y \cdot x^{(2)}}{a^{(2)} |x^{(2)}|^2} = \frac{f \cdot a^{(0)} x^{(0)} \cdot x^{(2)} + f \cdot a^{(1)} x^{(1)} \cdot x^{(2)} + f \cdot a^{(2)} x^{(2)} \cdot x^{(2)} + n x^{(1)}}{a^{(2)} M} \\ &= \frac{f \cdot a^{(0)} x^{(0)} \cdot x^{(2)} + f \cdot a^{(1)} x^{(1)} \cdot x^{(2)} + f \cdot a^{(2)} M + n x^{(2)}}{a^{(2)} M} \\ &= f + \frac{f \cdot a^{(0)} x^{(0)} \cdot x^{(2)} + f \cdot a^{(1)} x^{(1)} \cdot x^{(2)} + n x^{(2)}}{a^{(2)} M} \\ &\to f (M \to \infty) \end{aligned} \qquad (64)$$

That is to say, since the encoded sequences $x^{(0)}$ and $x^{(2)}$ are independent of the encoded sequence $x^{(2)}$, by setting M in the correlation value f' found by using Eq. (64) at a large value, the reception apparatus 60 is capable of estimating the amplitude f of the communication line with a high degree of accuracy.

Figure 17:
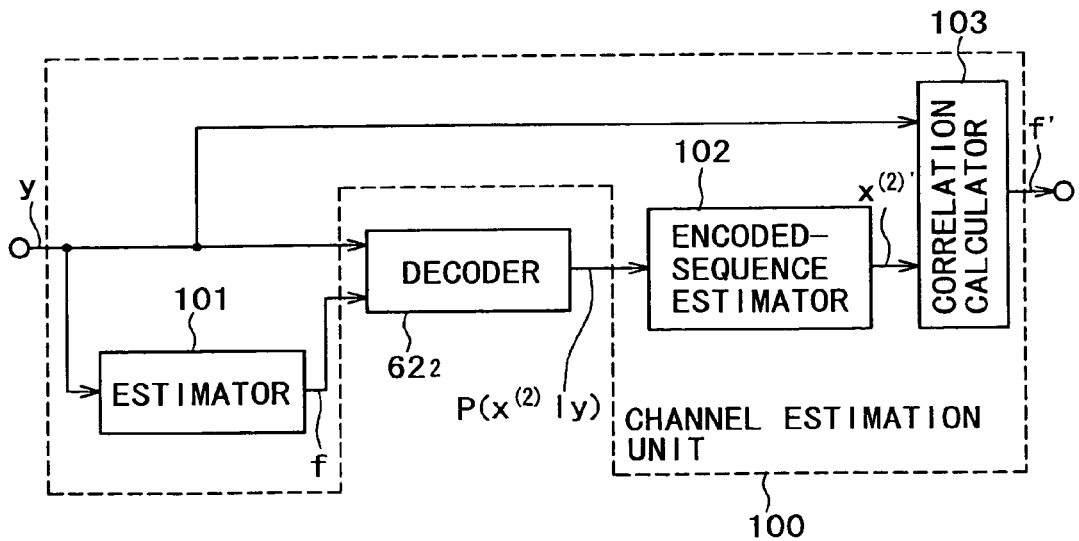
FIG. 17 is an explanatory block diagram showing another configuration of a channel estimation unit employed in the same reception apparatus or, to put it in detail, an explanatory block diagram showing the configuration of a channel estimation unit for finding a hard-decision-value sequence through the use of posteriori probability information for an information-bit sequence.

In addition, since a channel estimation unit 100 is employed in at least the decoder $62_2$ as shown in FIG. 17, the reception apparatus 60 is capable of estimating the communication line.

That is to say, the decoder $62_2$ employed in the reception apparatus 60 decodes the encoded sequence $x^{(2)}$ having a largest amplitude after an estimation process of an amplitude f sufficiently accurate for the decoding process of the encoded sequence $x^{(2)}$ Much like the channel estimation unit 90, the estimation process is carried out by an estimator 101 by adoption of a method such as a technique of using a pilot signal or a technique of determining the magnitude of the received value y. Then, upon completion of the decoding process of the encoded sequence $x^{(2)}$, an encoded-sequence estimator 102 employed in the reception apparatus 60 finds a hard-decision-value sequence $x^{(2)}$, which is an estimated value of the encoded sequence $x^{(2)}$, by using posteriori probability information $p(x^{(2)}|y)$ for the encoded sequence $x^{(2)}$ as shown by Eq. (65) as follows:

$$x^{(2)'} = \max [p(x^{(2)}|y)] \qquad (65)$$

Then, much like the channel estimation unit 90, a correlation calculator 103 employed in the reception apparatus 60 finds a correlation between the hard-decision-value sequence $x^{(2)}$ and the received value y. As a result, the reception apparatus 60 is capable of estimating the amplitude f of the communication line with a high degree of accuracy.

By using the amplitude f estimated as described above, the decoders 62$_1$ and 62$_0$ employed in the reception apparatus 60 decode the encoded sequences $x^{(1)}$ and $x^{(0)}$ respectively. In addition, the decoder 62$_2$ employed in the reception apparatus 60 may again decode the encoded $x^{(2)}$ by using the estimated amplitude f.

The data transmission and reception system comprising the transmission apparatus 10 for carrying out encoding processes described earlier and the reception apparatus 60 for carrying out decoding processes explained above is capable of setting the constant $a^{(1)}$ adaptively to changes in communication-line state as follows. In a mobile communication, for example, a channel model varies in accordance with the movement speed of the moving body. In a stationary state, the channel model is a static channel. In the state of a high-speed movement, on the other hand, the channel model is a Rayleigh channel. In a such case, the transmission apparatus 10 had rather change the constant $a^{(1)}$ in accordance with the communication line to give a good characteristic. By the constant $a^{(1)}$, which is a parameter of the encoding process, the amplitude of the encoded sequence $x^{(1)}$ is meant.

When the channel model of the data transmission and reception system varies, a state of the communication line is discriminated and a parameter $a^{(1)}$ optimum for the communication line is found. Then, an encoding process is carried out in accordance with the constant $a^{(1)}$.

As an adaptive encoding method, there is conceived an encoding technique whereby the reception apparatus identifies a state of the communication line, feeding the state of the communication line back to the transmission apparatus as feedback information in the so-called duplex communication, and the transmission apparatus adaptively implements the encoding technique based on the feedback information.

Figure 18:
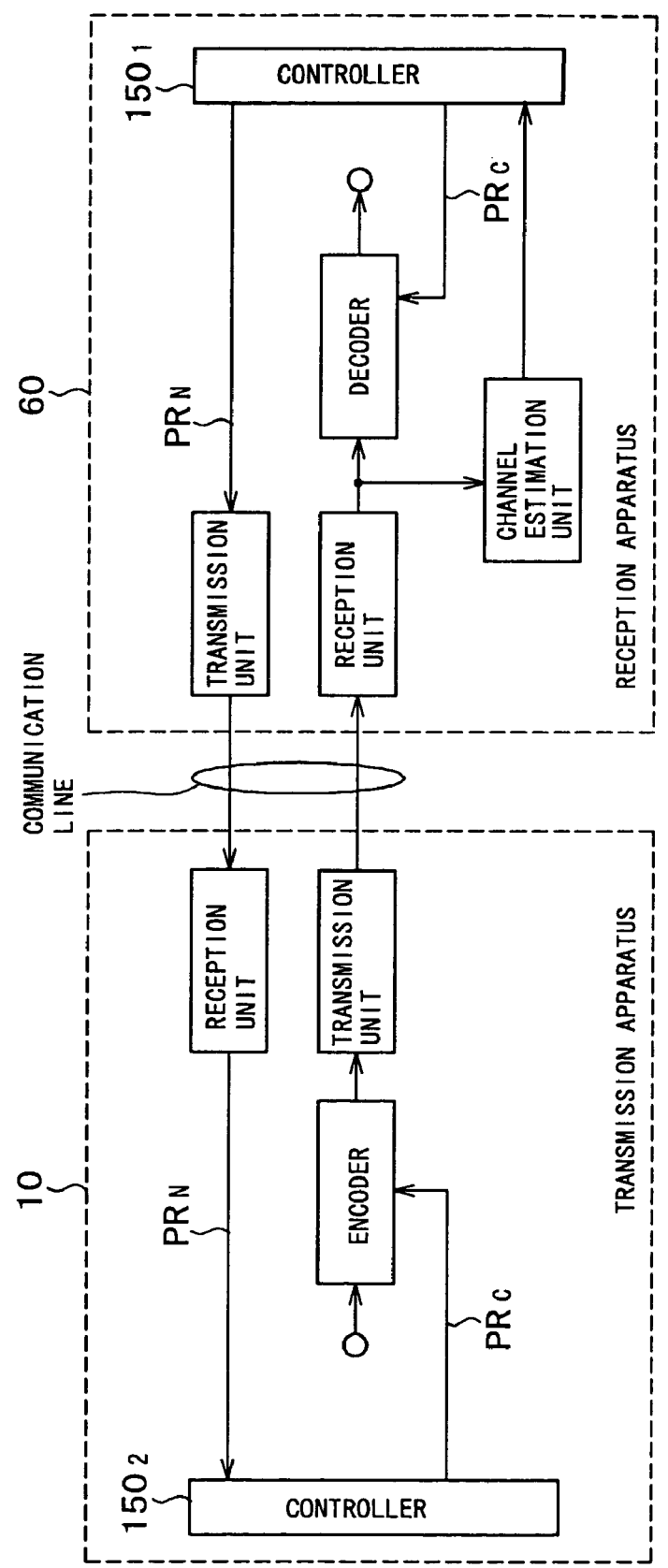
FIG. 18 is an explanatory block diagram showing a configuration of a data transmission and reception system, in which the reception apparatus identifies a state of a communication line as a part of an adaptive encoding process, in a plain and simple manner.

To put it concretely, in the reception apparatus 60 of a typical data transmission and reception system, the outline of which is shown in FIG. 18, a channel estimation unit 150$_1$ determines a constant $a^{(1)}$, which is a parameter of the encoding process, on the basis of the discriminated state. In the reception apparatus 60 of the data transmission and reception system, the determined constant $a^{(1)}$ is used in a decoding process carried out by a decoder as a parameter PRc of the current time. The determined constant $a^{(1)}$ is also transmitted to the transmission apparatus as a parameter PR$_N$ of a next time. It is to be noted that the decoder employed in the reception apparatus 60 corresponds to the decoders 62$_0$, 62$_1$ and 62$_2$ described earlier.

Then, when the transmission apparatus 10 of the data transmission and reception system receives the parameter PR$_N$ of a next time from the reception apparatus 60, in the transmission apparatus 10, the parameter PR$_N$ of a next time is passed on to an encoder as a parameter PR$_C$ of the current time by way of a controller 150$_2$. The encoder then carries out an encoding process by using the parameter PR$_C$ of the current time, and transmits a result of the encoding process to the reception apparatus 60 by way of the communication line. It is to be noted that the encoder employed in the transmission apparatus 10 corresponds to the converters 11$_0$, 11$_1$ and 11$_2$, the multipliers 12$_0$, 12$_1$ and 12$_2$ as well as the adders 13$_0$ and 13$_1$, which have been described earlier.

As described above, when a duplex communication is carried out in the data transmission and reception system, the reception apparatus identifies a state of the communication line, feeding the state of the communication line back to the transmission apparatus as feedback information, and the transmission apparatus carries out an encoding process based on the feedback information in an adaptive manner, making it possible to improve the characteristic.

In addition, as an adaptive encoding technique, there is also conceived a method whereby the transmission apparatus identifies a state of a communication line being used for reception, and assumes that the state of a communication line for transmission is the same as the state of the communication line being used for reception, adaptively carrying out an encoding process based on information on the state of the communication line being used for reception.

Figure 19:
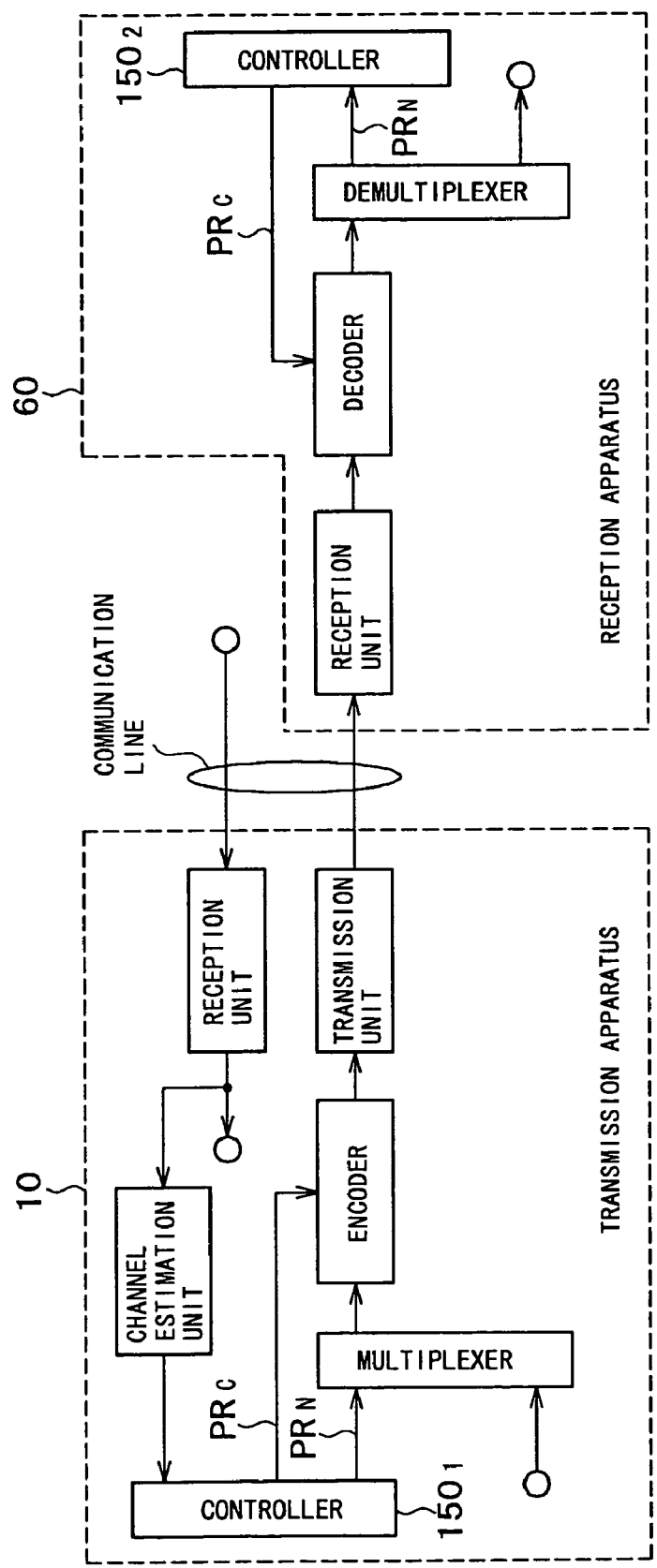
FIG. 19 is an explanatory block diagram showing a configuration of a data transmission and reception system, in which the reception apparatus identifies a state of a communication line as a part of an adaptive encoding process, in a plain and simple manner or, to put it in detail, an explanatory block diagram showing a configuration of a data transmission and reception system, which gives an advance notice of an encoding-parameter change, in a plain and simple manner.

To put it concretely, in order to give an advance notice of a parameter change as a part of an operation to change an encoding parameter in the data transmission and reception system, the transmission apparatus 10, which is provided with a channel estimation unit and a controller 150$_1$ as shown by an outline of a typical configuration of the data transmission and reception system in FIG. 19, identifies a communication line's state to be used by the controller 150$_2$ as a base for determining the encoding parameter, that is, the constant $a^{(1)}$. Then, in the data transmission and reception system, the determined constant $a^{(1)}$ is multiplexed by a multiplexer in an information-bit sequence as a parameter PR$_N$ of the next time and, furthermore, the constant $a^{(1)}$ received from the controller 150$_1$ is used as a parameter PR$_C$ of the current time in an encoding process carried out by an encoder on the multiplexed data generated by the multiplexer prior to a transmission of data obtained as a result of the encoding process. It is to be noted that the encoder employed in the transmission apparatus 10 corresponds to the converters 11$_0$, 11$_1$ and 11$_2$, the multipliers 12$_0$, 12$_1$ and 12$_2$ as well as the adders 13$_0$ and 13$_1$, which have been described earlier.

Then, when the reception apparatus 60 of the data transmission and reception system receives the data transmitted by the transmission apparatus 10 through the communication line, a decoder employed in the reception apparatus 60 decodes the data. In this case, the reception apparatus 60 of the data transmission and reception system carries out the encoding process by using a parameter PR$_C$ output by a controller 150$_2$. A demultiplexer employed in the reception apparatus 60 of the data transmission and reception system separates the parameter PR$_N$ multiplexed by the transmission apparatus 10 from data obtained as a result of the decoding process, and supplies the separated parameter PR$_N$ to the controller 150$_2$, which then makes a parameter change. In decoding processes carried out in the data transmission and reception system starting from the next time, the new parameter PR$_N$ is used as the parameter PR$_C$ of the current time. It is to be noted that the decoder employed in the reception apparatus 60 corresponds to the decoders 62$_0$, 62$_1$ and 62$_2$ described earlier.

As described above, the transmission apparatus in the data transmission and reception system identifies a state of a communication line being used for reception, and assumes that the state of a communication line for transmission is the same as the state of the communication line being used for reception, adaptively carrying out an encoding process based on information on the state of the communication line being used for reception, so that the processing load of the reception apparatus can be reduced.

It is to be noted that, as the adaptive encoding process, an advance notice of a parameter change is given. This is because it is necessary to inform the reception apparatus in advance of a parameter to be used in processing to decode data at the next time in the adaptive encoding process. In the data transmission and reception system, nevertheless, it is also possible to include a parameter of the present time in data of the present time as follows.

Figure 20:
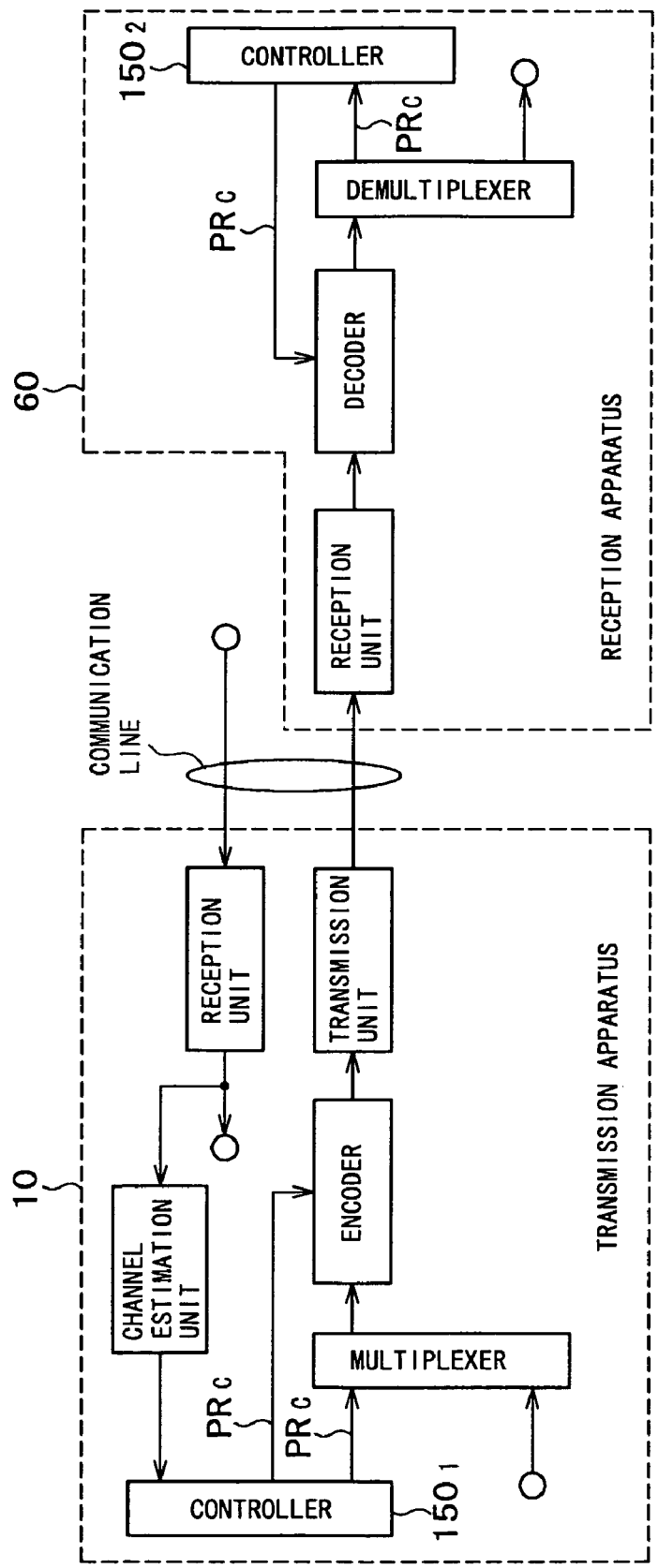
FIG. 20 is an explanatory block diagram showing a configuration of a data transmission and reception system, in which the transmission apparatus identifies a state of a communication line as a part of an adaptive encoding process, in a plain and simple manner or, to put it in detail, an explanatory block diagram showing a configuration of a data transmission and reception system, in which the transmission apparatus includes an encoding parameter of the current time in data of the current time and transmits the current-time data including the current-time encoding parameter to the reception apparatus, in a plain and simple manner.

To put it concretely, a data transmission and reception system can be configured in the same way as the data transmission and reception system shown in FIG. 19 as is shown in a typical configuration outline of FIG. 20. In this case, the reception apparatus 60 needs to decode data in which a parameter is multiplexed. Pay attention to the fact that, in this case, the decoding process can be carried out with the highest-order encoded sequence relatively not affected by a power ratio of a low-order encoded sequence.

In the data transmission and reception system, the transmission apparatus 10 provided with a channel estimation unit and a controller $150_1$ identifies a state of a communication to be used by the controller $150_1$ as a base for determining the encoding parameter, that is, the constant $a^{(1)}$. Then, the determined constant $a^{(1)}$ is multiplexed by a multiplexer in the highest-order information-bit sequence as a parameter $PR_C$ of the current time and, furthermore, the constant $a^{(1)}$ received from the controller $150_1$ is used as a parameter $PR_C$ of the current time in an encoding process carried out by an encoder on the multiplexed data generated by the multiplexer prior to a transmission of data obtained as a result of the encoding process.

Then, when the reception apparatus 60 of the data transmission and reception system receives the data transmitted by the transmission apparatus 10 through the communication line, a decoder employed in the reception apparatus 60 decodes the highest-order encoded sequence. In this case, the reception apparatus 60 of the data transmission and reception system decodes the data, starting with the highest-order encoded sequence by using a predetermined parameter $PR_C$ output by a controller $150_2$. A demultiplexer employed in the reception apparatus 60 of the data transmission and reception system separates the parameter $PR_C$ multiplexed by the transmission apparatus 10 from data obtained as a result of the decoding process, and supplies the separated parameter $PR_C$ to the controller $150_2$, which then makes a parameter change Thus, it is possible to carry out a process to decode an encoded sequence of an order lower than the highest-order encoded sequence by using the new parameter $PR_C$.

As described above, the transmission apparatus in the data transmission and reception system identifies a state of a communication line being used for reception, and assumes that the state of a communication line for transmission is the same as the state of the communication line being used for reception and, in an encoding process carried out by the reception apparatus on the basis of information on the state of the communication line being used for reception, the parameter of the current time can be included in the highest-order encoded sequence of the current time so that the encoding process can be carried out without the necessity to give an advance notice to the reception apparatus.

Now, in order to evaluate the performance of such a data transmission and reception system, a characteristic used generally for showing the code performance is found for a Rayleigh channel and an AWGN channel by simulation. The characteristic is represented by a relation between a bit error rate BER and a signal-to-noise power ratio $E_b/N_o$ per bit.

In this simulation, turbo code represented by a generated polynomial equation G in Eq. (66) shown below is used as raw code, an interleaver is used for carrying out random interleaving processes among the converters, a transmission rate C is set at ½, a puncture pattern represented by Eq. (67) given below is used and a channel interleaver is used for carrying out random interleaving processes among the converters. In addition, in this simulation, the number of information bits (N) supplied to each of the converters is set at 20,000. That is to say, the number of constituents (M) composing an encoded sequence generated by each converter is set at 40,000 and the number of repetitions in a turbo decoding process carried out by each decoder is set at 20.

$$G(D) = \begin{pmatrix} 1 \\ \dfrac{1+D^4}{1+D+D^2+D^3+D^4} \end{pmatrix} \tag{66}$$

$$\begin{pmatrix} INFORMATION \\ PARITY0 \\ PARITY1 \end{pmatrix} = \begin{pmatrix} 1 & 1 \\ 1 & 0 \\ 0 & 1 \end{pmatrix} \tag{67}$$

When the characteristic for an AWGN channel is found under the conditions described above, results shown in FIG. 21 were obtained. In addition, characteristic curves shown in FIG. 22 were also obtained.

That is to say, when a bit error rate is found as an original AWGN characteristic of turbo code with the probability density function of a noise expressed by Eq. (68) given below, the leftmost characteristic curve shown in FIG. 22, that is, a characteristic shown by a solid line, was obtained. In this case, from this channel's characteristic shown in FIG. 21, the constant $a^{(0)}$ is 0.775 for $\xi^{(0)}$=0.8 dB where $\xi^{(0)}$ is a signal-to-noise power ratio $E_b/n_o$ required by the signal.

$$p(n) = \dfrac{1}{\sqrt{\pi n_0}} \exp\left[-\dfrac{1}{n_0}n^2\right] \tag{68}$$

Next, as a channel model, a communication line is expressed in terms of a probability density function as shown in Eq. (69) given below. Along the communication line, a sum of noises and a specific sequence is added. The specific sequence has the same statistical properties as the constant-times encoded sequence $a^{(0)}x^{(0)}$. In addition, the leftmost characteristic curve shown in FIG. 22, that is, a characteristic shown by a dashed line, was obtained. In this case, from this channel characteristic, the constant $a^{(1)}$ is 1.137 for $\xi^{(1)}$=0.7 dB where $\xi^{(1)}$ is a signal-to-noise power ratio $E_b/(n_0+2v^{(0)})$ required by the signal.

$$p(n) = \frac{1}{\sqrt{\pi n_0}} \exp\left[-\frac{1}{n_0} n^2\right] \otimes \frac{1}{2}(\delta(n + a^{(0)}) + \delta(n - a^{(0)}))$$
$$= \frac{1}{2\sqrt{\pi n_0}} \exp\left[-\frac{1}{n_0}(n + a^{(0)})^2\right] + \frac{1}{2\sqrt{\pi n_0}} \exp\left[-\frac{1}{n_0}(n + a^{(0)})^2\right]$$

(69)

Further, as a channel model, another communication line is assumed. Along the assumed communication line, a sum of noises and a specific sequence is added. The specific sequence has the same statistical properties as the constant-times encoded sequences $a^{(0)} x^{(0)}$ and $a^{(1)} x^{(1)}$. In addition, the leftmost characteristic curve shown in FIG. 22, that is, a characteristic shown by a dotted line, was obtained. In this case, from this channel characteristic shown in FIG. 21, the constant $a^{(2)}$ is 1.658 for $\xi^{(2)}$=0.6 dB where $\xi^{(2)}$ is a signal-to-noise power ratio $E_b/(n_o+2v^{(1)})$ required by the signal.

By the same token, as a channel model, a further communication line is assumed. Along the assumed communication line, a sum of noises and a specific sequence is added. The specific sequence has the same statistical properties as the constant-times encoded sequences $a^{(0)} x^{(0)}$, $a^{(1)} x^{(1)}$ and $a^{(2)} x^{(2)}$. In addition, the leftmost characteristic curve shown in FIG. 22, that is, a characteristic shown by a double-dotted line, was obtained. In this case, from this channel characteristic shown in FIG. 21, the constant $a^{(3)}$ is 2.430 for $\xi^{(3)}$=0.6 dB where $\xi^{(3)}$ is a signal-to-noise power ratio $E_b/(n_o+2v^{(2)})$ required by the signal.

By using these constants $a^{(1)}$, as the code, it is possible construct an additive encoded sequence with a transmission rate C of 2/2 by summing up 2 sequences, namely, the constant-times encoded sequences $a^{(0)} x^{(0)}$ and $a^{(1)} x^{(1)}$, an additive encoded sequence with a transmission rate C of 3/2 by summing up 3 sequences, namely, the constant-times encoded sequences $a^{(0)} x^{(0)} a^{(1)} x^{(1)}$ and $a^{(2)} x^{(2)}$ and an additive encoded sequence with a transmission rate C of 4/2 by summing up 4 sequences, namely, the constant-times encoded sequences $a^{(0)} x^{(0)}$, $a^{(1)} x^{(1)}$, $a^{(2)} x^{(2)}$ and $a^{(3)} x^{(3)}$. These are summarized in FIG. 21. It is to be noted that the constant-times encoded sequences $a^{(0)} x^{(0)}$, $a^{(1)} x^{(1)}$, $a^{(2)} x^{(2)}$ and $a^{(3)} x^{(3)}$ are referred to as stage 0, stage 1, stage 2 and stage 3 respectively. It is also worth noting that, in the same figure, average signal-to-noise power ratios $E_b/n_0 = \xi_{ave}$, expected and required in transmissions of additive encoded sequences are also shown.

Figures 21, 22:
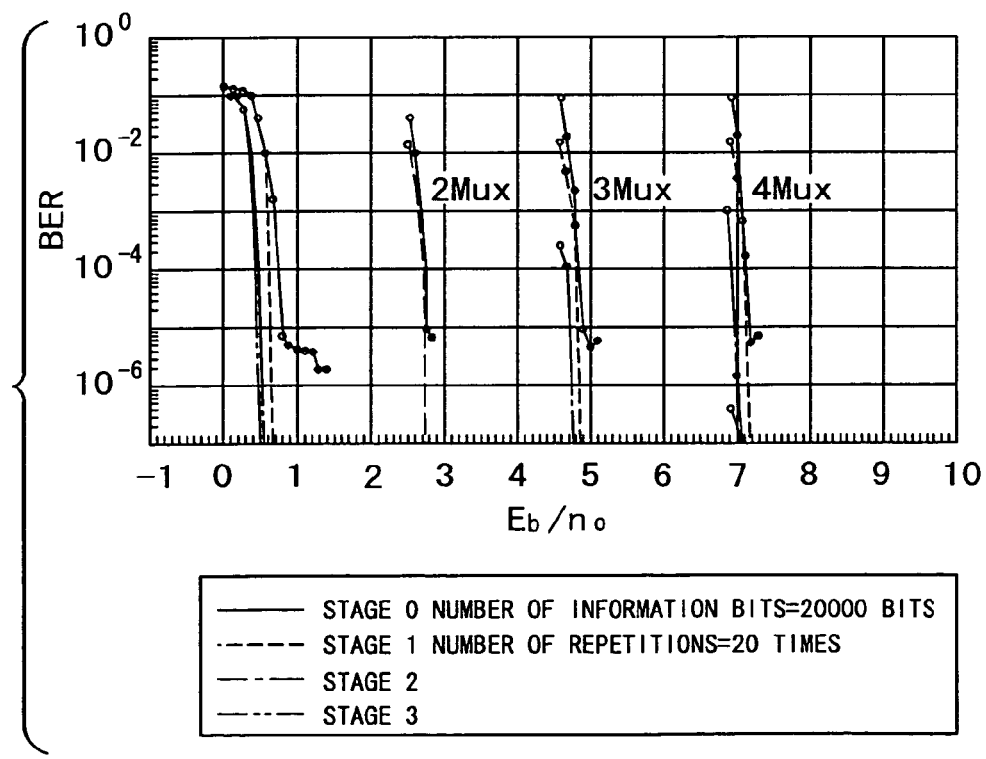
FIG. 21 is an explanatory diagram showing the configuration of code used in a simulation for finding a characteristic in an AWGN channel.
FIG. 22 is an explanatory diagram showing curves representing characteristics in an AWGN channel, which are found by the same simulation.

Characteristic curves shown in FIG. 22 were obtained as a result of processing to find characteristics of sequences in an AWGN channel by changing the noise power density $n_o$ through the use of code designed as described above.

Figures 23, 24:
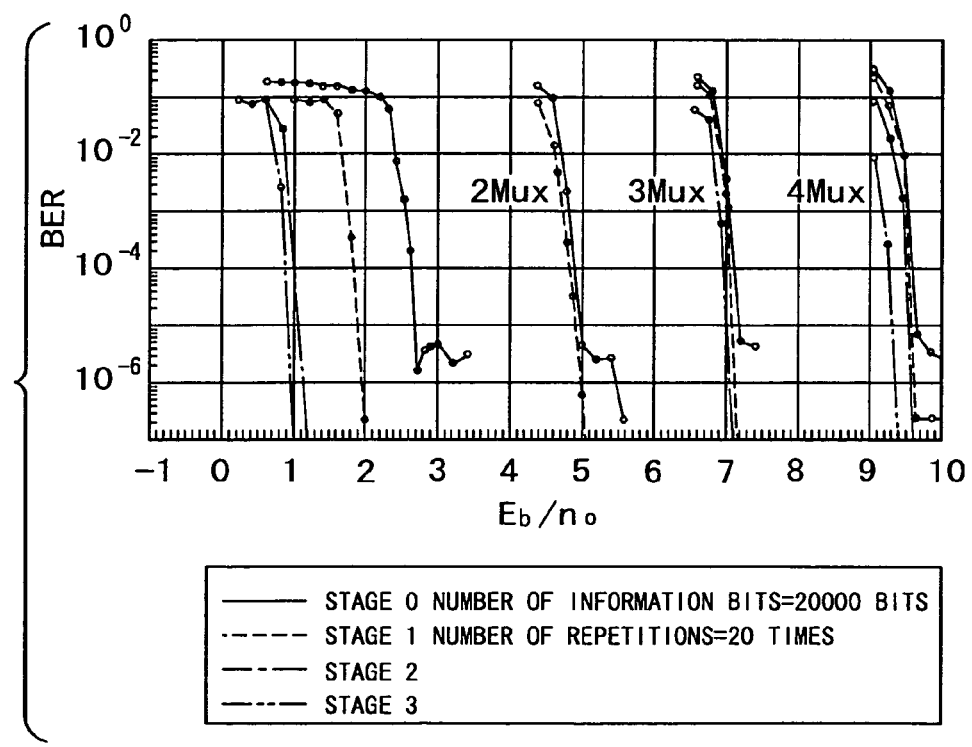
FIG. 23 is an explanatory diagram showing the configuration of code used in a simulation for finding a characteristic in a free interleaved Rayleigh channel.
FIG. 24 is an explanatory diagram showing curves representing characteristics in a free interleaved Rayleigh channel, which are found by the same simulation.

In addition, under the same conditions, by assuming that the estimation of a communication line is perfect, characteristics in a fully-interleaved Rayleigh channel were also found. As shown in FIG. 23, the constant $a^{(0)}$ is 0.965 for $\xi^{(0)}$=2.7 dB where $\xi^{(0)}$ is a signal-to-noise power ratio $E_b/n_o$ required by the signal, the constant $a^{(1)}$ is 1.489 for $\xi^{(1)}$=1.9 dB where $\xi^{(1)}$ is a signal-to-noise power ratio $E_b/(n_o+2v^{(0)})$ required by the signal, the constant $a^{(2)}$ is 2.167 for $\xi^{(2)}$=1.1 dB where $\xi^{(2)}$ is a signal-to-noise power ratio $E_b/(n_o+2v^{(1)})$ required by the signal and the constant $a^{(3)}$ is 3.242 for $\xi^{(3)}$=1.0 dB where $\xi^{(3)}$ is a signal-to-noise power ratio $E_b/(n_o+2v^{(2)})$ required by the signal.

Characteristic curves shown in FIG. 24 were obtained as a result of processing to find characteristics of sequences in a Rayleigh channel by changing the noise power density $n_o$ through the use of code designed as described above.

As is obvious from the characteristics shown in FIGS. 22 and 24, the value of the required signal-to-noise power ratio $E_b/(n_o+2v)$ is known to decrease in proportion to the number of constant-times encoded sequences to be summed up, that is, the larger the number of stages, the smaller the value of the required signal-to-noise power ratio $E_b/(n_o+2v)$. This is because, as the number of constant-times encoded sequences to be summed up increases, the state of the communication line is not the state of a Gaussian distribution any more. In addition, the value of the required signal-to-noise power ratio $E_b/(n_o+2v)$ decreases in proportion to the number of constant-times encoded sequences to be summed up in the case of a Rayleigh channel at a decreasing rate greater than the decreasing rate at which the value of the required signal-to-noise power ratio $E_b/(n_o+2v)$ decreases in proportion to the number of constant-times encoded sequences to be summed up in the case of an AWGN channel. This is because, in addition to the fact that, as the number of constant-times encoded sequences to be summed up increases, the state of the communication line is not the state of a Gaussian distribution any more, the deviation of variations of the code decreases as described above. It is to be noted that, from results of the simulation, the ambiguity of a decoding result of high-order code is known to have an effect on a decoding process of low-order code. For this reason, as a constant $a^{(1)}$ for high-order code, a big margin is considered to be effective.

As described above, in the data transmission and reception system, it is obvious that code with a large transmission rate can be constructed with ease by using code having a small transmission rate and, thus, a decoding process can be carried out with high performance.

It is to be noted that, in the simulation, the encoding parameters such as the constant $a^{(1)}$ have been optimized in dependence on whether the communication line is a static or Rayleigh channel. If a characteristic of a static channel is predicted by using an encoding parameter for a Rayleigh channel, results shown in FIG. 25 will be obtained. That is to say, in this case, for code of 1 or more stages, the value of the required signal-to-noise power ratio $E_b/(n_o+2v)$ of a Raleigh channel is greater than the value of the required signal-to-noise power ratio $E_b/(n_o+2v)$ of a static channel. In addition, the value of the signal-to-noise power ratio $E_b/n_o$ required of the code at stage 0 is 2.7 dB, which is greater than the value of 0.8 dB shown in FIG. 21 by 1.9 dB. Thus, the characteristic in the static channel is predicted to become equal to the value of the required signal-to-noise power ratio $E_b/(n_o+2v)$, which is smaller than the characteristic in the Rayleigh channel by at least 1.9 dB.

As described above, in the data transmission and reception system, a plurality of information-bit sequences $\{b^{(0)}, b^{(1)}, \ldots, b^{(L-1)}\}$ is subjected to a conversion process including a predetermined encoding process and/or a predetermined modulation process to produce encoded sequences $\{x^{(0)}, x^{(1)}, \ldots, x^{(L-1)}\}$, which are then multiplied by constants $\{a^{(0)}, a^{(1)}, \ldots, a^{(L-1)}\}$ respectively to generate constant-times encoded sequences $\{a^{(0)} x^{(0)}, a^{(1)} x^{(1)}, \ldots, a^{(L-1)} x^{(L-1)}\}$ respectively. The constant-times encoded sequences $\{a^{(0)} x^{(0)}, a^{(1)} x^{(1)}, \ldots, a^{(L-1)} x^{(L-1)}\}$ are then summed up to produce an additive encoded sequence g, which is finally transmitted. Thus, there are only few limitations on the original code, which serves as the basic, making it possible to easily implement a high-performance encoding process allowing the freedom of the code design to be enhanced considerably. As a result, the information-bit sequences $\{b^{(0)}, b^{(1)}, \ldots, b^{(L-1)}\}$ can be encoded in such an optimum manner that the value of the signal-to-noise power ratio $E_b/n_o$ required for sufficiently reducing the bit error rate can be reduced.

In addition, in the data transmission and reception system, the reception apparatus carries out decoding processes sequentially, starting with the highest-order information-bit sequence $b^{(L-1)}$. Thus, a decoding process to generate at least one information-bit sequence $b^{(1)}$ can be carried out with a high degree of precision and with ease. In particular, in the data transmission and reception system, the reception apparatus carries out a MAP decoding process or a decoding process conforming to the MAP decoding process so that a decoding process of actual code can be performed. In addition, in the data transmission and reception system, in a process carried out by the reception apparatus to decode any encoded sequence, information on any other encoded sequences is used to reduce the value of the signal-to-noise power ratio $E_b/n_o$ required for sufficiently reducing the bit error rate.

Thus, if it is necessary to transmit data by using a limited number of real numbers caused by typically the fact that the band is limited in the data transmission and reception system, it is possible to sufficiently meet a demand for an encoding process at a high transmission rate. It is thus possible to provide much convenience to the user.

In the embodiment described above, the amplitude of the original signal basically exhibits a Gaussian distribution. It is to be noted, however, that the amplitude of ordinary code does not exhibit a Gaussian distribution. In the case of code with a low transmission rate in particular, the BPSK modulation technique is adopted. In such a case, in the encoding process, it is undesirable to find energy of the code on the basis of energy of code subjected to an addition process previously.

In this case, the binary distribution entropy of signal points according to the BPSK modulation technique is 1, which lower than a Gaussian distribution entropy of ($\frac{1}{2}$) $\log_2(\pi e)=1.65$. Thus, even if the amplitude of an encoded sequence for each information-bit sequence does not exhibit a Gaussian distribution, the amplitude can be made appear to exhibit a Gaussian distribution by carrying out a random normalized conversion process on it except a fading channel. Accordingly, it is obvious that a result, which is worse than a result obtained by assuming that each code exhibits a Gaussian distribution, is never obtained.

Therefore, it is possible to measure a value of the signal-to-noise power ratio $E_b/(n_o+2v)$ required for a case, in which the amplitude of the original signal exhibits a non-Gaussian distribution, by carrying out a measurement for a Gaussian channel reflecting a model of an encoder. In addition, in a decoding process, an operation to compute a likelihood value with a high degree of accuracy in conformity with the model of the encoder is optimum.

It is to be noted that the scope of the present invention is not limited to the embodiment described above. For example, in the embodiment described above, the turbo encoding process is adopted as the encoding process to be carried out by the converter employed in the transmission apparatus. However, the present invention can also be applied to any code including the Reed-Solomon code and the BCH (Bose-Chaudhuri-Hocquenghem) code.

In addition, in the embodiment described above, the BPSK modulation technique is adopted in the encoding process to be carried out by the converter employed in the transmission apparatus. However, the present invention can also be applied to a case in which another modulation technique is adopted. An example of the other modulation technique is the QPSK (Quadrature Phase Shift Keying) modulation technique. It is to be noted that, even if the QPSK modulation technique is adopted, signal points in the additive encoded sequence g are placed dependently on the signal-to-noise ratio S/N as described above. For example, the signal points are located at unequal intervals as shown in FIG. 26.

Furthermore, in the embodiment described above, only a single information-bit sequence $b^{(1)}$ is supplied to a converter employed in the transmission apparatus. In place of a single information-bit sequence $b^{(1)}$ consisting of say 2,000 information bits, however, 2 sequences each composed of 1,000 bits can be supplied to the converter. That is to say, in accordance with the present invention, an information-bit sequence $b^{(1)}$ with any structure can be supplied to any converter as long as the encoded sequence $x^{(1)}$ output by the converter comprises M numbers.

Moreover, in the embodiment described above, a MAP decoding process is adopted as a typical decoding process to be carried out by a decoder employed in the reception apparatus. However, the present invention can also be applied for example to a case in which the Viterbi decoding process is adopted. It is to be noted that, if the Viterbi decoding process is adopted, the decoder inputs a likelihood value, but never outputs posteriori probability information as a result of the decoding process. For that reason, in this case, the decoder carries out a decoding process with a correct decoding result at a probability of 1.

As described above, it is needless to say that a variety of changes can be made appropriately within a range not departing from essentials of the present invention.

As described above in detail, the information transmission apparatus provided by the present invention is an information transmission apparatus for converting the format of input information into a predetermined format prior to transmission of the information. The information transmission apparatus includes: a first conversion means for converting a first information-bit sequence comprising a predetermined number of bits into a first encoded sequence comprising M numbers; a first multiplication means for multiplying the first encoded sequence produced by the first conversion means as a result of a conversion process by a first constant; at least a second conversion means for converting a second information-bit sequence comprising a predetermined number of bits into a second encoded sequence comprising M numbers; at least a second multiplication means for multiplying the second encoded sequence produced by the second conversion means as a result of a conversion process by a second constant; an addition means for adding the constituent of a first constant-times encoded sequence produced by the first multiplication means as a result of a multiplication process to the constituent of a second constant-times encoded sequence produced by the second multiplication means as a result of a multiplication process to produce an additive encoded sequence;

and a transmission means for transmitting the additive encoded sequence as a transmitted signal.

As described above, in the information transmission apparatus provided by the present invention, the addition means adds a first constant-times encoded sequence produced by the first multiplication means as a product of a first encoded sequence and a first constant to a second constant-times encoded sequence produced by the second multiplication means as a product of a second encoded sequence and a second constant to produce an additive encoded sequence, and the transmission means transmits the additive encoded sequence. As a result, it is possible to easily carry out a high-performance encoding process that allows the degree of freedom of the code design to be increased substantially.

In addition, the information transmission method provided by the present invention is an information transmission method for converting the format of input information into a predetermined format prior to transmission of the information. The information transmission method includes: a first conversion process of converting a first information-bit sequence comprising a predetermined number of bits into a first encoded sequence comprising M numbers; a first multiplication process of multiplying the first encoded sequence produced by the first conversion process as a result of conversion by a first constant; at least a second conversion process of converting a second information-bit sequence comprising a predetermined number of bits into a second encoded sequence comprising M numbers; at least a second multiplication process of multiplying the second encoded sequence produced by the second conversion process as a result of conversion by a second constant; an addition process of adding the constituent of a first constant-times encoded sequence produced by the first multiplication process as a result of multiplication to the constituent of a second constant-times encoded sequence produced by the second multiplication process as a result of multiplication to produce an additive encoded sequence; and a transmission process of transmitting the additive encoded sequence as a transmitted signal.

As described above, in the information transmission method provided by the present invention, a first constant-times encoded sequence produced by the first multiplication process as a product of a first encoded sequence and a first constant is added to a second constant-times encoded sequence produced by the second multiplication process as a product of a second encoded sequence and a second constant to produce an additive encoded sequence, and in the transmission process of the information transmission method, the additive encoded sequence is transmitted. As a result, it is possible to easily carry out a high-performance encoding process that allows the degree of freedom of the code design to be increased substantially.

In addition, the information reception apparatus provided by the present invention is an information reception apparatus for receiving a reception signal comprising an additive encoded sequence transmitted by an information transmission apparatus and a predetermined noise added to the additive encoded sequence includes: a first conversion means for converting a first information-bit sequence comprising a predetermined number of bits into a first encoded sequence comprising M numbers; a first multiplication means for multiplying the first encoded sequence produced by the first conversion means as a result of a conversion process by a first constant; at least a second conversion means for converting a second information-bit sequence comprising a predetermined number of bits into a second encoded sequence comprising M numbers; at least a second multiplication means for multiplying the second encoded sequence produced by the second conversion means as a result of a conversion process by a second constant; an addition means for adding the constituent of a first constant-times encoded sequence produced by the first multiplication means as a result of a multiplication process to the constituent of a second constant-times encoded sequence produced by the second multiplication means as a result of a multiplication process to produce the additive encoded sequence; and a transmission means for transmitting the additive encoded sequence as the transmitted signal.

The information reception apparatus includes: a reception means for receiving the reception signal; and a decoding means for carrying out a decoding process to produce at least one of the first information-bit sequence and the second information-bit sequence on the basis of a received value received from the reception means.

As described above, the decoding means employed in the information reception apparatus provided by the present invention carries out a decoding process to produce at least one of the first information-bit sequence and the second information-bit sequence on the basis of a received value comprising an additive encoded sequence and a predetermined noise added to the additive encoded sequence produced in the information transmission apparatus by the addition means, which adds a first constant-times encoded sequence produced by the first multiplication means as a result of a multiplication process to a second constant-times encoded sequence produced by the second multiplication means as a result of a multiplication process.

In addition, the information reception method provided by the present invention is an information reception method for receiving a reception signal comprising an additive encoded sequence and a predetermined noise added to the additive encoded sequence transmitted in accordance with an information transmission method including: a first conversion process of converting a first information-bit sequence comprising a predetermined number of bits into a first encoded sequence comprising M numbers; a first multiplication process of multiplying the first encoded sequence produced by the first conversion process as a result of conversion by a first constant; at least a second conversion process of converting a second information-bit sequence comprising a predetermined number of bits into a second encoded sequence comprising M numbers; at least a second multiplication process of multiplying the second encoded sequence produced by the second conversion process as a result of conversion by a second constant; an addition process of adding the constituent of a first constant-times encoded sequence produced by the first multiplication process as a result of multiplication to the constituent of a second constant-times encoded sequence produced by the second multiplication process as a result of multiplication to produce an additive encoded sequence; and a transmission process of transmitting the additive encoded sequence as the transmitted signal, wherein the information reception method includes: a reception process of receiving the reception signal; and a decoding process of carrying out a decoding process to produce at least one of the first information-bit sequence and the second information-bit sequence on the basis of a received value received from the reception process.

As described above, the information reception method provided by the present invention includes the decoding process carried out to produce at least one of the first information-bit sequence and the second information-bit sequence on the basis of a received value comprising an additive encoded sequence and a predetermined noise added to the additive encoded sequence, which is produced in accordance with the information transmission method in the addition process carried out to add a first constant-times encoded sequence produced in the first multiplication process to a second constant-times encoded sequence produced in the second multiplication process. Accordingly, it becomes possible to carry out the decoding process to produce at least one of the information-bit sequence easily with a high degree of precision.

The invention claimed is:

1. An information transmission apparatus for converting a format of input information into a predetermined format prior to transmission of said input information, said information transmission apparatus, comprising:

first conversion means for converting a first information-bit sequence having a predetermined number of bits into a first encoded sequence having M numbers;

first multiplication means for multiplying said first encoded sequence produced by said first conversion means by a first constant;

second conversion means for converting a second information-bit sequence having a predetermined number of bits into a second encoded sequence having M numbers;

second multiplication means for multiplying said second encoded sequence produced by said second conversion means by a second constant; wherein the first and second constants are based on a transmission energy for achieving a desired bit error rate;

addition means for adding a constituent of a first constant-times encoded sequence produced by said first multiplication means to a constituent of a second constant-times encoded sequence produced by said second multiplication means to produce an additive encoded sequence; and transmission means for transmitting said additive encoded sequence as a transmitted signal.

2. The information transmission apparatus according to claim 1, wherein:

when said first encoded sequence is regarded as a sequence to be transmitted through a communication line along which noise is added, said first multiplication means multiplies said first encoded sequence by said first constant so as to reduce a bit error rate for said first information-bit sequence; and when said second encoded sequence is regarded as a sequence to be transmitted through a communication line along which a sum of said noise and a sequence having a same statistical characteristic as said first constant-times encoded sequence is added, said second multiplication means multiplies said second encoded sequence by said second constant so as to reduce a bit error rate for said second information-bit sequence.

3. The information transmission apparatus according to claim 1, wherein:

when said first encoded sequence is regarded as a sequence to be transmitted through a communication line along which noise is added, said first multiplication means multiplies said first encoded sequence by said first constant so as to reduce a bit error rate for said first information-bit sequence; and when said second encoded sequence is regarded as a sequence to be transmitted through a communication line along which a sum of a noise greater than said noise by a predetermined amount and a sequence having the a statistical characteristic as said first constant-times encoded sequence is added, said second multiplication means multiplies said second encoded sequence by said second constant so as to reduce a bit error rate for said second information-bit sequence.

4. The information transmission apparatus according to claim 1, wherein:

said first conversion means comprises:

first encoding means for carrying out an encoding operation on said first information-bit sequence; and first modulation means for carrying out a mapping operation of signal points by adoption of a predetermined modulation technique on a sequence generated by said first encoding means to produce said first encoded sequence comprising N numbers, wherein said second conversion means comprises:

second encoding means for carrying out an encoding operation on said second information-bit sequence; and second modulation means for carrying out a mapping operation of signal points by adoption of a predetermined modulation technique on a sequence generated by said second encoding means to produce said second encoded sequence comprising M numbers.

5. The information transmission apparatus according to claim 4, wherein one of said first encoding means and said second encoding means carry out a parallel concatenated convolutional coding operation.

6. The information transmission apparatus according to claim 4, wherein:

one of said first encoding means and said second encoding means has channel interleave means for rearranging an order of pieces of data of the input information based on predetermined information on permutation locations; and one of said first modulation means and said second modulation means carries out a mapping operation of signal points by adoption of a predetermined modulation technique on interleaved data generated by said channel interleave means.

7. The information transmission apparatus according to claim 4, wherein one of said first modulation means and said second modulation means carries out a mapping operation of signal points by adoption of a 2-phase modulation technique.

8. The information transmission apparatus according to claim 1, wherein:

said first multiplication means multiplies said first encoded sequence by said first constant;

said second multiplication means multiplies said second encoded sequence by said second constant;

said first constant and said second constant are determined based on a state of a communication line; and said state of a communication line is discriminated by an information reception apparatus receiving said additive encoded sequence.

9. The information transmission apparatus according to claim 1, further comprising discrimination means for discriminating a state of a communication line being used for reception, wherein said first multiplication means multiplies said first encoded sequence by said first constant;

said second multiplication means multiplies said second encoded sequence by said second constant;

said first constant and said second constant are determined based on the state of said communication line being used for reception; and said state of the communication line is discriminated by said discrimination means.

10. The information transmission apparatus according to claim 9, further comprising multiplexing means for multiplexing said determined first constant and said determined second constant in a highest-order second information-bit sequence subjected to an addition operation last in said addition means, wherein said second conversion means converts data produced by said multiplexing means as a result of multiplexing into said second encoded sequence comprising M numbers.

11. The information transmission apparatus according to claim 1, wherein said first information-bit sequence and said second information-bit sequence are one of pieces of information, which are independent of each other, and results of an operation to split an information-bit sequence.

12. The information transmission apparatus according to claim 1, wherein said first information-bit sequence has a bit count equal to a bit count of said second information-bit sequence.

13. An information transmission method for converting a format of input information into a predetermined format prior to transmission of said input information, comprising:

a first conversion process of converting a first information-bit sequence having a predetermined number of bits into a first encoded sequence comprising M numbers;

a first multiplication process of multiplying said first encoded sequence produced by said first information-bit sequence by a first constant;

a second conversion process of converting a second information-bit sequence having a predetermined number of bits into a second encoded sequence having M numbers;

a second multiplication process of multiplying said second encoded sequence produced by said second information-bit sequence by a second constant; wherein the first and second constants are based on a transmission energy for achieving a desired bit error rate;

an addition process of adding a constituent of a first constant-times encoded sequence produced by said first multiplication process to a constituent of a second constant-times encoded sequence produced by said second multiplication process to produce an additive encoded sequence; and a transmission process of transmitting said additive encoded sequence as a transmitted signal.

14. The information transmission method according to claim 13, wherein:

when said first encoded sequence is regarded as a sequence to be transmitted through a communication line along which noise is added, in said first multiplication process of multiplying said first encoded sequence by said first constant, said first encoded sequence is multiplied by said first constant so as to reduce a bit error rate for said first information-bit sequence; and when said second encoded sequence is regarded as a sequence to be transmitted through a communication line along which a sum of said noise and a sequence having a same statistical characteristic as said first constant-times encoded sequence is added, in said second multiplication process of multiplying said second encoded sequence by said second constant, said second encoded sequence is multiplied by said second constant so as to reduce a bit error rate for said second information-bit sequence.

15. The information transmission method according to claim 13, wherein:

when said first encoded sequence is regarded as a sequence to be transmitted through a communication line along which noise is added, in said first multiplication process of multiplying said first encoded sequence by said first constant, said first encoded sequence is multiplied by said first constant so as to reduce a bit error rate for said first information-bit sequence; and when said second encoded sequence is regarded as a sequence to be transmitted through a communication line along which a sum of a noise greater in magnitude than said noise by a predetermined amount and a sequence having a same statistical characteristic as said first constant-times encoded sequence is added in said second multiplication process of multiplying said second encoded sequence by said second constant, said second encoded sequence is multiplied by said second constant so as to reduce a bit error rate for said second information-bit sequence.

16. The information transmission method according to claim 13, wherein:

said first conversion process of converting said first information-bit sequence comprises:

a first encoding process of carrying out a predetermined encoding operation on said first information-bit sequence; and a first mapping process of carrying out a mapping operation of signal points by adoption of a predetermined modulation technique on a sequence generated by said first encoding process to produce said first encoded sequence comprising M numbers, wherein said second conversion process of converting said second information-bit sequence comprises:

a second encoding process of carrying out a predetermined encoding operation on said second information-bit sequence; and a second mapping process of carrying out a mapping operation of signal points by adoption of a predetermined modulation technique on a sequence generated by said second encoding process to produce said second encoded sequence comprising M numbers.

17. The information transmission method according to claim 16, wherein one of said first encoding process of carrying out a predetermined encoding operation on said first information-bit sequence and said second encoding process of carrying out a predetermined encoding operation on said second information-bit sequence includes performing a parallel concatenated convolutional coding process.

18. The information transmission method according to claim 16, wherein:

one of said first encoding process of carrying out a predetermined encoding operation on said first information-bit sequence and said second encoding process of carrying out a predetermined encoding operation on said second information-bit sequence includes a channel interleave process of rearranging an order of pieces of input data on the basis of predetermined information on permutation locations to produce interleaved data; and one of said first mapping process of carrying out a mapping operation of signal points by adoption of a predetermined modulation technique on a sequence generated by said first encoding process of carrying out a predetermined encoding operation on said first information-bit sequence and said second mapping process of carrying out a mapping operation of signal points by adoption of a predetermined modulation technique on a sequence generated by said second encoding process of carrying out a predetermined encoding operation on said second information-bit sequence includes a mapping process of signal points, which is performed on said interleaved data generated by said channel interleave process on the basis of a predetermined modulation technique.

19. The information transmission method according to claim 16, wherein one of said first mapping process of carrying out a mapping operation of signal points by adoption of a predetermined modulation technique on a sequence generated by said first encoding process of carrying out a predetermined encoding operation on said first information-bit sequence and said second mapping process of carrying out a mapping operation of signal points by adoption of a predetermined modulation technique on a sequence generated by said second encoding process of carrying out a predetermined encoding operation on said second information-bit sequence includes a mapping process of signal points based on a 2-phase modulation technique.

20. The information transmission method according to claim 13, wherein:
in said first multiplication process of multiplying said first encoded sequence by said first constant, said first encoded sequence is multiplied by said first constant;
in said second multiplication process of multiplying said second encoded sequence by said second constant, said second encoded sequence is multiplied by said second constant;
said first constant and said second constant are determined based on a state of a communication line; and
said state of a communication line is discriminated by an information reception apparatus receiving said additive encoded sequence.

21. The information transmission method according to claim 13, further comprising a discrimination process of discriminating a state of a communication line being used for reception, wherein
in said first multiplication process of multiplying said first encoded sequence by said first constant, said first encoded sequence is multiplied by said first constant;
in said second multiplication process of multiplying said second encoded sequence by said second constant, said second encoded sequence is multiplied by said second constant;
said first constant and said second constant are determined based on a state of said communication line being used for reception; and
said state of said communication line being used for reception is discriminated in said discrimination process.

22. The information transmission method according to claim 21, further comprising a multiplexing process of multiplexing said first constant and said second constant in a highest-order second information-bit sequence subjected to an addition operation last in said addition process; and
in said second conversion process of converting said second information-bit sequence, data produced as a result of multiplexing in said multiplexing process of multiplexing data into said highest degree second information-bit sequence is converted into said second encoded sequence comprising M numbers.

23. The information transmission method according to claim 13, wherein said first information-bit sequence and said second information-bit sequence are one of pieces of information, which are independent of each other and results of an operation to split an information-bit sequence.

24. The information transmission method according to claim 13, wherein said first information-bit sequence has a bit count equal to a bit count of said second information-bit sequence.

25. The information reception apparatus for receiving a reception signal comprising an additive encoded sequence and a predetermined noise added to said additive encoded sequence transmitted by an information transmission apparatus, comprising:
first conversion means for converting a first information-bit sequence having a predetermined number of bits into a first encoded sequence comprising N numbers;
first multiplication means for multiplying said first encoded sequence produced by said first conversion means by a first constant;
second conversion means for converting a second information-bit sequence having a predetermined number of bits into a second encoded sequence comprising M numbers;
second multiplication means for multiplying said second encoded sequence produce by said second conversion means by a second constant; wherein the first and second constants are based on a transmission energy for achieving a desired bit error rate;
addition means for adding the constituent of a first constant-times encoded sequence produced by said first multiplication means as a result of multiplication to the constituent of a second constant-times encoded sequence produced by said second multiplication means to produce said additive encoded sequence; and
transmission means for transmitting said additive encoded sequence as said transmitted signal, said information reception apparatus including:
reception means for receiving said reception signal; and
decoding means for carrying out a decoding operation to produce at least one of said first information-bit sequence and said second information-bit sequence based on a received value received from said reception means.

26. The information reception apparatus according to claim 25, wherein, based on said received value supplied by said reception means, said decoding means carries out a decoding operation to produce a highest-order second information-bit sequence subjected to an addition operation last in said addition means.

27. The information reception apparatus according to claim 25, wherein said decoding means has a first decoding means for carrying out a decoding operation as a counterpart operation of said first conversion means and second decoding means for carrying out a decoding operation as a counterpart operation of said second conversion means.

28. The information reception apparatus according to claim 27, wherein:
said first decoding means carries out a decoding operation to produce said first information-bit sequence based on information on encoded sequences other than said first encoded sequence and based on said received value; and
said second decoding means carries out a decoding operation to produce said second information-bit sequence based on information on encoded sequences other than said second encoded sequence and on the basis of said received value.

29. The information reception apparatus according to claim 28, wherein:
said second decoding means carries out a decoding operation to produce said second information-bit sequence based on information on said first encoded sequence and based on said received value; and said first decoding means carries out a decoding operation to produce said first information-bit sequence based on information on said second encoded sequence obtained as a result of said decoding operation carried out by said second decoding means and based on said received value.

30. The information reception apparatus according to claim 27, wherein said first and second decoding means each have likelihood computation means for computing a likelihood regarding a reception symbol from said received value.

31. The information reception apparatus according to claim 30, wherein:

based on priori probability information for an encoded sequence other than said first encoded sequence and based on said received value, said first decoding means finds posteriori probability information for said first information-bit sequence and outputs said posteriori probability information for said first encoded sequence; and based on priori probability information for an encoded sequence other than said second encoded sequence and based on said received value, said second decoding means finds posteriori probability information for said second information-bit sequence and outputs said posteriori probability information for said second information-bit sequence as a result of said decoding operation and finds posteriori probability information for said second encoded sequence and outputs said posteriori probability information for said second encoded sequence.

32. The information reception apparatus according to claim 31, wherein:

based on priori probability information for said first encoded sequence and based on said received value, said second decoding means finds posteriori probability information for said second information-bit sequence ad outputs said posteriori probability information for said second information-bit sequence as a result of said decoding operation and finds posteriori probability information for said second encoded sequence and outputs said posteriori probability information for said second encoded sequence to said first decoding means as priori probability information for said second encoded sequence; and based on the priori probability information received from said second decoding means for said second encoded sequence and based on said received value, said first decoding means finds posteriori probability information for said first information-bit sequence and outputs said posteriori probability information for said first information-bit sequence as a result of said decoding operation and finds posteriori probability information for said first encoded sequence and outputs said posteriori probability information for said first encoded sequence to said second decoding means as priori probability information for said first encoded sequence.

33. The information reception apparatus according to claim 25, wherein said decoding means carries out of a MAP decoding operation and a decoding operation conforming to said MAP decoding operation.

34. The information reception apparatus according to claim 25, wherein said decoding means carries out decoding operations to generate information-bit sequences sequentially starting with a highest-order second information-bit sequence subjected to an addition operation last in said addition means.

35. The information reception apparatus according to claim 25, wherein said decoding means carries out one of a zigzag and repetitive decoding operation.

36. The information reception apparatus according to claim 25, wherein:

said decoding means has a likelihood computation means for computing a likelihood regarding a reception symbol from said received value; and when at least one of said first encoded sequence and said second encoded sequence has been encoded, said likelihood computation means selects a constituent that maximizes posteriori probability information for any constituent as a best candidate, and uses said best candidate as priori probability information for an encoded sequence to find a likelihood for another encoded sequence.

37. The information reception apparatus according to claim 25, wherein:

said decoding means has a likelihood computation means for computing a likelihood regarding a reception symbol from said received value; and when at least one of said first encoded sequence and said second encoded sequence has been encoded, said likelihood computation means finds an expected value for any arbitrary constituent already subjected to a soft decision as posteriori probability information and uses said posteriori probability information as priori probability information for an encoded sequence to find a likelihood for another encoded sequence.

38. The information reception apparatus according to claim 25, wherein:

said decoding means has a likelihood computation means for computing a likelihood regarding a reception symbol from said received value; and when an encoded sequence not decoded yet is found to exist in an attempt to decode on of said first encoded sequence and said second encoded sequence, said likelihood computation means finds a likelihood for an encoded sequence by regarding said encoded sequence not decoded yet as a Gaussian noise having an equal electric power.

39. The information reception apparatus according to claim 25, further comprising:

re-encoding means for re-encoding a highest-order second information-bit sequence by using posteriori probability information for said second information-bit sequence upon completion of a decoding operation carried out by said decoding means to produce said highest-order second information-bit sequence subjected last to an addition operation carried out by said addition means; correlation computation means for finding a correlation between a hard-decision value sequence is an estimated value of said second encoded sequence obtained as a result of a re-encoding operation carried out by said re-encoding means; and channel estimation means for estimating an amplitude of a communication line by using a correlation value found by said correlation computation means.

40. The information reception apparatus according to claim 25, further comprising:

re-encoding means for re-encoding a highest-order second information-bit sequence by using a posteriori probability information for said second encoded sequence upon completion of a decoding operation carried out by said decoding means to produce said highest-order second information-bit sequence subjected last to an addition operation carried out by said addition means;

correlation computation means for finding a correlation between a hard-decision value sequence and said received value where said a hard-decision value sequence is an estimated value of said second encoded sequence obtained as a result of a re-encoding operation carried out by said re-encoding means; and channel estimation means for estimating an amplitude of a communication line by using a correlation value found by said correlation computation means.

41. The information reception apparatus according to claim 25, further comprising discrimination means for discriminating a state of a communication line; and said first and second constants are determined based on the state of said communication line discriminated by said discrimination means.

42. The information reception apparatus according to claim 25, wherein said reception means receives said first and second constants determined based on a state of a communication line discriminated by said transmission apparatus.

43. The information transmission apparatus according to claim 42, wherein:

said first and second constants determined by said information transmission apparatus are multiplexed in a highest-order second information-bit sequence subjected last to an addition operation carried out by said addition means; and further comprising separation means for separating said first and second constants from said second information-bit sequence.

44. The information reception apparatus according to claim 25, wherein:

when said first encoded sequence is regarded as a sequence to be transmitted through a communication line along which noise is added, said first multiplication means multiplies said first encoded sequence by said first constant so as to reduce a bit error rate for said first information-bit sequence; and when said second encoded sequence is regarded as a sequence to be transmitted through a communication line along which a sum of said noise and a sequence having a same statistical characteristic as said first constant-times encoded sequence is added, said second multiplication means multiplies said second encoded sequence by said second constant so as to reduce a bit error rate for said second information-bit sequence.

45. The information reception apparatus according to claim 25, wherein:

when said first encoded sequence is regarded as a sequence to be transmitted through a communication line along which noise is added, said first multiplication means multiplies said first encoded sequence by said first constant so as to reduce a bit error rate for said first information-bit sequence; and when said second encoded sequence is regarded as a sequence to be transmitted through a communication line along which a sum of noise greater than said noise by a predetermined amount and a sequence having a same statistical characteristic as said first constant-times encoded sequence is added, said second multiplication means multiplies said second encoded sequence by said second constant so as to reduce a bit error rate for said second information-bit sequence.

46. An information reception method for receiving a reception signal having an additive encoded sequence and a predetermined noise added to said additive encoded sequence transmitted in accordance with a transmission method, comprising:

a first conversion process of converting a first information-bit sequence comprising a predetermined number of bits into a first encoded sequence having an M-dimensional real number vector;

a first multiplication process of multiplying said first encoded sequence produced by said first conversion process as a result of conversion by a first constant;

a second conversion process of converting a second information-bit sequence having a predetermined number of bits into a second encoded sequence having an M-dimensional real number vector;

a second multiplication process of multiplying said second encoded sequence produced by said second conversion process as a result of conversion by a second constant; wherein the first and second constants are based on a transmission energy for achieving a desired bit error rate;

an addition process of adding a constituent of a first constant-times encoded sequence produced by said first multiplication process as a result of multiplication to a constituent of a second constant-times encoded sequence produced by said second multiplication process as a result of multiplication to produce an additive encoded sequence; and a transmission process of transmitting said additive encoded sequence as said transmitted signal, said information reception method, comprising:

a reception process of receiving said reception signal; and a decoding process of carrying out a decoding operation to produce at least one of said first information-bit sequence and said second information-bit sequence based on the received value received from said reception process.

47. The information reception method according to claim 46, wherein, based on said received value supplied by said reception process, in said decoding process of carrying out a decoding operation to produce at least a information-bit sequence, a decoding operation is carried out to produce said highest-order second information-bit sequence subjected to an addition operation last in said addition process of producing said additive encoded sequence.

48. The information reception method according to claim 46, wherein said decoding process of carrying out a decoding operation to produce at least an information-bit sequence includes a first decoding process of carrying out a decoding operation as a counterpart operation of said first conversion process of converting said first information-bit sequence and a second decoding process of carrying out a decoding operation as a counterpart of said second conversion process of converting said second information-bit sequence.

49. The information reception method according to claim 48, wherein:

in said first decoding process of carrying out a decoding operation as a counterpart operation of said first conversion process of converting said first information-bit sequence, a decoding operation is performed to produce said first information-bit sequence based on encoded sequences other than said first encoded sequence and based on said received value; and in said second decoding process of carrying out a decoding operation as a counterpart operation of said second conversion process of converting said second information-bit sequence, a decoding operation is performed to produce said second information-bit sequence based on encoded sequences other than said second encoded sequence and based on said received value.

50. The information reception method according to claim 49, wherein:
   in said second decoding process of carrying out a decoding operation as a counterpart operation of said second conversion process of converting said second information-bit sequence, a decoding operation is performed to produce said second information-bit sequence based on information on said first encoded sequence and based on said received value; and
   in said first decoding process of carrying out a decoding operation as a counterpart operation of said first conversion process of converting said first information-bit sequence, a decoding operation is performed to produce said first information-bit sequence based on information on said second encoded sequence obtained as a result of said decoding operation carried out by said second decoding process and based on said received value.

51. The information reception method according to claim 48, wherein said first decoding process of carrying out a decoding operation as a counterpart operation of said first conversion process of converting said first information-bit sequence and said second decoding process of carrying out a decoding operation as a counterpart operation of said second conversion process of converting said second information-bit sequence each include a likelihood computation process of computing a likelihood regarding a reception symbol from said received value.

52. The information reception method according to claim 51, wherein:
   based on priori probability information for an encoded sequence other than said first encoded sequence and based on said received value, in said first decoding process of carrying out a decoding operation as a counterpart operation of said first conversion process of converting said first information-bit sequence, posteriori probability information for said first information-bit sequence is found and output as a result of said decoding operation, and posteriori probability information for said first encoded sequence is found and output; and
   based on priori probability information for an encoded sequence other than said second encoded sequence and based on said received value, in said second decoding process of carrying out a decoding operation as a counterpart operation of said second conversion process of converting said second information-bit sequence, posteriori probability information for said second information-bit sequence is found and output as a result of said decoding operation, and posteriori probability information for said second encoded sequence is found and output.

53. The information reception method according to claim 52, wherein:
   based on priori probability information for said first encoded sequence and based on said received value, in said second decoding process of carrying out a decoding operation as a counterpart operation of said second conversion process of converting said second information-bit sequence, posteriori probability information for said second information-bit sequence is found and output as a result of said decoding operation, and posteriori probability information for said second encoded sequence is found and output as prior probability information for said second encoded sequence to said first decoding process of carrying out a decoding operation as a counterpart operation of said first conversion process of converting said first information-bit sequence; and
   based on priori probability information for said second encoded sequence received from said second decoding process of carrying out a decoding operation as a counterpart operation of said second conversion process of converting said second information-bit sequence and based on said received value, in said first decoding process of carrying out a decoding operation as a counterpart operation of said first conversion process of converting said first information-bit sequence, posteriori probability information for said first information-bit sequence is found and output as a result of said decoding operation, and posteriori probability information for said first encoded sequence is found and output as priori probability information for said first encoded sequence to said second decoding process of carrying out a decoding operation as a counterpart operation of said second conversion process of converting said second information-bit sequence.

54. The information reception method according to claim 46, wherein, in said decoding process of carrying out a decoding operation to produce at least an information-bit sequence, one of a MAP decoding operation a decoding operation conforming to said MAP decoding operation is performed.

55. The information reception method according to claim 46, wherein, in said decoding process of carrying out a decoding operation to produce at least a information-bit sequence, decoding operations are preformed to generate information-bit sequences sequentially starting with a highest-order second information-bit sequence subjected to an addition operation last in said addition process of producing said additive encoded sequence.

56. The information reception method according to claim 46, wherein said decoding process of carrying out a decoding operation to produce at least a information-bit sequence, one of a zigzag and a repetitive decoding operation is performed.

57. The information reception method according to claim 46, wherein:
   said decoding process of carrying out a decoding operation to produce at least a information-bit sequence has a likelihood computation process of computing a likelihood regarding a reception symbol from said received value; and
   when at least one of said first encoded sequence and said second encoded sequence has been encoded, in said likelihood computation process, a constituent that maximizes posteriori probability information for any constituent is selected as a best candidate to be used as priori probability information for an encoded sequence in an operation to find a likelihood for another encoded sequence.

58. The information reception method according to claim 46, wherein:
   said decoding process of carrying out a decoding operation to produce at least an information-bit sequence has a likelihood computation process of computing a likelihood regarding a reception symbol from said received value; and
   when at least one of said first encoded sequence and said second encoded sequence has been encoded, in said likelihood computation process, an expected value for any arbitrary constituent already subjected to a soft decision is found as posteriori probability information to be used as priori probability information for an encoded sequence in an operation to find a likelihood for another encoded sequence.

59. The information reception method according to claim 46, wherein:
said decoding process of carrying out a decoding operation to produce at least an information-bit sequence has a likelihood computation process of computing a likelihood regarding a reception symbol from said received value; and
when at least one of said first encoded sequence and said second encoded sequence has been encoded, in said likelihood computation process, an expected value for any arbitrary constituent already subjected to a soft decision is found as posteriori probability information to be used as priori probability information for an encoded sequence in an operation to find a likelihood for another encoded sequence.

60. The information reception method according to claim 46, further comprising:
a re-encoding process carried out for re-encoding a highest-order second information-bit sequence by using posteriori probability information for said second information-bit sequence upon completion of a decoding operation performed in said decoding process of carrying out a decoding operation to produce at least an information-bit sequence, that is, upon completion of a decoding operation to generate said highest-order second information-bit sequence subjected last to an addition operation carried out in said addition process of producing said additive encoded sequence;
a correlation computation process of finding a correlation between a hard-decision value sequence and said received value where said hard-decision value sequence is an estimated value of said second encoded value obtained as a result of a re-encoding operation carried out in said re-encoding process of carrying out a re-encoding operation; and
a channel estimation process of estimating an amplitude of a communication line by using a correlation value found in said correlation computation process of finding a correlation between a hard-decision value sequence and said received value.

61. The information reception method according to claim 46, further comprising:
a re-encoding process carried out for re-encoding a highest-order second information-bit sequence by using posteriori probability information for said second encoded sequence upon completion of a decoding operation performed in said decoding process of carrying out a decoding operation to produce at least an information-bit sequence, that is, upon completion of a decoding operation to generate said highest-order second information-bit sequence subjected last to an addition operation carried out in said addition process of producing said additive encoded sequence;
a correlation computation process of finding a correlation between a hard-decision value sequence and said received value where said hard-decision value sequence is an estimated value of said second encoded value obtained as a result of a re-encoding operation carried out in said re-encoding process of carrying out a re-encoding operation; and
a channel estimation process of estimating an amplitude of a communication line by using a correlation value found in said correlation computation process of finding a correlation between a hard-decision value sequence and said received value.

62. The information reception method according to claim 46, further comprising a discrimination process of discriminating a state of a communication line, wherein
said first and second constants are determined based on the state of said communication line discriminated in said discrimination process.

63. The information reception method according to claim 46, wherein in said reception process of receiving said reception signal, said first and second constants determined in accordance with said information transmission method based on a state of a communication line discriminated in accordance with said information transmission method are received.

64. The information transmission method according to claim 63, wherein:
said determined first and second constants are multiplexed in a highest-order second information-bit sequence subjected last to an addition operation carried out in said addition process of producing said additive encoded sequence; and
there is further provided a separation process of separating said first and second constants from said second information-bit sequence.

65. The information reception method according to claim 46, wherein:
when said first encoded sequence is regarded as a sequence to be transmitted through a communication line along which noise is added, in said first multiplication process of multiplying said first encoded sequence by said first constant, said first encoded sequence is multiplied by said first constant so as to reduce a bit error rate for said first information-bit sequence; and
when said second encoded sequence is regarded as a sequence to be transmitted through a communication line along which a sum of said noise and a sequence having a same statistical characteristic as said first constant-times encoded sequence is added, in said second multiplication process of multiplying said second encoded sequence by said second constant, said second encoded sequence is multiplied by said second constant so as to reduce a bit error rate for said second information-bit sequence.

66. The information reception method according to claim 46, wherein:
when said first encoded sequence is regarded as a sequence to be transmitted through a communication line along which noise is added, in said first multiplication process of multiplying said first encoded sequence by said first constant, said first encoded sequence is multiplied by said first constant so as to reduce a bit error rate for said first information-bit sequence; and
when said second encoded sequence is regarded as a sequence to be transmitted through a communication line along which a sum of a noise greater in magnitude than said noise by a predetermined amount and a sequence having the same statistical characteristic as said first constant-times encoded sequence is added, in said second multiplication process of multiplying said second encoded sequence by said second constant, said second encoded sequence is multiplied by said second constant so as to reduce a bit error rate for said second information-bit sequence.

* * * * *

UNITED STATES PATENT AND TRADEMARK OFFICE
CERTIFICATE OF CORRECTION

| | | |
|---|---|---|
| PATENT NO. | : 7,227,908 B2 | Page 1 of 1 |
| APPLICATION NO. | : 10/399757 | |
| DATED | : June 5, 2007 | |
| INVENTOR(S) | : Mitsuhiro Suzuki and Mari Kobayashi | |

It is certified that error appears in the above-identified patent and that said Letters Patent is hereby corrected as shown below:

On Title Page item 57 in the Abstract, Line 5, insert --sequences-- after "encoded"

Item 57 in the Abstract, Line 15, insert --)-- (end parenthesis) after $x^{(2)}$ Column 50, Line 14, replace "N" with --M--

Column 54, Line 12, replace "N" with --M--

Column 54, Line 21, replace "produce" with --produced--

Column 55, Line 40, Claim 32, replace "ad" with --and--

Column 56, Line 39, Claim 38, replace "on" with --one--

Signed and Sealed this

Sixth Day of May, 2008

JON W. DUDAS
*Director of the United States Patent and Trademark Office*